US012795816B2

(12) United States Patent
Lienau et al.

(10) Patent No.: US 12,795,816 B2
(45) Date of Patent: Nov. 10, 2026

(54) INSERTABLE WIRELESS COMMUNICATION DEVICE FOR A POWER TOOL

(71) Applicant: MILWAUKEE ELECTRIC TOOL CORPORATION, Brookfield, WI (US)

(72) Inventors: John B. Lienau, Glendale, WI (US); Anthony M. Davis, Brookfield, WI (US); Ian A. Duncan, Colgate, WI (US); Benjamin Gordon, Brookfield, WI (US); Stephen Matson, Milwaukee, WI (US); Steven M. Smith, Greenfield, WI (US)

(73) Assignee: Milwaukee Electric Tool Corporation, Brookfield, WI (US)

(*) Notice: Subject to any disclaimer, the term of this patent is extended or adjusted under 35 U.S.C. 154(b) by 11 days.

(21) Appl. No.: 18/925,645

(22) Filed: Oct. 24, 2024

(65) Prior Publication Data

US 2025/0048538 A1 Feb. 6, 2025

Related U.S. Application Data

(63) Continuation of application No. 18/498,283, filed on Oct. 31, 2023, now Pat. No. 12,133,324, which is a
(Continued)

(51) Int. Cl.
*H05K 1/02* (2006.01)
*B25B 21/00* (2006.01)
(Continued)

(52) U.S. Cl.
CPC ............ *H05K 1/0243* (2013.01); *B25F 5/02* (2013.01); *H01Q 1/243* (2013.01); *H01Q 1/48* (2013.01);
(Continued)

(58) Field of Classification Search
CPC ........ H05K 1/0243; B25F 5/02; H01Q 1/243; H01Q 1/48; H01R 12/7058; H01R 12/727; B25B 21/00
See application file for complete search history.

(56) References Cited

U.S. PATENT DOCUMENTS

| | | | |
|---|---|---|---|
| 1,990,035 A | 2/1935 | Franz et al. | |
| 3,616,864 A | 11/1971 | Sorenson et al. | |

(Continued)

FOREIGN PATENT DOCUMENTS

| | | | |
|---|---|---|---|
| CN | 1324125 A | 11/2001 | |
| CN | 102666024 A * | 9/2012 | ........... B25B 23/147 |

(Continued)

OTHER PUBLICATIONS

Pixie 2.0 User Guide, 6 pages, accessed Jan. 31, 2019.
(Continued)

*Primary Examiner* — Lucas E. A. Palmer
(74) *Attorney, Agent, or Firm* — Michael Best & Friedrich LLP

(57) ABSTRACT

A power tool may include a compartment in its housing and a first printed circuit board (PCB) located in the housing and electrically coupled to a first connector. An insertable wireless communication device may include a second electronic processor and an antenna that are each mounted to a second PCB. The insertable wireless communication device may be configured to be received in the compartment and may include a second connector configured to electrically and physically couple to the first connector. The insertable wireless communication device may be configured to wirelessly communicate with an external device. When the insertable wireless communication device is inserted into the compartment, a first conductive layer of the first PCB may be configured to be electrically coupled to the antenna via the first connector and the second connector such that the
(Continued)

first conductive layer of the first PCB serves as a ground plane of the antenna.

20 Claims, 29 Drawing Sheets

Related U.S. Application Data continuation of application No. 18/161,520, filed on Jan. 30, 2023, now Pat. No. 11,871,509, which is a continuation of application No. 17/752,548, filed on May 24, 2022, now Pat. No. 11,570,888, which is a continuation of application No. 17/291,203, filed as application No. PCT/US2020/061544 on Nov. 20, 2020, now Pat. No. 11,375,610.

(60) Provisional application No. 63/047,447, filed on Jul. 2, 2020, provisional application No. 63/047,449, filed on Jul. 2, 2020, provisional application No. 62/938,516, filed on Nov. 21, 2019.

(51) Int. Cl.
*B25F 5/02* (2006.01)
*H01Q 1/24* (2006.01)
*H01Q 1/48* (2006.01)
*H01R 12/70* (2011.01)
*H01R 12/72* (2011.01)

(52) U.S. Cl.
CPC ....... *H01R 12/7058* (2013.01); *H01R 12/727* (2013.01); *B25B 21/00* (2013.01)

(56) References Cited

U.S. PATENT DOCUMENTS 5,809,432 A 9/1998 Yamashita
6,536,536 B1 3/2003 Gass et al.
6,607,041 B2 * 8/2003 Suzuki ................ B25B 23/1475 173/4
6,834,730 B2 12/2004 Gass et al.
6,872,121 B2 3/2005 Wiesner et al.
6,913,087 B1 7/2005 Brotto et al.
6,975,834 B1 * 12/2005 Forster ..................... H01Q 1/22 455/279.1
7,022,924 B2 4/2006 Patton
7,036,605 B2 5/2006 Suzuki et al.
7,093,668 B2 8/2006 Gass et al.
7,121,358 B2 10/2006 Gass et al.
7,146,667 B2 12/2006 Elsener
7,237,990 B2 7/2007 Deng
7,253,736 B2 8/2007 Tethrake et al.
7,256,699 B2 8/2007 Tethrake et al.
7,298,240 B2 11/2007 Lamar
7,311,025 B1 12/2007 Wilson, Jr.
7,328,752 B2 2/2008 Gass et al.
7,373,681 B2 5/2008 Elsener
7,513,179 B2 4/2009 Wilson, Jr.
7,540,334 B2 6/2009 Gass et al.
7,608,790 B2 10/2009 Patton
RE41,160 E 3/2010 Gilmore et al.
RE41,185 E 3/2010 Gilmore et al.
7,784,104 B2 8/2010 Innami et al.
7,827,718 B2 11/2010 Luebkert et al.
7,837,694 B2 11/2010 Tethrake et al.
7,850,071 B2 12/2010 Sakamoto et al.
7,887,559 B2 2/2011 Deng et al.
7,896,098 B2 3/2011 Suzuki et al.
7,942,084 B2 5/2011 Wilson, Jr. et al.
7,969,116 B2 6/2011 Aradachi et al.
8,035,487 B2 10/2011 Malackowski
8,062,060 B2 11/2011 Rejman
8,066,533 B2 * 11/2011 Tomita ...................... B25F 5/02 439/668
8,113,066 B2 2/2012 Eckstein et al.
8,115,621 B2 2/2012 Rajala et al.
8,157,826 B2 4/2012 Deng et al.
8,169,298 B2 5/2012 Wiesner et al.
8,189,043 B2 5/2012 Schneider et al.
8,200,354 B2 6/2012 Freeman et al.
8,210,275 B2 7/2012 Suzuki et al.
8,251,157 B2 8/2012 Gray et al.
8,253,559 B2 8/2012 Howard et al.
8,253,560 B2 8/2012 Howard et al.
8,254,878 B2 8/2012 Howard et al.
8,264,374 B2 9/2012 Obutake et al.
8,274,273 B2 9/2012 Nguyen et al.
8,285,248 B2 10/2012 Howard et al.
8,406,697 B2 3/2013 Arimura et al.
8,412,179 B2 4/2013 Gerold et al.
8,418,778 B2 4/2013 Eshleman et al.
8,454,613 B2 6/2013 Tethrake et al.
8,500,769 B2 8/2013 Deng
8,535,342 B2 9/2013 Malackowski et al.
8,555,755 B2 10/2013 Cattaneo
8,588,806 B2 11/2013 Howard et al.
8,624,721 B2 1/2014 Barker, Jr. et al.
8,630,729 B2 1/2014 Freeman et al.
8,659,652 B2 2/2014 Schneider et al.
8,666,936 B2 3/2014 Wallace
8,686,831 B2 4/2014 Green et al.
8,764,466 B2 7/2014 Million
8,766,798 B2 7/2014 Howard et al.
8,768,381 B2 7/2014 Howard et al.
8,776,644 B2 7/2014 Harper et al.
8,792,598 B1 7/2014 Cendrillon et al.
8,847,754 B2 9/2014 Buchheim et al.
8,847,755 B2 9/2014 Howard et al.
8,851,200 B2 10/2014 Gray et al.
8,870,078 B2 10/2014 Webb et al.
8,878,671 B2 11/2014 Buchheim et al.
8,884,756 B2 11/2014 Howard et al.
8,884,871 B2 11/2014 Howard et al.
8,890,686 B2 11/2014 Howard et al.
8,896,457 B2 11/2014 Howard et al.
8,928,463 B2 1/2015 Landau et al.
8,938,315 B2 1/2015 Freeman et al.
8,981,952 B2 3/2015 Howard et al.
8,988,522 B2 3/2015 Schneider et al.
9,041,528 B2 5/2015 Howard et al.
9,049,641 B2 6/2015 Wible et al.
9,078,481 B2 7/2015 Howard et al.
9,082,277 B2 7/2015 Howard et al.
9,089,952 B2 7/2015 Gatling et al.
9,129,499 B2 9/2015 Howard et al.
9,189,663 B2 11/2015 Goren et al.
9,196,881 B2 11/2015 Gray et al.
9,232,357 B2 1/2016 Buchheim et al.
9,256,988 B2 2/2016 Wenger et al.
9,295,024 B2 3/2016 Howard et al.
9,367,062 B2 6/2016 Volpert
9,392,404 B2 7/2016 Daoura et al.
9,430,928 B2 * 8/2016 Ikeda ...................... H04L 67/34
9,449,268 B2 9/2016 Goren et al.
9,466,198 B2 10/2016 Burch et al.
9,467,862 B2 10/2016 Zeiler et al.
9,491,578 B1 11/2016 Saucedo
9,495,847 B2 11/2016 Howard et al.
9,501,883 B2 11/2016 Handville et al.
9,537,335 B2 1/2017 Furui et al.
9,547,965 B2 1/2017 Goren et al.
9,564,774 B2 2/2017 Daoura et al.
9,576,235 B2 2/2017 Kim et al.
9,577,450 B2 2/2017 Yoshikawa et al.
9,595,839 B2 3/2017 Furui et al.
9,626,851 B2 4/2017 Xi et al.
9,639,722 B2 5/2017 Landau et al.
9,664,808 B2 5/2017 Nguyen et al.
9,672,708 B2 6/2017 Goren et al.
9,693,024 B2 6/2017 Schneider et al.
9,707,026 B2 7/2017 Malackowski et al.

(56) References Cited

U.S. PATENT DOCUMENTS

| | | | | |
|---|---|---|---|---|
| 9,711,017 | B2 | 7/2017 | Howard et al. | |
| 9,713,116 | B2 | 7/2017 | Wible et al. | |
| 9,715,807 | B2 | 7/2017 | Howard | |
| 9,756,402 | B2 | 9/2017 | Stampfl et al. | |
| 9,759,402 | B2 | 9/2017 | Stampfl et al. | |
| 9,779,601 | B2 | 10/2017 | Goren et al. | |
| 9,780,583 | B2 | 10/2017 | Furui et al. | |
| 9,819,132 | B2 * | 11/2017 | Peloquin | B25F 5/00 |
| 9,833,890 | B2 | 12/2017 | Ito et al. | |
| 9,875,629 | B2 | 1/2018 | Goren et al. | |
| 9,888,300 | B2 | 2/2018 | Stampfl et al. | |
| 9,892,626 | B2 | 2/2018 | Daoura et al. | |
| 9,908,182 | B2 | 3/2018 | Phillips et al. | |
| 9,916,739 | B2 | 3/2018 | Suzuki | |
| 9,942,700 | B2 | 4/2018 | Howard et al. | |
| 9,943,746 | B2 | 4/2018 | Kennard et al. | |
| 9,955,993 | B2 | 5/2018 | Deng | |
| 9,967,713 | B2 | 5/2018 | Buchheim et al. | |
| 9,973,831 | B2 | 5/2018 | Mejegard et al. | |
| 9,979,149 | B2 | 5/2018 | Peloquin et al. | |
| 9,986,212 | B2 | 5/2018 | Schneider et al. | |
| 10,022,853 | B1 | 7/2018 | Mollica | |
| 10,049,549 | B2 | 8/2018 | Howard | |
| 10,051,910 | B2 | 8/2018 | Howard et al. | |
| 10,074,049 | B2 | 9/2018 | Daoura et al. | |
| 10,090,692 | B2 | 10/2018 | Yoshikawa et al. | |
| 10,123,161 | B2 | 11/2018 | Howard et al. | |
| 10,124,455 | B2 | 11/2018 | Ito et al. | |
| 10,131,042 | B2 | 11/2018 | Mergener et al. | |
| 10,131,043 | B2 | 11/2018 | Mergener et al. | |
| 10,136,198 | B2 | 11/2018 | Stampfl et al. | |
| 10,213,908 | B2 | 2/2019 | Mergener et al. | |
| 10,277,964 | B2 | 4/2019 | Stampfl et al. | |
| 10,295,990 | B2 | 5/2019 | Dey, IV et al. | |
| 10,322,522 | B2 | 6/2019 | DeCicco et al. | |
| 10,354,181 | B2 | 7/2019 | Freienstein et al. | |
| 10,368,186 | B2 * | 7/2019 | Stampfl | H04W 4/80 |
| 10,380,883 | B2 * | 8/2019 | Matson | G08C 17/02 |
| 10,391,622 | B2 | 8/2019 | Tanaka et al. | |
| 10,396,573 | B2 | 8/2019 | Furui et al. | |
| 10,398,032 | B1 | 8/2019 | Bailey et al. | |
| 10,424,189 | B2 | 9/2019 | Daoura et al. | |
| 10,431,064 | B2 | 10/2019 | Howard | |
| 10,440,501 | B2 | 10/2019 | Howard et al. | |
| D867,909 | S | 11/2019 | Kachar | |
| 10,510,199 | B2 | 12/2019 | Hoossainy et al. | |
| 10,516,920 | B2 | 12/2019 | Stampfl et al. | |
| 10,518,343 | B2 | 12/2019 | Ogino et al. | |
| 10,569,398 | B2 | 2/2020 | Mergener et al. | |
| 10,854,054 | B2 * | 12/2020 | Esenwein | B25F 5/00 |
| 11,085,582 | B2 * | 8/2021 | Mergener | F16P 3/148 |
| 11,212,909 | B2 | 12/2021 | Smith et al. | |
| 11,375,610 | B2 | 6/2022 | Lienau et al. | |
| 2002/0110431 | A1 | 8/2002 | Dils et al. | |
| 2003/0090239 | A1 | 5/2003 | Sakakibara | |
| 2003/0093103 | A1 | 5/2003 | Malackowski et al. | |
| 2004/0108120 | A1 | 6/2004 | Wiesner et al. | |
| 2004/0135692 | A1 | 7/2004 | Below et al. | |
| 2004/0198382 | A1 | 10/2004 | Hammond | |
| 2005/0075149 | A1 | 4/2005 | Gerber et al. | |
| 2005/0173142 | A1 | 8/2005 | Cutler et al. | |
| 2005/0197093 | A1 | 9/2005 | Wiklof et al. | |
| 2005/0267988 | A1 | 12/2005 | Ferguson et al. | |
| 2006/0179473 | A1 | 8/2006 | Innami et al. | |
| 2008/0125040 | A1 | 5/2008 | Kalayjian | |
| 2008/0135272 | A1 | 6/2008 | Wallgren | |
| 2008/0177267 | A1 | 7/2008 | Sands et al. | |
| 2008/0196910 | A1 | 8/2008 | Radle et al. | |
| 2008/0238609 | A1 | 10/2008 | Wiesner et al. | |
| 2008/0252446 | A1 | 10/2008 | Dammertz | |
| 2008/0269031 | A1 | 10/2008 | Lee et al. | |
| 2009/0145187 | A1 | 6/2009 | Deppner et al. | |
| 2009/0251330 | A1 | 10/2009 | Gerold et al. | |
| 2010/0096151 | A1 | 4/2010 | Ostling | |
| 2010/0140345 | A1 * | 6/2010 | Sakamoto | B25B 21/00<br>235/376 |
| 2010/0186976 | A1 * | 7/2010 | Tsubakimoto | B25F 5/001<br>173/47 |
| 2010/0216415 | A1 * | 8/2010 | Arimura | G08C 17/02<br>455/90.1 |
| 2010/0265097 | A1 * | 10/2010 | Obatake | B25F 5/00<br>340/870.4 |
| 2010/0295747 | A1 | 11/2010 | Zeltser et al. | |
| 2011/0003504 | A1 | 1/2011 | Rejman | |
| 2011/0073343 | A1 | 3/2011 | Sawano et al. | |
| 2011/0253402 | A1 | 10/2011 | Aradachi et al. | |
| 2012/0169485 | A1 | 7/2012 | Eckert | |
| 2012/0292070 | A1 * | 11/2012 | Ito | H02K 11/33<br>173/217 |
| 2012/0304367 | A1 | 12/2012 | Howard et al. | |
| 2013/0109375 | A1 | 5/2013 | Zeiler et al. | |
| 2013/0256349 | A1 | 10/2013 | Styth et al. | |
| 2013/0267247 | A1 | 10/2013 | Wible et al. | |
| 2013/0295426 | A1 | 11/2013 | Halavart et al. | |
| 2013/0296910 | A1 | 11/2013 | Deng | |
| 2013/0313925 | A1 | 11/2013 | Mergener et al. | |
| 2013/0344885 | A1 | 12/2013 | Parisi et al. | |
| 2014/0031831 | A1 | 1/2014 | Malackowski et al. | |
| 2014/0070924 | A1 | 3/2014 | Wenger et al. | |
| 2014/0132411 | A1 | 5/2014 | Buchheim et al. | |
| 2014/0151079 | A1 * | 6/2014 | Furui | B25F 5/02<br>173/171 |
| 2014/0158389 | A1 | 6/2014 | Ito et al. | |
| 2014/0159662 | A1 | 6/2014 | Furui et al. | |
| 2014/0180464 | A1 | 6/2014 | Koerber | |
| 2014/0184397 | A1 | 7/2014 | Volpert | |
| 2014/0240125 | A1 | 8/2014 | Burch et al. | |
| 2014/0262391 | A1 | 9/2014 | Eardley | |
| 2014/0326477 | A1 | 11/2014 | Thorson et al. | |
| 2014/0367134 | A1 | 12/2014 | Phillips et al. | |
| 2015/0054627 | A1 | 2/2015 | Landau et al. | |
| 2015/0133170 | A1 | 5/2015 | Buchheim et al. | |
| 2015/0195807 | A1 | 7/2015 | Wible et al. | |
| 2015/0197093 | A1 | 7/2015 | Berry et al. | |
| 2015/0219257 | A1 | 8/2015 | Harper et al. | |
| 2015/0286209 | A1 | 10/2015 | Kreuzer et al. | |
| 2015/0316913 | A1 | 11/2015 | Rickey et al. | |
| 2015/0340921 | A1 | 11/2015 | Suda et al. | |
| 2015/0356861 | A1 | 12/2015 | Daoura et al. | |
| 2016/0019512 | A1 | 1/2016 | Buchheim et al. | |
| 2016/0048122 | A1 | 2/2016 | Lukosz et al. | |
| 2016/0171788 | A1 | 6/2016 | Wenger et al. | |
| 2016/0226132 | A1 * | 8/2016 | Kim | H01Q 5/378 |
| 2016/0249168 | A1 | 8/2016 | Evans et al. | |
| 2016/0311094 | A1 | 10/2016 | Mergener et al. | |
| 2016/0325391 | A1 * | 11/2016 | Stampfl | B25F 5/00 |
| 2016/0342151 | A1 * | 11/2016 | Dey, IV | G06F 3/04847 |
| 2017/0008159 | A1 | 1/2017 | Boeck et al. | |
| 2017/0083014 | A1 | 3/2017 | Conrad et al. | |
| 2017/0191827 | A1 * | 7/2017 | Zhou | G01S 17/08 |
| 2017/0201295 | A1 * | 7/2017 | Kusakawa | B25F 5/00 |
| 2017/0201853 | A1 | 7/2017 | Chen et al. | |
| 2017/0216986 | A1 * | 8/2017 | Dey, IV | B23D 51/16 |
| 2017/0228566 | A1 | 8/2017 | Sengstaken, Jr. | |
| 2017/0259422 | A1 | 9/2017 | Takeyama et al. | |
| 2017/0303984 | A1 | 10/2017 | Malackowski | |
| 2017/0343966 | A1 | 11/2017 | Schadow et al. | |
| 2018/0071907 | A1 | 3/2018 | Myhill | |
| 2018/0076639 | A1 | 3/2018 | Furui et al. | |
| 2018/0104802 | A1 | 4/2018 | Mergener et al. | |
| 2018/0114423 | A1 | 4/2018 | Goren et al. | |
| 2018/0126537 | A1 * | 5/2018 | Tanaka | B25F 3/00 |
| 2018/0133872 | A1 * | 5/2018 | Tsai | B25B 23/1425 |
| 2018/0133873 | A1 | 5/2018 | Mergener et al. | |
| 2018/0154456 | A1 | 6/2018 | Phillips et al. | |
| 2018/0166768 | A1 * | 6/2018 | Van Cleave | H01Q 1/3291 |
| 2018/0199955 | A1 | 7/2018 | Deng | |
| 2018/0212377 | A1 | 7/2018 | Zimmermann et al. | |
| 2018/0302753 | A1 | 10/2018 | Langton | |
| 2018/0319003 | A1 | 11/2018 | Freienstein et al. | |
| 2018/0322376 | A1 | 11/2018 | Henry et al. | |
| 2018/0345474 | A1 * | 12/2018 | Brennenstuhl | B25F 5/02 |
| 2018/0354118 | A1 * | 12/2018 | Brennenstuhl | H01M 10/425 |

(56) References Cited

U.S. PATENT DOCUMENTS

| | | | | |
|---|---|---|---|---|
| 2018/0357523 | A1* | 12/2018 | Freienstein | G06K 19/07758 |
| 2019/0011892 | A1* | 1/2019 | Post | B25F 5/00 |
| 2019/0026619 | A1 | 1/2019 | Cecchin et al. | |
| 2019/0027002 | A1 | 1/2019 | Esenwein et al. | |
| 2019/0043292 | A1 | 2/2019 | Hoossainy et al. | |
| 2019/0103012 | A1 | 4/2019 | Daoura et al. | |
| 2019/0160646 | A1* | 5/2019 | Hoossainy | H04W 64/003 |
| 2019/0173349 | A1 | 6/2019 | Smith et al. | |
| 2019/0215584 | A1 | 7/2019 | Stampfl et al. | |
| 2019/0219990 | A1 | 7/2019 | Dey, IV et al. | |
| 2019/0271973 | A1* | 9/2019 | Conrad | B25B 23/1475 |
| 2019/0298122 | A1 | 10/2019 | Tahara et al. | |
| 2019/0299386 | A1 | 10/2019 | Tanaka et al. | |
| 2019/0334357 | A1 | 10/2019 | Furui et al. | |
| 2020/0094393 | A1* | 3/2020 | Schadow | B25F 5/02 |
| 2021/0117749 | A1* | 4/2021 | Vetter | G06K 19/07758 |

FOREIGN PATENT DOCUMENTS

| | | | | |
|---|---|---|---|---|
| CN | 102983399 | A | 3/2013 | |
| CN | 103579741 | A | 2/2014 | |
| CN | 203956880 | U | 11/2014 | |
| CN | 107877457 | A | 4/2018 | |
| DE | 8102453 | U1 | 9/1982 | |
| DE | 10238710 | A1 | 3/2003 | |
| DE | 202004020457 | U1 | 6/2005 | |
| DE | 202005010622 | U1 | 11/2006 | |
| DE | 102005053821 | A1 | 5/2007 | |
| DE | 102006046801 | A1 | 4/2008 | |
| DE | 202008012687 | U1 | 12/2008 | |
| DE | 102010041278 | A1 | 3/2012 | |
| DE | 102011050393 | A1 | 11/2012 | |
| DE | 102011089499 | A1 | 6/2013 | |
| DE | 102012105483 | A1 | 12/2013 | |
| DE | 202014006084 | U1 | 8/2014 | |
| DE | 102015226734 | A1 | 6/2017 | |
| DE | 102016211937 | A1 | 1/2018 | |
| DE | 102011122212 | B4 * | 4/2022 | B25B 21/00 |
| EP | 1270150 | A2 | 1/2003 | |
| EP | 1291999 | A1 | 3/2003 | |
| EP | 1690648 | A2 | 8/2006 | |
| EP | 1781074 | A2 | 5/2007 | |
| EP | 2072192 | A1 | 6/2009 | |
| EP | 2581168 | A1 | 4/2013 | |
| EP | 2628427 | A2 | 8/2013 | |
| EP | 3200313 | A1 | 6/2017 | |
| EP | 3272467 | A1 | 1/2018 | |
| JP | 2010194662 | A | 9/2010 | |
| JP | 2019171523 | A | 10/2019 | |
| KR | 1020180108895 | A | 10/2018 | |
| WO | WO2007058596 | A1 | 5/2007 | |
| WO | WO-2009030043 | A1 * | 3/2009 | H01Q 9/36 |
| WO | WO2012035815 | A1 | 3/2012 | |
| WO | WO2012035854 | A1 | 3/2012 | |
| WO | WO2013014914 | A2 | 1/2013 | |
| WO | WO2013112469 | A1 | 8/2013 | |
| WO | WO2013116303 | A1 | 8/2013 | |
| WO | WO2013136917 | A1 | 9/2013 | |
| WO | WO2015061370 | A1 | 4/2015 | |
| WO | WO2016206859 | A1 | 12/2016 | |
| WO | WO2016206860 | A1 | 12/2016 | |
| WO | WO2017089100 | A1 | 6/2017 | |
| WO | WO2017089452 | A1 | 6/2017 | |
| WO | WO2017093160 | A1 | 6/2017 | |
| WO | WO2017151954 | A1 | 9/2017 | |
| WO | WO2018024637 | A1 | 2/2018 | |
| WO | WO2018162233 | A1 | 9/2018 | |
| WO | WO2018177669 | A1 | 10/2018 | |
| WO | WO2018177671 | A1 | 10/2018 | |
| WO | WO2019115434 | A1 | 6/2019 | |
| WO | WO-2021102289 | A1 * | 5/2021 | H04B 1/3827 |

OTHER PUBLICATIONS

Pixie, <https://getpixie.com> webpage accessed Jan. 31, 2019.

International Search Report and Written Opinion for Application No. PCT/US2020/061544 dated Mar. 11, 2021 (13 pages).

International Search Report and Written Opinion for Application No. PCT/US2020/061549 dated Mar. 5, 2021 (10 pages).

* cited by examiner

INSERTABLE WIRELESS COMMUNICATION DEVICE FOR A POWER TOOL

RELATED APPLICATIONS

This application is a continuation of U.S. patent application Ser. No. 18/498,283, filed on Oct. 31, 2023, which is a continuation of U.S. patent application Ser. No. 18/161,520, filed on Jan. 30, 2023, now U.S. Pat. No. 11,871,509, which is a continuation of U.S. patent application Ser. No. 17/752,548, filed on May 24, 2022, now U.S. Pat. No. 11,570,888, which is a continuation of U.S. patent application Ser. No. 17/291,203, filed on May 4, 2021, now U.S. Pat. No. 11,375,610, which is a national stage filing under 35 U.S.C. § 371 of International Patent Application No. PCT/US2020/061544, filed on Nov. 20, 2020, which claims priority to U.S. Provisional Application No. 62/938,516, filed on Nov. 21, 2019, to U.S. Provisional Application No. 63/047,447, filed on Jul. 2, 2020, and to U.S. Provisional Application No. 63/047,449, filed Jul. 2, 2020, the entire contents of all of which are hereby incorporated by reference.

FIELD

Embodiments described herein relate to host devices (e.g., power tool devices) with a compartment for receiving another device.

SUMMARY

One embodiment includes a power tool that may include a housing having a motor housing portion, a handle portion, and a battery pack receiving portion. The power tool also may include a motor within the motor housing portion and having a rotor and a stator. The motor may be configured to drive an output drive device. The power tool also may include a first electronic processor within the housing and configured to control operation of the motor. The power tool also may include a compartment located in the housing, and a first printed circuit board (PCB) located in the housing and electrically coupled to a first connector. The power tool also may include an insertable wireless communication device including a second electronic processor and an antenna each of which is mounted to a second PCB. The insertable wireless communication device may be configured to be received in the compartment and may include a second connector configured to electrically and physically couple to the first connector. The insertable wireless communication device may be configured to wirelessly communicate with an external device. When the insertable wireless communication device is inserted into the compartment, a first conductive layer of the first PCB may be configured to be electrically coupled to the antenna via the first connector and the second connector such that the first conductive layer of the first PCB serves as a ground plane of the antenna, and the first electronic processor may be configured to communicate with the second electronic processor to allow information to be transferred between the first electronic processor and the external device.

Another embodiment includes a power tool that may include a housing having a motor housing portion, a handle portion, and a battery pack receiving portion. The power tool also may include a motor within the motor housing portion and having a rotor and a stator. The motor may be configured to drive an output drive device. The power tool also may include a first electronic processor within the housing and configured to control operation of the motor. The power tool also may include a compartment located in the housing, and a first printed circuit board (PCB) located in the housing and electrically coupled to a first connector. The compartment may be configured to receive an insertable wireless communication device including a second electronic processor, an antenna mounted to a second PCB, and a second connector configured to electrically and physically coupled to the first connector. The insertable wireless communication device may be configured to wirelessly communicate with an external device. When the insertable wireless communication device is inserted into the compartment, a first conductive layer of the first PCB may be configured to be electrically coupled to the antenna via the first connector and the second connector such that the first conductive layer of the first PCB serves as a ground plane of the antenna, and the first electronic processor may be configured to communicate with the second electronic processor to allow information to be transferred between the first electronic processor and the external device.

Another embodiment includes a power tool device that may include a housing, and a first electronic processor within the housing. The power tool device may also include a compartment located in the housing, and a first printed circuit board (PCB) located in the housing. The power tool device may also include an insertable wireless communication device including a second electronic processor and an antenna each of which is mounted to a second PCB, the insertable wireless communication device may be configured to be received in the compartment. The insertable wireless communication device may be configured to wirelessly communicate with an external device. When the insertable wireless communication device is inserted into the compartment, a first conductive layer of the first PCB may be configured to be electrically coupled to the antenna such that the first conductive layer of the first PCB serves as a ground plane of the antenna.

Another embodiment includes a wireless communication system that may include a transmitting device housing that may include a securing element configured to secure the transmitting device housing to an object. The wireless communication system may further include a power source within the transmitting device housing, and a compartment located in the transmitting device housing. The wireless communication system may further include a first insertable wireless communication device that may include a first electronic processor and a first antenna each of which is mounted to a first printed circuit board (PCB). The first insertable wireless communication device may be configured to be received in the compartment. The first insertable wireless communication device may be configured to receive power from the power source when the first insertable wireless communication device is inserted into the compartment. The first insertable wireless communication device may be configured to wirelessly communicate with a first external device via a first communication protocol. The wireless communication system may further include a second insertable wireless communication device that may include a second electronic processor and a second antenna each of which is mounted to a second PCB. The second insertable wireless communication device may be configured to be received in the compartment. The second insertable wireless communication device may be configured to receive power from the power source when the second insertable wireless communication device is inserted into the compartment. The second insertable wireless communication device may be configured to wirelessly communicate with a second external device via a second communication protocol that is different from the first communication protocol.

Other aspects of the invention will become apparent by consideration of the detailed description and accompanying drawings.

DETAILED DESCRIPTION

Figure 1:
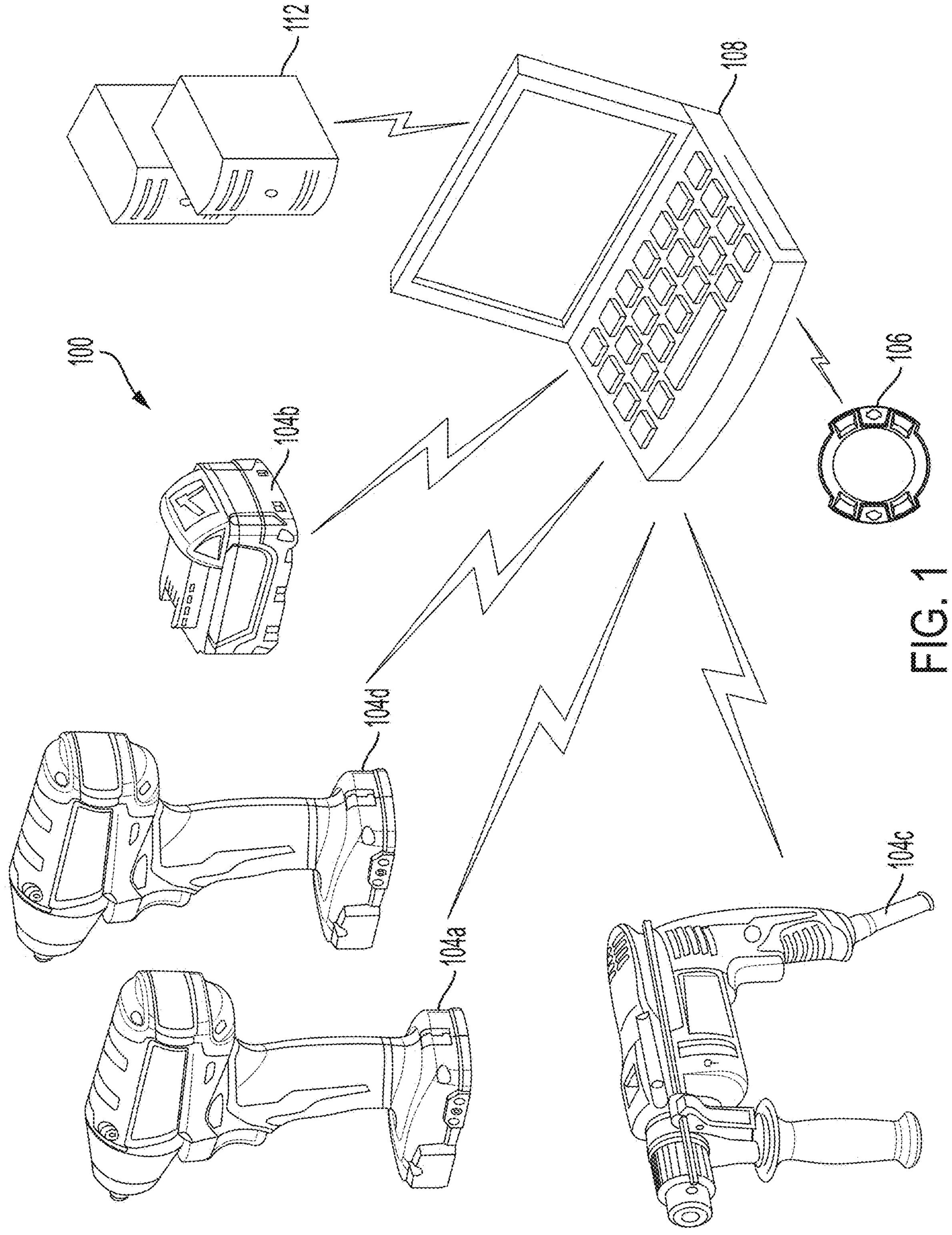
FIG. 1 illustrates a communication system according to one example embodiment.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limited. The use of "including," "comprising" or "having" and variations thereof herein is meant to encompass the items listed thereafter and equivalents thereof as well as additional items. The terms "mounted," "connected" and "coupled" are used broadly and encompass both direct and indirect mounting, connecting and coupling. Further, "connected" and "coupled" are not restricted to physical or mechanical connections or couplings, and can include electrical connections or couplings, whether direct or indirect.

It should be noted that a plurality of hardware and software based devices, as well as a plurality of different structural components may be utilized to implement the invention. Furthermore, and as described in subsequent paragraphs, the specific configurations illustrated in the drawings are intended to exemplify embodiments of the invention and that other alternative configurations are possible. The terms "processor" "central processing unit" and "CPU" are interchangeable unless otherwise stated. Where the terms "processor" or "central processing unit" or "CPU" are used as identifying a unit performing specific functions, it should be understood that, unless otherwise stated, those functions can be carried out by a single processor, or multiple processors arranged in any form, including parallel processors, serial processors, tandem processors or cloud processing/cloud computing configurations.

Throughout this application, the term "approximately" is used to describe the dimensions of various components. In some situations, the term "approximately" means that the described dimension is within 1% of the stated value, within 5% of the stated value, within 10% of the stated value, or the like. When the term "and/or" is used in this application, it is intended to include any combination of the listed components. For example, if a component includes A and/or B, the component may include A (without B), B (without A), or both A and B.

FIG. 1 illustrates a communication system 100. The communication system 100 includes power tool devices **104*a*, 104*b*, 104*c*, and 104*d*, each generically referred to as the power tool or power tool device 104, and an external device 108. The communication system also includes one or more transmitting devices 106. The power tool devices 104*a*, 104*b*, 104*c*, 104*d* and the transmitting device 106 each include a wireless communication controller to enable wireless communication between the power tool 104/transmitting device 106 and the external device 108 while they are within a communication range of each other. Some of the power tool devices 104*d*/transmitting devices 106 include the wireless communication device integrated into the power tool device 104*d*/transmitting device 106 such that insertion or removal of the wireless communication device is prevented (i.e., installed within the housing of the power tool 104/transmitting device 106 at the time of manufacturing the power tool 104/transmitting device 106). Other power tool devices 104*a*, 104*b*, 104*c* or transmitting devices 106 however, include an insertable device compartment (e.g., compartment 405 of FIGS. 4-7, compartment 1910 of FIG. 19, or the like) configured to receive the wireless communication device (e.g., an insertable wireless communication device 610, 1905 as explained in greater detail below). The insertable device compartment allows the insertable wireless communication device to be optionally added to the power tool 104/transmitting device 106 as an accessory after manufacturing of the power tool 104/transmitting device 106. Power tool devices 104/transmitting devices 106 including the insertable device compartment may be referred to herein as host devices 104, 106**.

In some embodiments, the wireless communication device that is optionally added to the power tool device 104 includes an irreversible lock that, once engaged with the wireless communication device, cannot be unlocked (except by authorized service personnel) as explained in greater detail below. In some embodiments, the insertable device compartment is configured to receive a placeholder housing (e.g., a plastic housing without internal electronic components or a plastic housing including circuitry configured for wireless communication using a first protocol) that may be installed at the time of manufacturing the power tool but may be later removed and replaced with a wireless communication device (or with a housing including circuitry configured for wireless communication using a second protocol different from the first protocol) by a user if desired. For example, because power tool devices 104/transmitting devices 106 are purchased by different users with different budgets and for different projects, some users may prefer that a power tool device 104 includes communication capabilities while such communication capabilities may not be useful to or desired by other users. Similarly, different users may desire different wireless communication capabilities for the power tool device 104/transmitting device 106 (e.g., short-range radio communication via, for example, Bluetooth® versus long-range radio communication via, for example, a cellular network). Accordingly, in some situations, it is desirable for the power tool 104/transmitting device 106 to be configured to receive any one of multiple interchangeable insertable wireless communication devices to cater to different needs of different users.

Additionally, it is often desirable to design power tool devices 104/transmitting devices 106 to be compact such that users are able to easily use and transport the power tool devices 104/transmitting devices 106. Accordingly, there may be limited space within the power tool device 104/transmitting device 106 to include communication circuitry (e.g., an antenna) that allows the power tool device 104/transmitting device 106 to communicate with other devices (e.g., the external device 108 and/or the server 112). Thus, it may be desirable to make the insertable wireless communication device relatively small so that the insertable wireless communication device (and the compartment that receives the insertable wireless communication device) consumes only a small amount of space within the housing of the power tool device 104/transmitting device 106. However, some communication protocols (e.g., cellular communication over a cellular network) have standards for antennas regarding minimal transmit power and minimal receive sensitivity (i.e., minimum antenna efficiency standards set forth by cellular service providers) to ensure proper operation of devices communicating using such protocols.

In the use case of a monopole (i.e., ground plane) antenna (e.g., quarter-wavelength) being used by the power tool device 104/transmitting device 106 to communicate with external devices according to some embodiments as explained herein (e.g., antenna 1315 of FIGS. 13 and 14A), a length or surface area of the ground plane of the antenna directly affects the efficiency of the antenna. Accordingly, the length or surface area of the ground plane of the antenna may be designed to be at least a predetermined size in order to meet the minimum antenna efficiency standards and function properly. For example, in order to function properly and meet the minimum antenna efficiency standards, an antenna with a smaller conductor portion (i.e., a smaller antenna) requires a larger ground plane than an antenna with a larger conductor portion (i.e., a larger antenna). However, a technological problem arises when the desired size of the insertable wireless communication device is smaller than the predetermined size of the ground plane necessary to meet the minimum antenna efficiency standards. Embodiments of the host device 104, 106 described herein address this technological problem by utilizing a conductive layer of a printed circuit board (PCB) of the host device 104, 106 (e.g., a conductive layer 1005 of the first PCB 605) to create an extended ground plane for the antenna of the insertable wireless communication device. In other words, embodiments of the host device 104, 106 described herein allow the antenna of an insertable wireless communication device to meet a minimum antenna efficiency standard while maintaining a small size of the insertable wireless communication device. Some embodiments of the host device 104, 106 and an insertable wireless communication device 610 accordingly allow for improved efficiency and/or radio frequency performance of an antenna and corresponding transceiver circuitry with a compact design.

In some embodiments, when the power tool devices 104*a*, 104*b*, 104*c* include the wireless communication device in the insertable device compartment, the power tool devices 104*a*, 104*b*, 104*c* can operate similar to the power tool device 104*d* as if the wireless communication device was integrally formed within the power tool device 104. The power tool device 104 may communicate power tool status, power tool operation statistics, power tool identification, stored power tool usage information, power tool maintenance data, and the like. Therefore, using the external device 108, a user can access stored power tool usage or power tool maintenance data. With this tool data, a user can determine how the power tool device 104 has been used, whether maintenance is recommended or has been performed in the past, and identify malfunctioning components or other reasons for certain performance issues. The external device 108 can also transmit data to the power tool device 104 for power tool configuration, firmware updates, or to send commands (e.g., turn on a work light, lock the power tool 104, and the like). The external device 108 also allows a user to set operational parameters, safety parameters, select tool modes, and the like for the power tool device 104 (e.g., adjust operating modes or parameters of the power tool 104 such as motor speed, motor ramp-up, torque, and the like). The external device 108 may also communicate with a remote server 112 and may receive configuration and/or settings for the power tool 104, or may transmit operational data or other power tool status information to the remote server 112.

In some embodiments, some of the power tool devices 104*a*, 104*b*, 104*c* include both an integrated wireless communication device and an insertable device compartment configured to receive an insertable wireless communication device. In some embodiments, these two wireless communication devices of the same power tool 104*a*, 104*b*, 104*c* may use different communication protocols to allow the power tool 104*a*, 104*b*, 104*c* to communicate with the external device 108 and/or the server 112. For example, the integrated wireless communication device may allow for short-range radio communication (e.g., Bluetooth®) with the external device 108 while the insertable wireless communication device may allow for long-range radio communication (e.g., cellular communication over a cellular network with the server 112, communication via a WiFi-transceiver, communication via a GPS transceiver, and/or the like).

In some embodiments, a transmitting device 106 includes the wireless communication device in the insertable device compartment, the transmitting device 106 can operate similar to transmitting devices 106 that include a wireless communication device integrally formed within the transmitting devices 106. The transmitting device 106 may be attached to an object (e.g., a ladder, a bucket, a hand tool, a power tool, test and measurement equipment, a battery pack, a vacuum cleaner, a work site radio, outdoor power equipment, a vehicle, another object located at a construction site, etc.) using adhesive, fasteners, mounting holes on the transmitting device 106, or the like (see FIG. 25B). The transmitting device 106 may be used to track the location of the object to which the transmitting device 106 is attached. For example, the transmitting device 106 periodically broadcasts beacon data to be received by the external device 108, the server 112, and/or other external devices. The beacon data may include one or more of a transmitter identifier, a user identifier, user contact information, timestamp, state of charge of an energy storage device of the transmitting device 106, an object identifier (identifying the object to which the transmitting device 106 is attached), and other status information. In turn, the external device 108 may log the beacon data locally on a memory of the external device 108, send tracking data to the server 112 for logging, or both log the beacon data and send the tracking data to the server 112.

In some embodiments, the integrated wireless communication device of a host device 104, 106 may be configured to wirelessly communicate with a corresponding wireless communication device (e.g., a Bluetooth® transceiver and antenna, near-field communication transceiver and antenna, or the like) of the insertable wireless communication device. In other words, the insertable wireless communication device may not include a connector that physically and electrically couples to the host device 104, 106 in some embodiments. Rather, the insertable wireless communication device may wirelessly communicate with the host device 104, 106 when the insertable wireless communication device is located within the compartment of the host device 104, 106. The insertable wireless communication device may then wirelessly communicate with an external device 108 and/or server 112 using a different communication protocol and at least some different circuitry (e.g., cellular communication over a cellular network, communication via a WiFi-transceiver, communication via a GPS transceiver, and/or the like) and/or using the same communication protocol and the same circuitry that is used to wirelessly communicate with the host device 104, 106 (e.g., Bluetooth®, near-field communication, or the like).

The external device 108 may be, for example, a laptop computer, a tablet computer, a smartphone, a cellphone, or another electronic device capable of communicating wirelessly with the power tool device 104/transmitting device 106 and providing a user interface. The external device 108 provides the user interface and allows a user to access and interact with tool information. The external device 108 can receive user inputs to determine operational parameters of the power tool device 104/transmitting device 106, enable or disable features of the power tool device 104/transmitting device 106, and the like. The user interface of the external device 108 provides an easy-to-use interface for the user to control and customize operation of the power tool device 104/transmitting device 106.

Although a single transmitting device 106 is illustrated in FIG. 1, in some embodiments, the system 100 includes a plurality of transmitting devices 106, each used to track a different object. Similarly, although a single external device 108 is illustrated in FIG. 1, in some embodiments, the system 100 includes a plurality of external devices 108 that may each receive wireless signals from one or more of the power tool devices 104/transmitting devices 106 and that may each communicate with the server 112, for example, over a cellular network. Accordingly, the server 112 stores and updates tracking data for each power tool device 104/transmitting device 106 in the system 100 based on communications from the one or more external devices 108. In some embodiments, at least some power tool devices 104/transmitting devices 106 may be configured to communicate directly with the server 112, for example, over a cellular network (i.e., without using the external device 108 as an intermediary between the power tool device 104/transmitting device 106 and the server 112). In other words, some power tool devices 104/transmitting devices 106 may have cellular communication capabilities and global positioning system (GPS) capabilities as explained in greater detail below.

Figure 2:
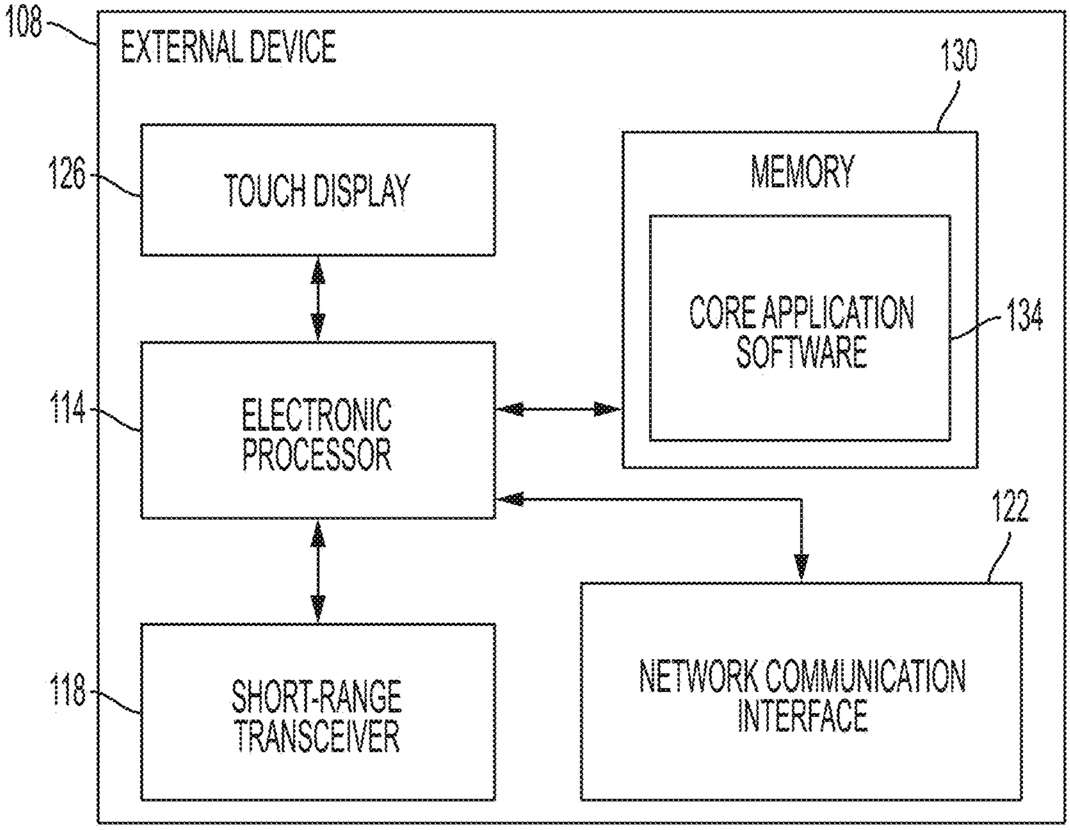
FIG. 2 illustrates a block diagram of an external device of the communication system of FIG. 1 according to one example embodiment.

As shown in FIG. 2, the external device 108 includes an external device electronic processor 114, a short-range transceiver 118 (e.g., a Bluetooth® transceiver), a network communication interface 122 (e.g., a cellular communication transceiver and antenna), a touch display 126, and a memory 130. The external device electronic processor 114 is coupled to the short-range transceiver 118, the network communication interface 122, the touch display 126, and the memory 130. The short-range transceiver 118, which may include or is coupled to an antenna (not shown), is configured to communicate with a compatible transceiver within the power tool 104 and/or transmitting device 106. The short-range transceiver 118 can also communicate with other electronic devices. The network communication interface 122 communicates with a network to enable communication with the remote server 112. The network communication interface 122 may include circuitry that enables the external device 108 to communicate with the network. In some embodiments, the network may be an Internet network, a cellular network, another network, or a combination thereof.

The memory 130 of the external device 108 stores core application software 134. The external device electronic processor 114 accesses and executes the core application software 134 in memory 130 to launch a control application that receives inputs from the user for the configuration and operation of the power tool device 104/transmitting device 106. The short-range transceiver 118 of the external device 108 is compatible with a transceiver of the power tool 104 (described in further detail below). The short-range transceiver 118 allows the external device 108 to communicate with the power tool device 104 and/or the transmitting device 106.

The remote server 112 may store data received from the power tool 104 and transmitting device 106 and/or data obtained by the external device 108 from, for example, the power tool 104 and the transmitting device 106. The remote server 112 may also provide additional functionality and services to the user. In one embodiment, storing the information on the remote server 112 allows a user to access the information from a plurality of different devices and locations (e.g., a remotely located desktop computer or mobile phone). In another embodiment, the remote server 112 may collect information from various users regarding their power tool devices 104/transmitting devices 106 and provide statistics or statistical measures to the user based on information obtained from the different power tools. For example, the remote server 112 may provide statistics regarding the experienced efficiency of the power tool 104, typical usage of the power tool 104, and other relevant characteristics and/or measures of the power tool 104. In some embodiments, the power tool device 104/transmitting device 106 is configured to communicate directly with the server 112 through an additional wireless interface or with the same wireless interface that the power tool device 104/transmitting device 106 uses to communicate with the external device 108.

Although the server 112 is illustrated as a singular unit, the server 112 may be made up of various servers located together or remotely and coupled via one or more networks. In some embodiments, the server 112 includes a tracking database that may be made up of various databases in communication with one another. An electronic processor of the server 112 may execute a tracking application to receive tracking data from external devices 108, power tool devices 104, and/or transmitting devices 106. Through execution of the tracking application, the server 112 may update the tracking database, and receive and respond to database queries for the tracking database. The tracking database stores tracking data for the power tool devices 104 and the transmitting devices 106 including one or more of a unique identifier the power tool device 104, the transmitting device 106, or an insertable wireless communication device; a user identifier (e.g., an owner of the power tool device 104, the transmitting device 106, or the insertable wireless communication device); user contact information; timestamp; last known location; state of charge of the battery of the tracked device (e.g., of a backup battery of the power tool device 104 such as a coin cell battery); other status information; external device identifier (e.g., identifying the most recent external device 108 that received communications from the tracked device and communicated the tracked device unique identifier and the location of the external device 108 to the server 112); and location history (e.g., including previous known locations, timestamps, and external device identifiers). The tracking database also stores a lost/not-lost indication (e.g., a flag) that indicates, based on a value of the indicator, whether each power tool device 104, transmitting device 106, and insertable wireless communication device is considered "lost" or "not lost."

The power tool device 104 is configured to perform one or more specific tasks (e.g., drilling, cutting, fastening, pressing, lubricant application, sanding, heating, grinding, bending, forming, impacting, polishing, lighting, etc.). For example, an impact wrench is associated with the task of generating a rotational output (e.g., to drive a bit), while a reciprocating saw is associated with the task of generating a reciprocating output motion (e.g., for pushing and pulling a saw blade). The task(s) associated with a particular tool may also be referred to as the primary function(s) of the tool.

Figure 3:
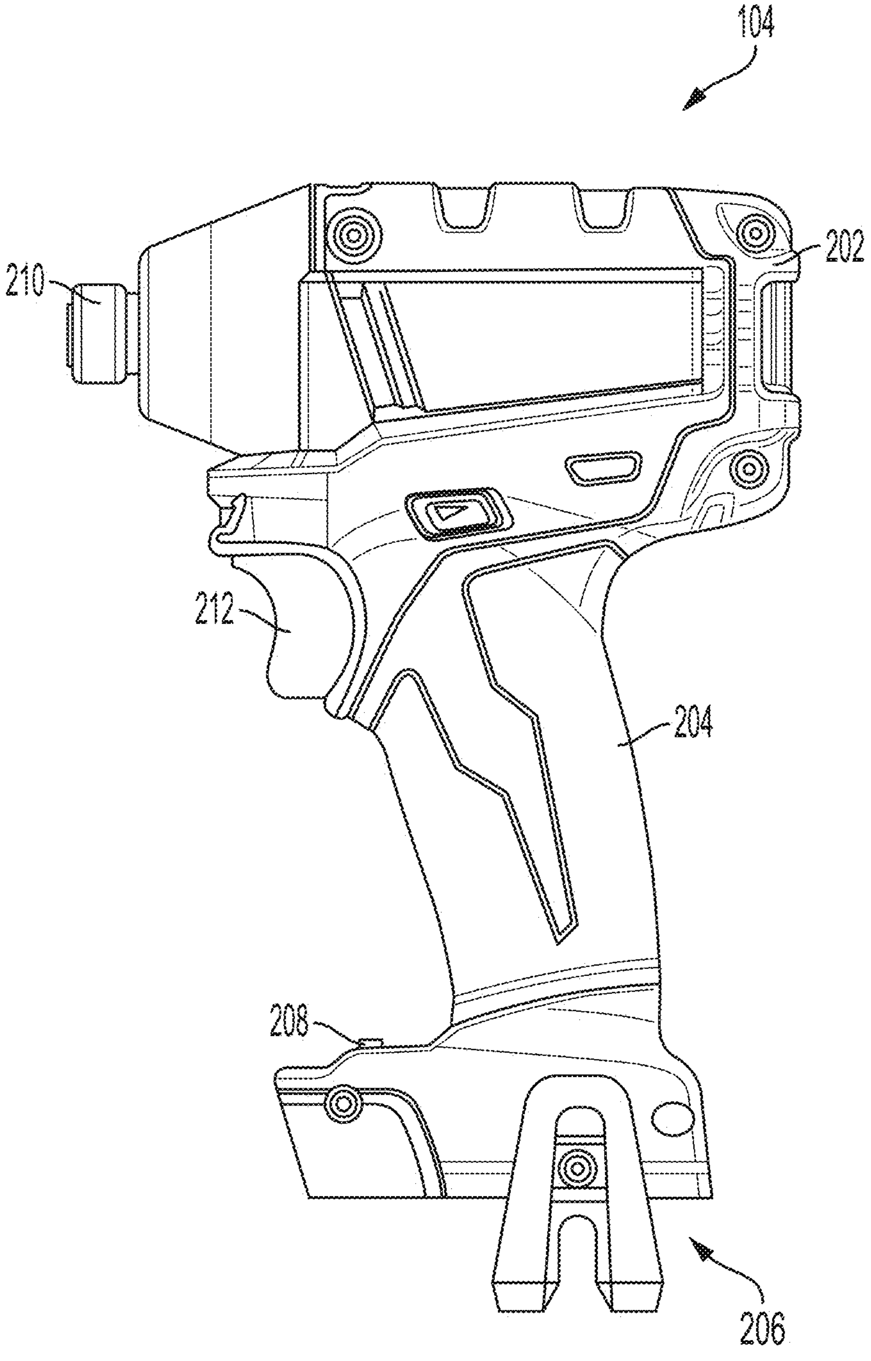
FIG. 3 illustrates a host device (e.g., a power tool device) of the communication system of FIG. 1 according to one example embodiment.

Although the power tool device 104 illustrated in FIG. 3 is an impact wrench and may be referred to herein as power tool 104, embodiments explained herein similarly apply to and can be used in conjunction with a variety of power tool devices 104 and transmitting devices 106 (i.e., host devices 104, 106) including power tools and/or accessories. For instance, the power tool device 104 may be another power tool, test and measurement equipment, a vacuum cleaner, a worksite radio, outdoor power equipment, a vehicle, a power tool battery pack, a charger configured to charge a power tool battery pack, or another device. Power tools can include drills, circular saws, jig saws, band saws, reciprocating saws, screw drivers, angle grinders, straight grinders, hammers, multi-tools, impact wrenches, rotary hammers, impact drivers, angle drills, pipe cutters, grease guns, hydraulic cutters, hydraulic crimpers, magnetic drills. and the like. Test and measurement equipment can include digital multimeters, clamp meters, fork meters, wall scanners, infrared (IR) thermometers, laser distance meters, laser levels, remote displays, insulation testers, moisture meters, thermal imagers, inspection cameras, and the like. Vacuum cleaners can include stick vacuums, hand vacuums, upright vacuums, carpet cleaners, hard surface cleaners, canister vacuums, broom vacuums, and the like. Outdoor power equipment can include blowers, chain saws, edgers, hedge trimmers, lawn mowers, trimmers, and the like. Other devices can include electronic key boxes, calculators, cellular phones, head phones, cameras, motion sensing alarms, flashlights, work lights (e.g., free-standing work lights), weather information display devices, a portable power source, a digital camera, a digital music player, a radio, and multi-purpose cutters. In some embodiments, the power tool device 104 may be non-motorized as indicated by a number of the above examples.

As shown in FIG. 3, the power tool 104 includes a main body 202 (i.e., a motor housing portion), a handle portion 204, a battery pack receiving portion 206, selection switch 208, an output drive device or mechanism 210, and a trigger 212 (or other actuator). The power tool 104 further includes a motor 214 (see FIG. 11) within the main body 202 of the housing and having a rotor 280 and a stator 285 (see FIG. 11). The rotor 280 is coupled to a motor shaft arranged to produce an output outside of the housing via the output drive device or mechanism 210. The housing of the power tool 104 (e.g., the main body 202, the handle 204, and the battery pack receiving portion 206) are composed of a durable and light-weight plastic material. The drive device 210 is composed of a metal (e.g., steel). The drive device 210 on the power tool 104 of FIG. 3 is a socket. However, each power tool 104 may have a different drive device 210 specifically designed for the task associated with the power tool 104. For example, the drive device 210 for a power drill may include a bit driver or chuck, while the drive device 210 for a pipe cutter may include a blade or blade holder. The selection switch 208 is configured to select an operation mode for the power tool 104. Different operation modes may have different speed or torque levels, or may control the power tool 104 based on different sets of parameters. In some embodiments, the selection switch 208 is a mode pad 208. The mode pad 208 allows a user to select a mode of the power tool 104 and indicates to the user the currently selected mode of the power tool 104.

Figure 4:
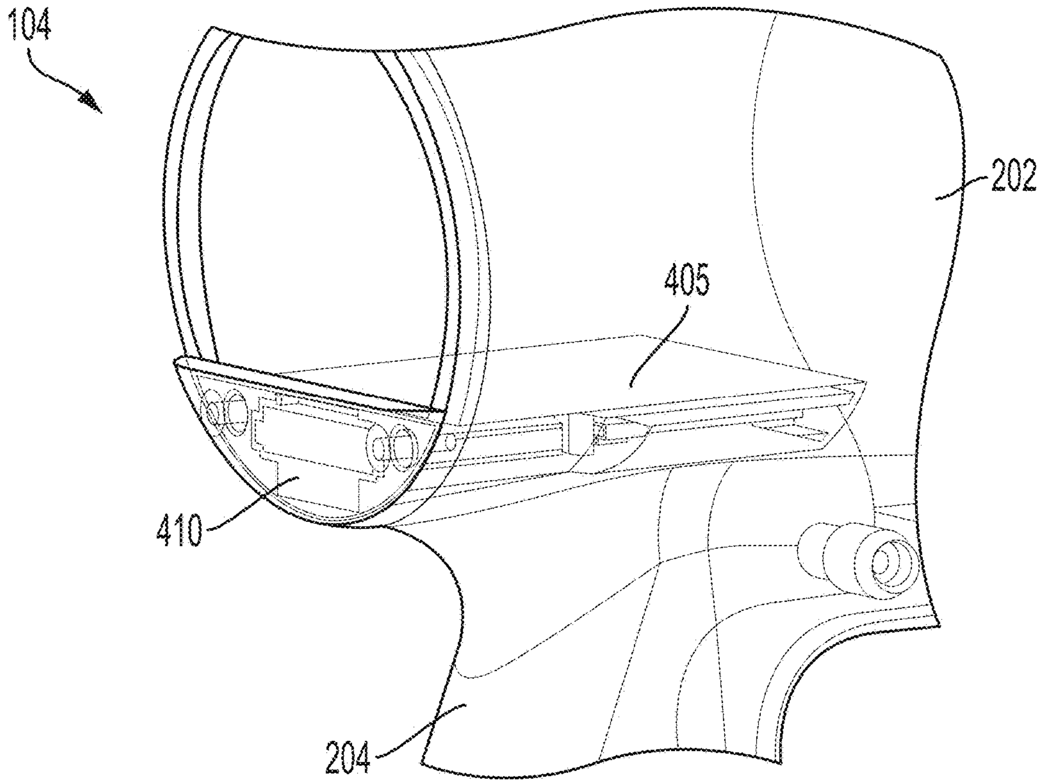
FIG. 4 is a perspective view of a main body of the power tool device of FIG. 3 that houses a motor according to one embodiment.

FIG. 4 is a perspective view of the main body 202 that houses a motor 214. In FIG. 4, the main body 202 is shown with the motor 214 removed from the power tool 104. As shown in FIG. 4, the main body 202 includes a compartment 405 located underneath the location for the motor 214 in the main body 202 and above the handle 204. The compartment 405 may be covered and sealed by a cover 410. In some embodiments, the compartment 405 has a length that runs approximately parallel with the shaft of the motor 214. In some embodiments, the compartment 405 is a separate assembly component that is isolated from the handle 204. In some embodiments, the compartment 405 may include damping features (e.g., see FIGS. 5B and 5C) to reduce vibration experienced by one or more components located within the compartment 405 (e.g., the printed circuit board 605 and/or the insertable wireless communication device 610 described below).

Figure 5A:
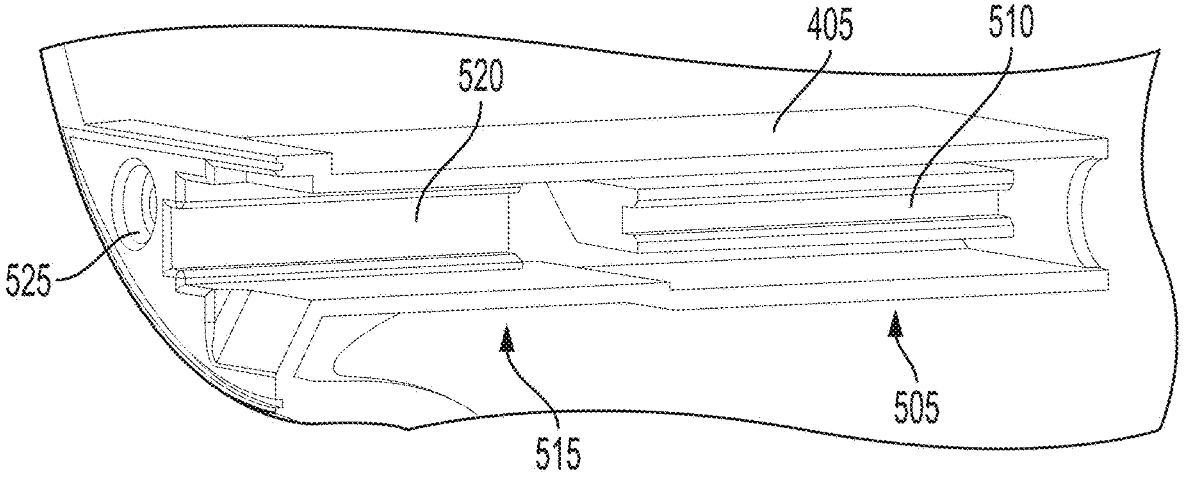
FIG. 5A is a perspective view of a portion of an insertable wireless communication device compartment included in the main body of the power tool device of FIG. 3 with one part of a clamshell housing of the power tool device of FIG. 3 removed according to one example embodiment.

FIG. 5A is a perspective view of a portion the compartment 405 with one part of a clamshell housing of the power tool 104 removed. As shown in FIG. 5A, in some embodiments, the compartment 405 includes an inner portion 505 that includes a mounting portion 510 configured to hold a first printed circuit board (PCB) 605 (see FIG. 6). For example, as illustrated, the mounting portion 510 includes a channel to receive and secure the PCB 605. In some embodiments, the first PCB 605 (i.e., a host-side PCB) is configured to be installed in the compartment 405 at the time of manufacturing of the power tool 104 and is not configured to be removed from the power tool 104 without disassembling and/or damaging the power tool 104. In other words, in some embodiments, the first PCB 605 is configured to be a non-removable/permanent PCB. The compartment 405 may also include an outer portion 515 configured to receive an insertable wireless communication device 610 (see FIG. 6) that may be optionally added to the power tool 104 as an accessory after manufacturing of the power tool 104 (e.g., to provide or enhance communication capabilities of the power tool 104). The outer portion 515 may include an indent 520 on each side wall of the compartment 405. The indent 520 on each side wall of the outer portion 515 of the compartment 405 may be configured to receive alignment rails 620 of the insertable wireless communication device 610 (see FIG. 6) as the insertable wireless communication device 610 is inserted into the compartment 405. FIG. 5A also illustrates a fastener receiving hole 525 configured to receive a fastener 705 (see FIG. 7) to secure the cover 410 to a rear side of the main body 202 to seal the compartment 405 from debris.

Figure 19:
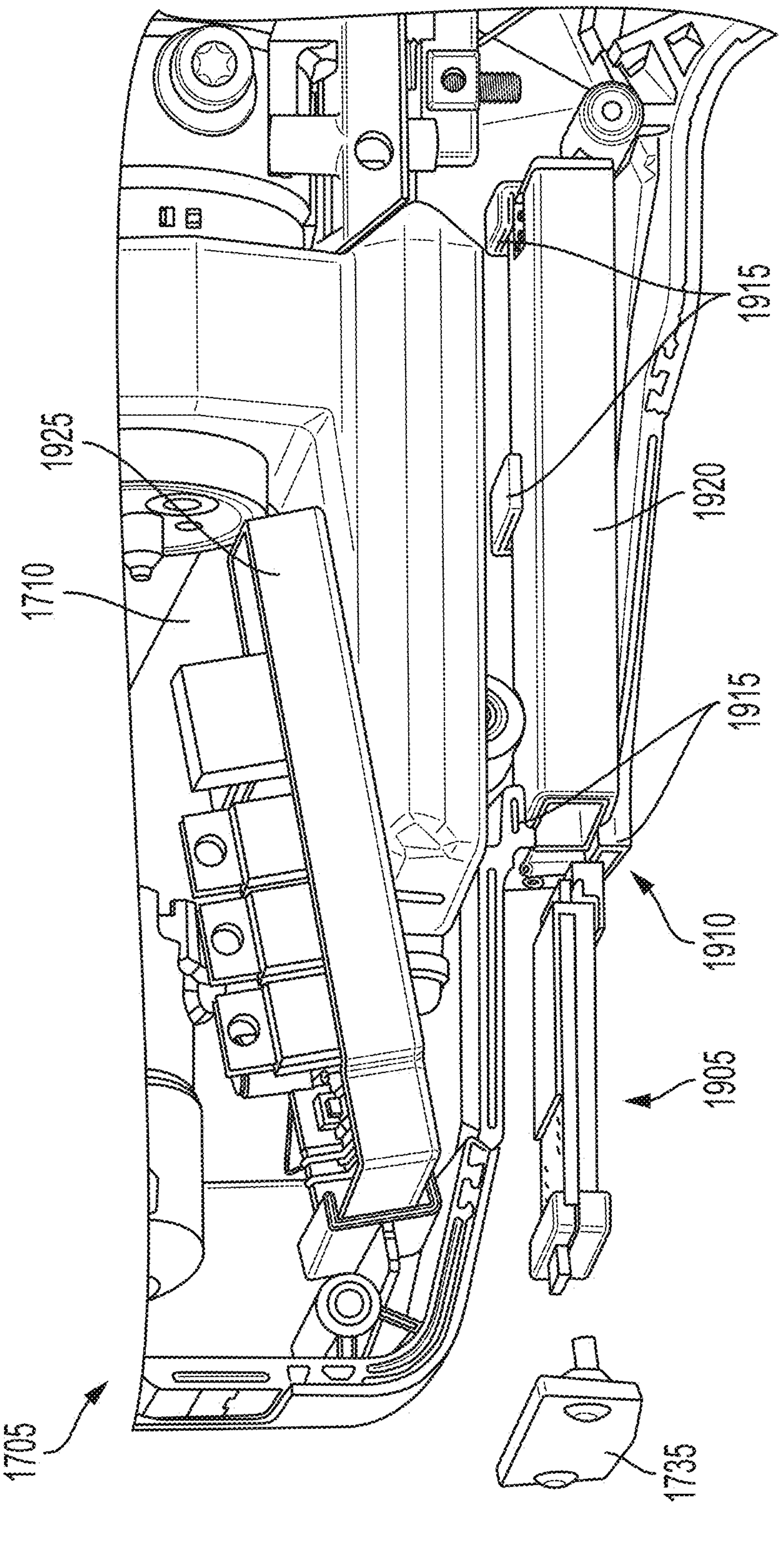
FIG. 19 is a perspective cut-away view of a portion of a main body of the power tool device of FIG. 17 that includes a compartment configured to receive an insertable wireless communication device according to one embodiment.
Figure 20A:
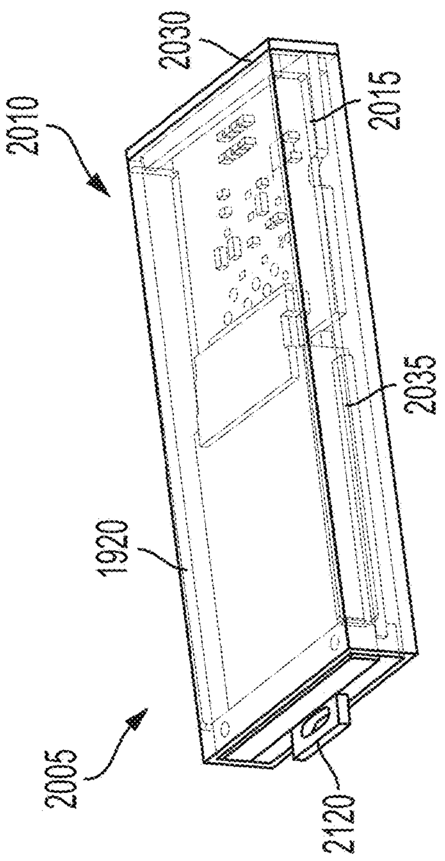
FIGS. 20A through 20D illustrate different views of an enclosure located within the compartment of FIG. 19 and configured to hold the insertable wireless communication device of FIG. 19 according to one embodiment.
Figure 20B:
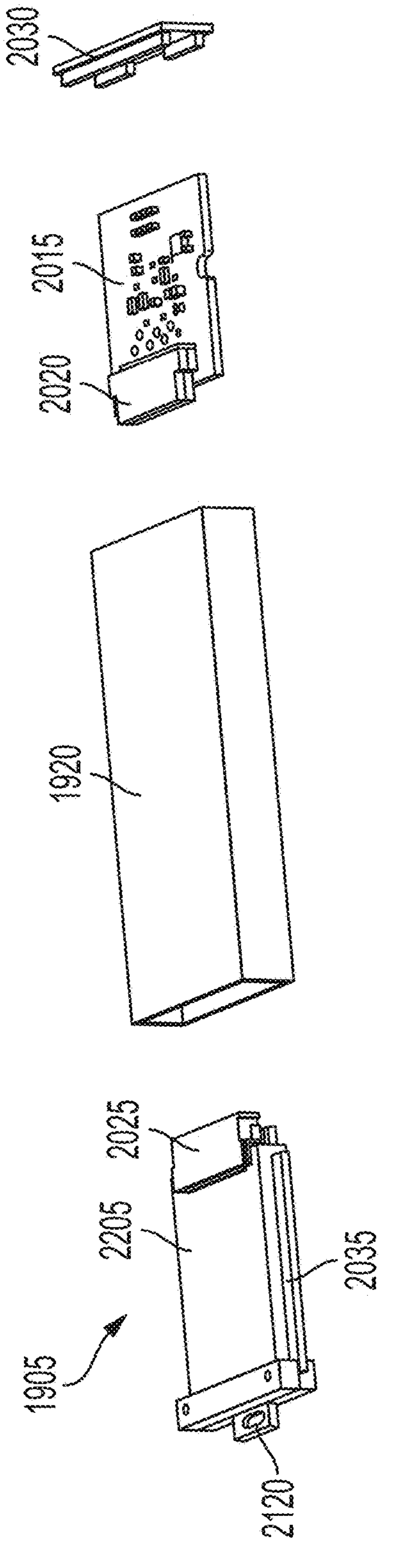
Figure 20C:
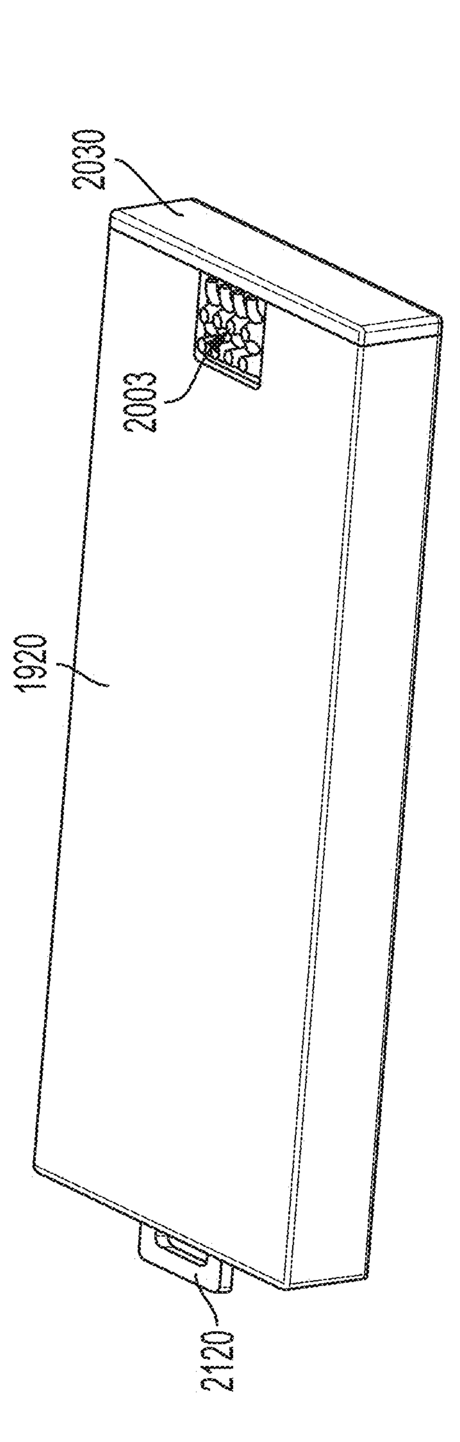
Figure 20D:
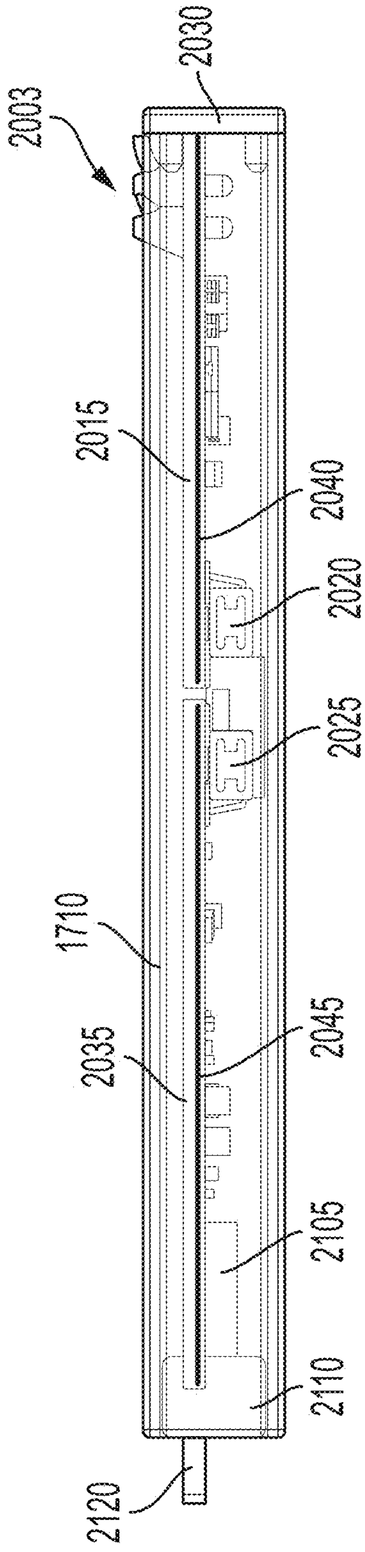

While FIG. 5A shows the compartment 405 being formed by parts of the housing of the power tool 104 (e.g., two clamshell housing portions of the power tool 104), in some embodiments, the compartment 405 is a separate assembly component that is located within the housing of the power tool 104 (e.g., a separate enclosure 1920 as shown in FIGS. 19-20D). For example, FIGS. 5B and 5C are perspective views of a separate assembly enclosure 550 that may be located in the housing of the power tool 104 in the same general location(s) as shown and described above with respect to the compartment 405.

Figure 5B:
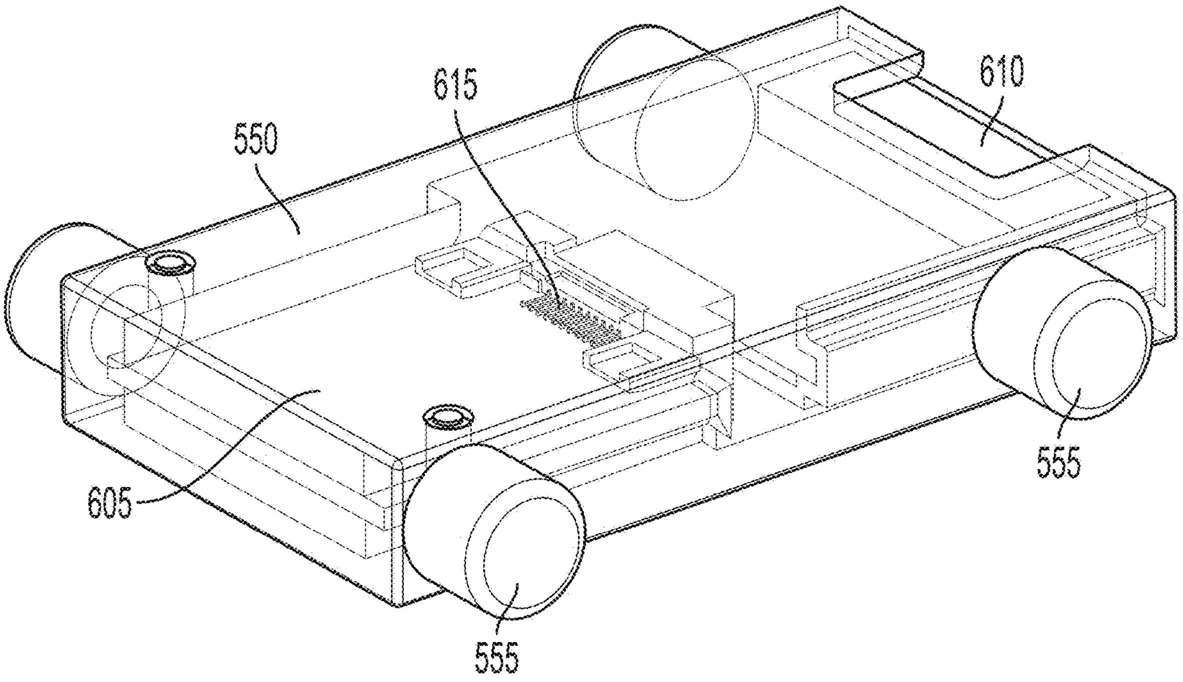
FIGS. 5B and 5C are perspective views of a separate assembly compartment that may be located in the housing of the power tool device of FIG. 3 in the same general location as the insertable wireless communication device compartment of FIG. 5A according to example embodiments.

In FIG. 5B, the separate assembly enclosure 550 is shown as being transparent to allow the first PCB 605 and the insertable wireless communication device 610 to be visible. As shown in FIG. 5B, an outer surface of the separate assembly enclosure 550 may include damping members 555 (e.g., rubber bumpers, springs, etc.) to absorb vibrations between the separate assembly enclosure 550 and the housing of the power tool 104 during operation of the power tool 104. The damping members 555 may limit the amount of vibration experienced by the first PCB 605 and the insertable wireless communication device 610 during operation of the power tool 104. While two damping members 555 are shown on each side of the separate assembly enclosure 550 in FIG. 5B, in other embodiments, the separate assembly enclosure 550 may include more or fewer damping members 555 and/or may include damping members 555 in different locations on the surface of the separate assembly enclosure 550 besides the locations shown in FIG. 5B.

Figure 5C:
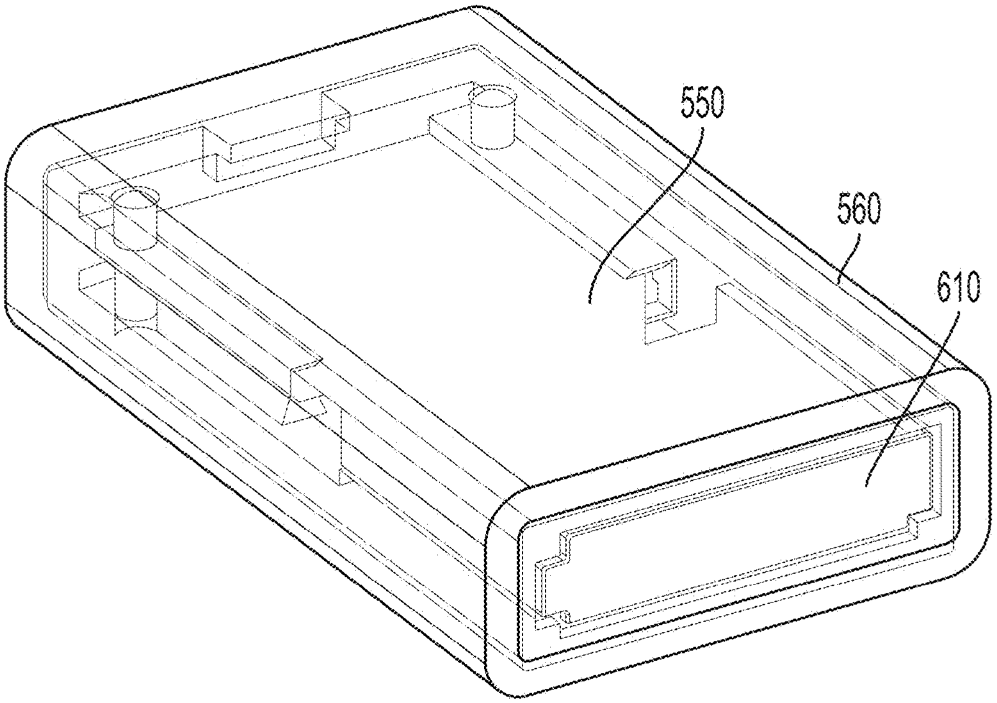

In FIG. 5C, the separate assembly enclosure 550 is shown with a damping encasement 560 (e.g., of rubber) covering a surface of the separate assembly enclosure 550. Although not shown in FIG. 5C, the separate assembly enclosure 550 may also still include one or more damping members 555. The damping encasement 560 may serve to further limit vibration experienced by the first PCB 605 and the insertable wireless communication device 610.

Figure 6:
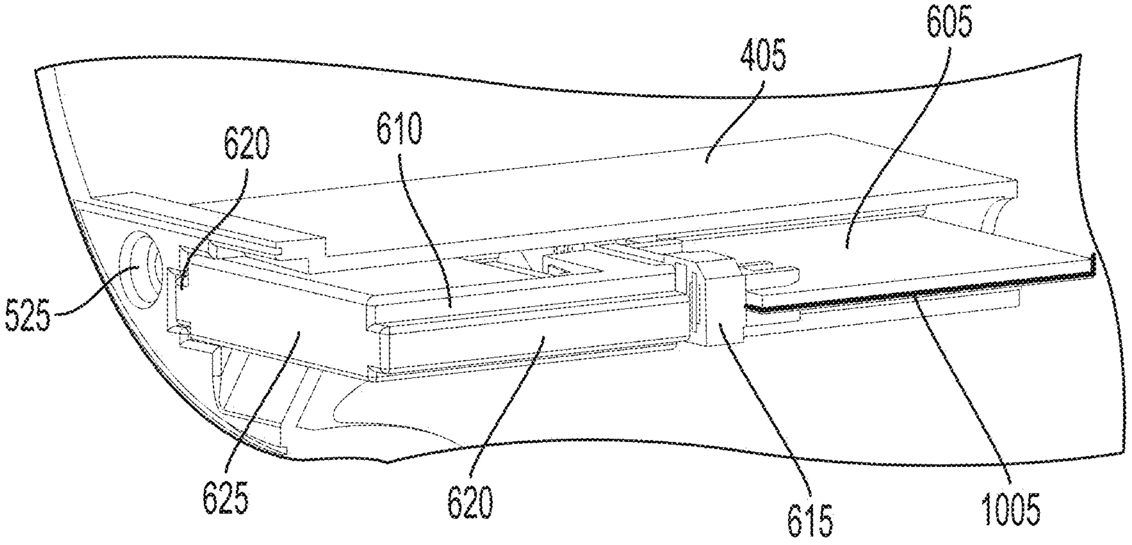
FIG. 6 is a perspective view similar to the perspective view of FIG. 5A but also including a first printed circuit board and an insertable wireless communication device in the compartment of FIG. 5A according to one example embodiment.

FIG. 6 is a perspective view similar to the perspective view of FIG. 5A but also including the first PCB 605 (i.e., a host-side PCB) and the insertable wireless communication device 610 (i.e., an insertable device). As shown in FIG. 6, the first PCB 605 is coupled (physically, electrically, or both) to a first connector 615 (i.e., a host-side connector). For example, the first connector 615 may include contacts electrically coupled to conductive traces of the first PCB 605, and physically secured to an end of the PCB 605 facing the outer portion 515 of the compartment 405. The first connector 615 may receive a second connector 905 (i.e., an insertable device connector) of the insertable wireless communication device 610 (see FIG. 9) when the insertable wireless communication device 610 is inserted into the compartment 405. The insertable wireless communication device 610 includes an external housing 910 with an exterior wall 625 (i.e., an outermost wall when the insertable wireless communication device 610 is inserted into the compartment 405).

Figure 7:
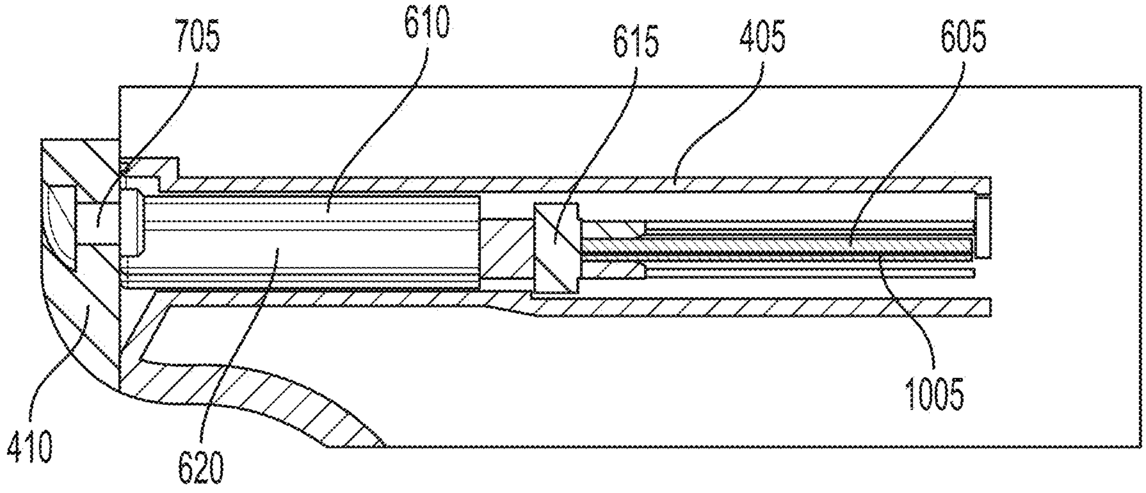
FIG. 7 is a side cut-away view of the compartment of FIG. 5A with the insertable wireless communication device inserted into the compartment according to one example embodiment.
Figure 8:
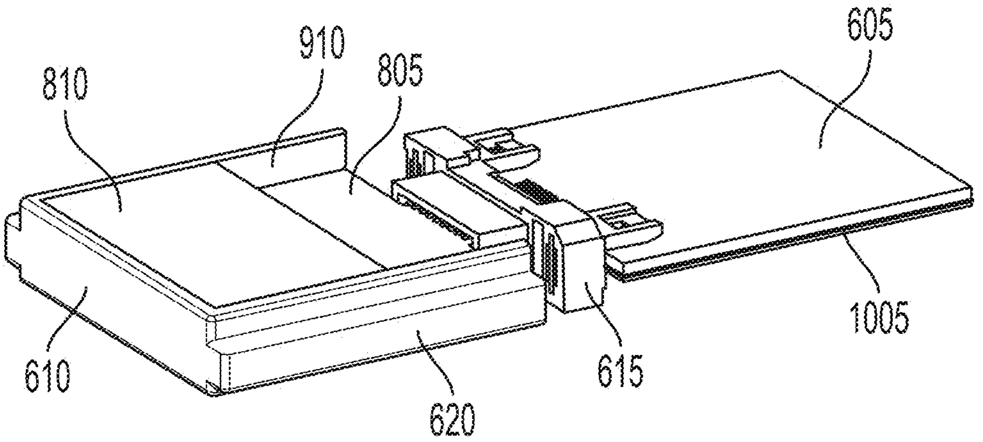
FIG. 8 is a perspective view of the insertable wireless communication device of FIG. 6 electrically and physically coupled to the first printed circuit board of FIG. 6 according to one example embodiment.
Figure 9:
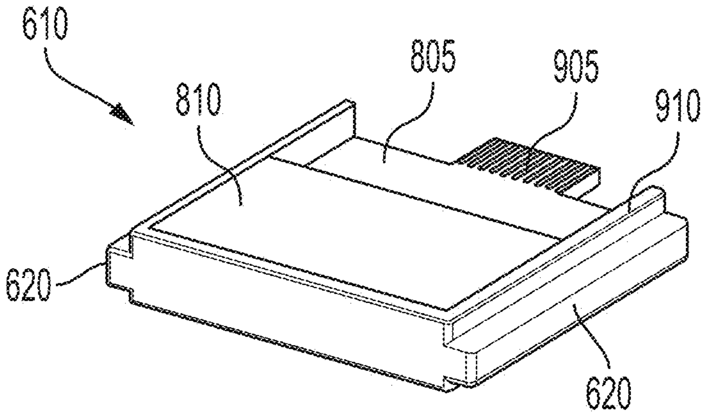
FIG. 9 is a perspective view of the insertable wireless communication device of FIG. 6 decoupled from the first printed circuit board of FIG. 6 according to one example embodiment.

FIG. 7 is a side cut-away view of the compartment 405 with the insertable wireless communication device 610 inserted into the compartment 405. FIG. 7 also shows the compartment 405 covered by the cover 410. As shown in FIG. 7, the cover 410 may be secured with one or more fasteners 705 to the rear side of the main body 202 to seal the compartment 405 from debris from outside of the compartment 405. Also as shown in FIG. 7, the first PCB 605 and the insertable wireless communication device 610 extend in approximately the same plane. Thus, the first PCB 605 and the second PCB 805 (which is included in a housing 910 of the insertable wireless communication device as shown in FIGS. 8 and 9) extend in approximately the same plane and top and bottom surfaces of the PCBs 605 and 805 extend parallel to each other. In such a configuration, a conductive layer 1005 of the first PCB 605 (see FIG. 10) extend in approximately the same plane as and extend parallel to a conductive layer of the second PCB 805. As explained in greater detail below, such a configuration allows one or both of the PCBs 605 and 805 to serve individually or in combination as a ground plane of an antenna (e.g., antenna 1315 shown in FIGS. 13 and 14A) included on the insertable wireless communication device 610.

FIG. 8 is a perspective view of the insertable wireless communication device 610 electrically and physically coupled to the first PCB 605. As shown in FIG. 8, the insertable wireless communication device 610 includes a second PCB 805 (i.e., an insertable device PCB) within the housing 910 of the insertable wireless communication device 610. In some embodiments, an antenna area 810 of the second PCB 805 is reserved for an antenna (e.g., antenna 1315 shown in FIGS. 13 and 14A such as a chip antenna).

FIG. 9 is a perspective view of the insertable wireless communication device 610 decoupled from the first PCB 605. As shown in FIG. 9, the second PCB 805 of the insertable wireless communication device 610 includes a second connector 905 (i.e., an insertable device connector) configured to electrically and physically couple to the first connector 615 of the first PCB 605.

Figure 10:
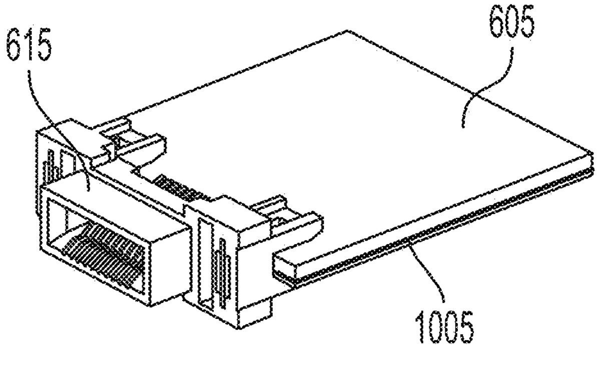
FIG. 10 is a perspective view of the first printed circuit board of FIG. 6 and a first connector according to one example embodiment.

FIG. 10 is a perspective view of the first PCB 605 and the first connector 615. As shown in FIG. 10, the first PCB 605 may include a conductive layer 1005 (e.g., a layer of copper) that extends throughout a surface area of the first PCB 605. In some embodiments, the first PCB 605 may have multiple such conductive layers sandwiched between the top and bottom surfaces of the first PCB 605. Additionally, in some embodiments, the second PCB 805 of the insertable wireless communication device 610 may include one or more conductive layers similar to the conductive layer 1005 of the first PCB 605. Although the first connector 615 and the second connector 905 are illustrated as female and male connectors, respectively, in some embodiments, the first connector 615 is a male connector and the second connector 905 is a female connector, or other types of connectors are used. In some embodiments, the connectors 615 and 905 may not be included. In such embodiments, a component of the first PCB 605 may be configured to wirelessly communicate with a component of the second PCB 805 when the insertable wireless communication device 610 is inserted into the compartment 405. For example, such wireless communication may occur via transceivers/antennas configured to communicate via Bluetooth®, near-filed communication, and/or the like.

As mentioned previously herein, the compartment 405 allows the insertable wireless communication device 610 to be optionally added to the power tool device 104 as an accessory after manufacturing of the power tool device 104. When the insertable wireless communication device 610 is inserted into the compartment 405, the power tool device 104 may wirelessly communicate with other devices such as the external device 108 and/or the server 112. In some embodiments, the power tool device 104 may not be able to communicate (e.g., wirelessly) with other devices unless the insertable wireless communication device 610 is inserted into the compartment 405. In other embodiments, the power tool device 104 may be configured to wirelessly communicate with other devices using a first communication protocol (e.g., a short-range radio communication such as Bluetooth®) when the insertable wireless communication device 610 is not inserted into the compartment 405. In such embodiments, when inserted into the compartment 405, the insertable wireless communication device 610 may additionally or alternatively allow the power tool device 104 to communicate wirelessly with other devices using a second communication protocol different than the first communication protocol (e.g., long-range radio communication such as cellular communication over a cellular network). Accordingly, the insertable wireless communication device 610 is configured to expand the communication capabilities of the power tool device 104.

Figure 17:
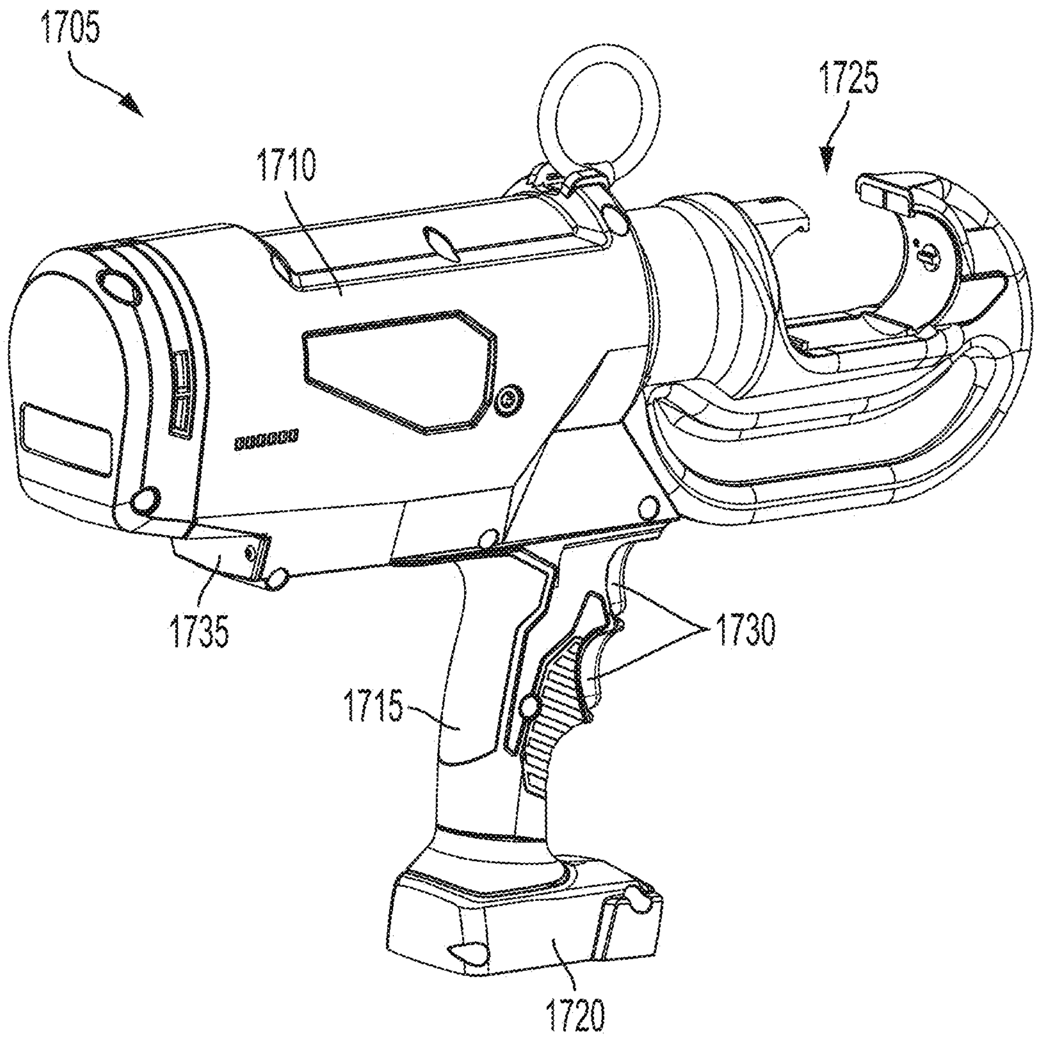
FIG. 17 illustrates another host device (e.g., another power tool device) of the communication system of FIG. 1 according to one example embodiment.

FIGS. 17-23 illustrate another embodiment of an insertable wireless communication device and a compartment of a host device configured to receive the insertable wireless communication device. As shown in FIG. 17, a power tool 1705 (i.e., a host device) includes many of the same components as the power tool 104 of FIG. 3. The explanation herein of the components of the power tool 104 of FIG. 3 applies to the similarly-named components of the power tool 1705 except for the differences explained below. An insertable wireless communication device 1905 includes many of the same components as the insertable wireless communication device 610. The explanation herein of the components of the insertable wireless communication device 610 also applies to the similarly-named components of the insertable wireless communication device 1905 except for the differences explained below. Although the power tool 1705 illustrated in FIG. 17 is crimper, embodiments explained herein similarly apply to and can be used in conjunction with a variety of power tool devices 104 and transmitting devices 106 (i.e., host devices) including power tools and/or accessories in a similar manner as explained above with respect to the power tool 104 of FIG. 3.

As shown in FIG. 17, the crimper 1705 includes a main body 1710 (i.e., a motor housing portion), a handle portion 1715, a battery pack receiving portion 1720, an output drive device or mechanism 1725, and one or more triggers 1730 (or other actuator). Although not shown in FIG. 17, the crimper 1705 may include a selection switch similar to the selection switch 208 of the power tool 104 as explained above. The crimper 1705 further includes a motor 214 (see FIG. 11) within the main body 1710 of the housing and having a rotor 280 and a stator 285 (see FIG. 11). The housing of the crimper 1705 (e.g., the main body 1710, the handle 1715, and the battery pack receiving portion 1720) are composed of a durable and light-weight plastic material. The drive device 1725 on the crimper 1705 is a set of crimping jaws. However, different power tool devices may have different drive devices specifically designed for the task associated with the power tool device as explained previously herein. As shown in FIG. 17, the crimper 1705 includes a cover 1735 configured to cover a compartment 1910 configured to receive the insertable wireless communication device 1905 as explained in greater detail below (see FIG. 19).

Figure 18:
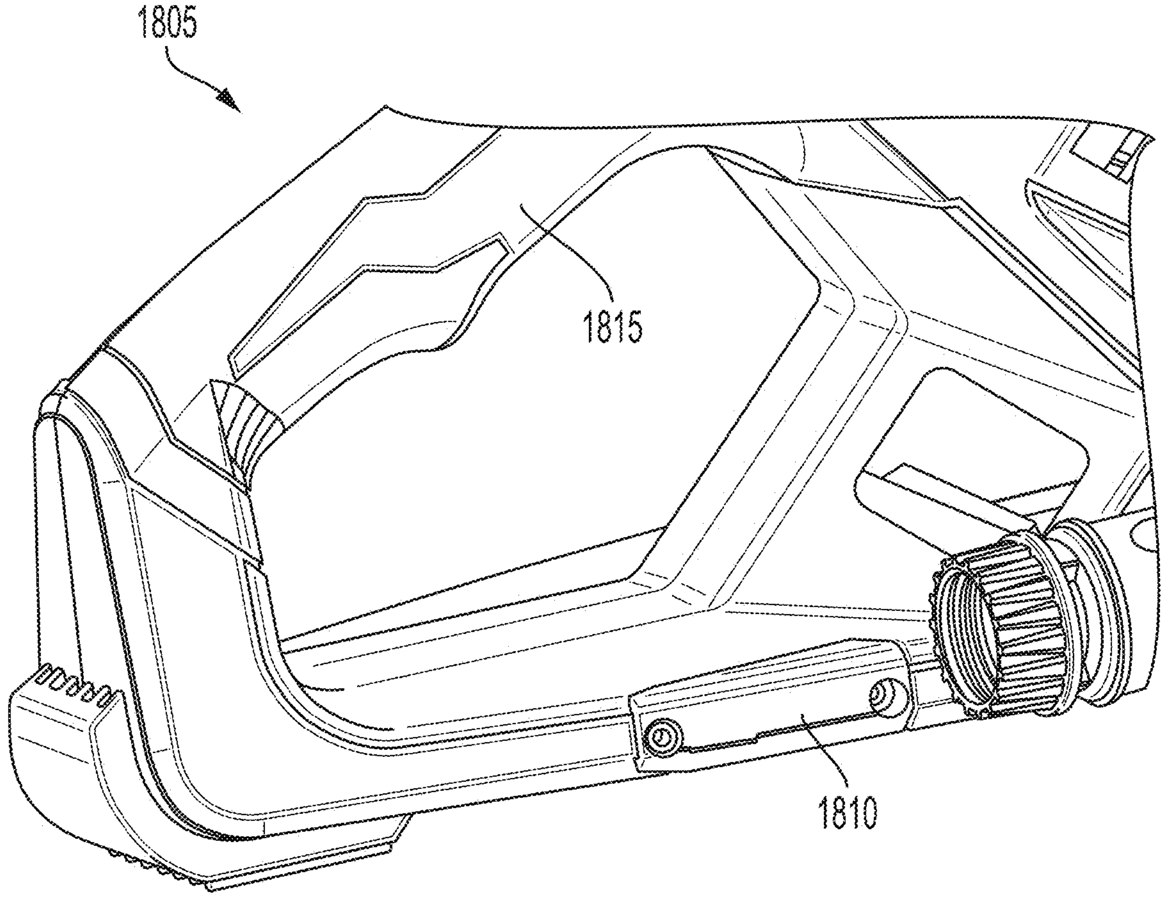
FIG. 18 illustrates yet another host device (e.g., yet another power tool device) of the communication system of FIG. 1 according to one example embodiment.

FIG. 18 illustrates another host device 1805 (e.g., a power tool) including a cover 1810 configured to cover a compartment 1910 configured to receive the insertable wireless communication device 1905. As shown in FIG. 18, the power tool 1805 is a different type of power tool than the power tool 104 of FIG. 3 and the power tool 1705 of FIG. 17 and includes the compartment 1910 and cover 1810 in a different location than the power tools 104 and 1705 (e.g., on a side of a base portion of the power tool 1805 that is connected to a handle portion 1815 and a main body portion (not shown) of the power tool 1805.

FIG. 19 is a perspective cut-away view of a portion of the main body 1710 of the crimper 1705 that includes a compartment 1910 configured to receive an insertable wireless communication device 1905 (i.e., an insertable device). As shown in FIG. 19, a housing of the main body 1710 includes various mounting portions 1915 configured to hold an enclosure 1920 within the compartment 1910. While the compartment 1910 is located at a lower portion of the main body 1710 in the crimper 1705 (e.g., on a plane above the handle 1715 and underneath a motor or underneath a power/FET PCB that is located in a potting boat 1925 in the main body 1710), in other embodiments or in other host devices, the compartment 1910 may be located in other locations as explained previously herein (e.g., see FIG. 18).

FIGS. 20A through 20D illustrate different views of the enclosure 1920. FIG. 20A is a bottom perspective view of the enclosure 1920 with the walls of the enclosure 1920 shown as being transparent to allow the components housed inside the enclosure 1920 to be visible. FIG. 20B is a bottom perspective exploded view of the enclosure 1920 and the components housed inside the enclosure 1920. FIG. 20C is a top perspective view of the enclosure 1920 in which the enclosure includes a wire opening 2003. FIG. 20D is a side profile view of the enclosure 1920 with the walls of the enclosure 1920 shown as being transparent to allow the components housed inside the enclosure 1920 to be visible.

As shown in FIGS. 20A, 20C, and 20D, the insertable wireless communication device 1905 is inserted into the enclosure 1920.

An external end 2005 of the enclosure 1920 is configured to receive the insertable wireless communication device 1905 when the enclosure 1920 is installed in the crimper 1705. An internal end 2010 of the enclosure 1920 that is opposite to the external end 2005 is configured to receive a host-side PCB 2015 during manufacturing of the crimper 1705. The host-side PCB 2015 is similar to the first PCB 605 of the power tool 104 described previously herein. The details described previously herein with respect to the first PCB 605 also apply to the host-side PCB 2015. For example, the host-side PCB 2015 includes a host-side connector 2020 (similar to the first connector 615 of the first PCB 605) configured to couple (physically, electrically, or both) to an insertable device connector 2025 of the insertable wireless communication device 1905 (similar to the second connector 905 of the insertable wireless communication device 610). In some embodiments, the connectors 2020 and 2025 may not be included and a component of the host-side PCB 2015 may be configured to wirelessly communicate with the insertable wireless communication device 1905 when the insertable wireless communication device 1905 is inserted in the enclosure 1920. After the host-side PCB 2015 is installed in the enclosure 1920, the internal end 2010 of the enclosure 1920 is sealed by a wire cap 2030. The wire cap 2030 may prevent debris from inside the housing of the crimper 1705 from entering the enclosure 1920. In some embodiments, the enclosure 1920 includes mounting portions similar to the mounting portions 510 of FIG. 5A. The enclosure 1920 may include mounting portions that include channels that are configured to hold the host-side PCB 2015 and/or an insertable device PCB 2035 of the insertable wireless communication device 1905.

The wire opening 2003 shown in FIG. 20C allows wires to exit the enclosure 1920 and be connected to other electrical components inside the housing of the crimper 1705 (e.g., an electronic processor 226 configured to control the motor 214 of the crimper 1705, a power source such as a power tool battery pack or an energy storage device including a coin cell, and the like). In some embodiments, the wire opening 2003 is smaller than an opening in the internal end 2010 of the enclosure 1920. Accordingly, wires connected to the host-side PCB 2015 may be routed through the wire opening 2003 rather than being routed out of the opening in the internal end 2010. The opening in the internal end 2010 may instead be sealed with the wire cap 2030 to increase ingress fluid prevention compared to having the wires extend through the opening in the internal end 2010 of the enclosure. In some embodiments, having the wires routed out of the wire opening 2003 saves space within the crimper 1705 because the enclosure assembly is shorter in length than when the wires are routed out of the opening in the internal end 2010 of the enclosure 1920. Nevertheless, in some embodiments, one or more wires may be routed out of the opening in the internal end 2010 of the enclosure 1920.

As shown in FIG. 20D, the host-side PCB 2015 and the insertable device PCB 2035 extend in approximately the same plane similar to the first PCB 605 and the second PCB 805 of the power tool 104 as explained previously herein (see FIG. 7). In such a configuration, a conductive layer 2040 of the host-side PCB 2015 may extend in approximately the same plane as and extend parallel to a conductive layer 2045 of the insertable device PCB 2035. As explained in greater detail below, such a configuration allows one or both of the PCBs 2015 and 2035 to serve individually or in combination as a ground plane of an antenna (e.g., antenna 1315 that includes chip antenna/conductor 2105 shown in FIGS. 20D, 21, and 23) included on the insertable wireless communication device 1905.

Figure 20E:
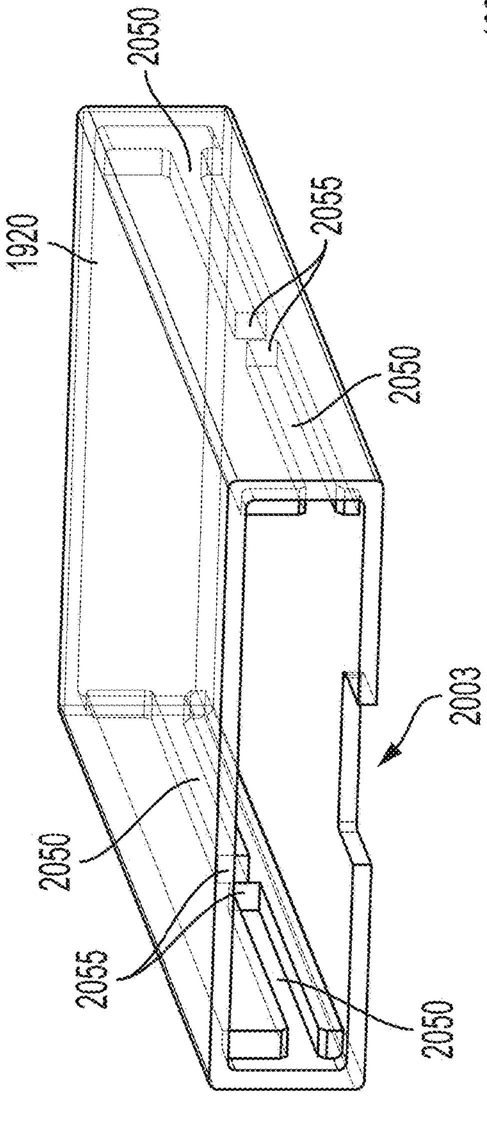
FIGS. 20E and 20F illustrate different bottom perspective views of the enclosure of FIGS. 20A through 20D according to one embodiment.
Figure 20F:
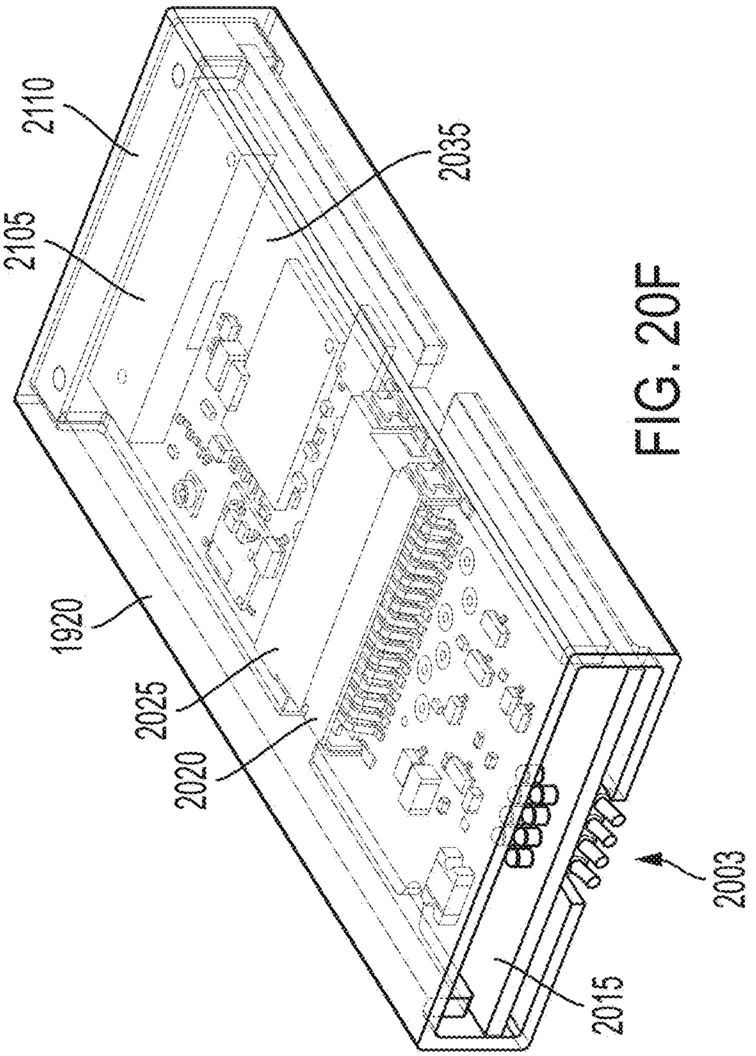

FIGS. 20E and 20F illustrate different bottom perspective views of the enclosure 1920 according to one embodiment. In FIGS. 20E and 20F, the walls of the enclosure 1920 are shown as being transparent to allow the internal features of the enclosure 1920 explained below to be visible. As shown in FIGS. 20E and 20F, the enclosure 1920 may include one or more channels 2050 located on side walls of the enclosure 1920 and configured to receive and guide edges of the PCBs 2015 and 2035. The channels 2050 may include end walls 2055 that prevent the host-side PCB 2015 from being over-inserted into the enclosure 1920 during manufacturing and/or to prevent the insertable wireless communication device 1905 from being over-inserted into the enclosure 1920 by a user.

Figure 21:
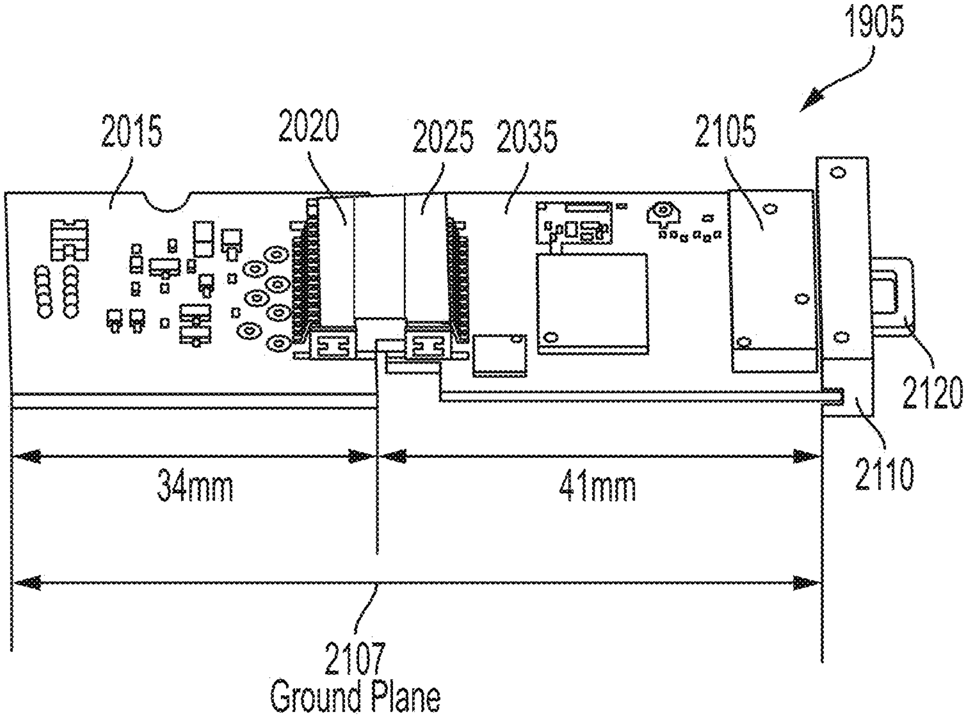
FIG. 21 is a bottom perspective view of the insertable wireless communication device of FIG. 19 electrically and physically coupled to a host-side PCB of the power tool device of FIG. 17 according to one embodiment.
Figure 22:
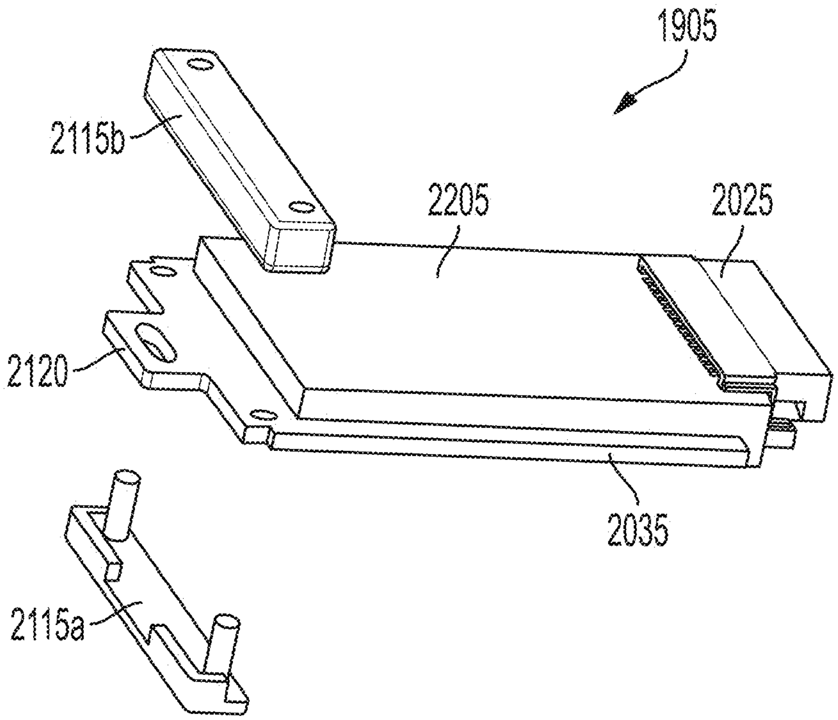
FIG. 22 is a partially exploded bottom perspective view of the insertable wireless communication device of FIG. 19 according to one example embodiment.

FIG. 21 is a bottom perspective view of the insertable wireless communication device 1905 electrically and physically coupled to the host-side PCB 2015. FIG. 22 is a partially exploded bottom perspective view of the insertable wireless communication device 1905 according to one example embodiment. In some embodiments, the insertable device PCB 2035 includes a chip antenna 2105 (i.e., a conductor portion of an antenna 1315) located near the external end 2005 of the enclosure 1920 when the insertable wireless communication device 1905 is inserted into the enclosure 1920. As shown in FIG. 21, the insertable device PCB 2035 includes other electronic components as well. For example, the insertable device PCB 2035 may include a Bluetooth® transceiver/controller, other electronic processors/integrated circuits configured to allow for wireless communication via the antenna 1315 or another antenna, and the like as shown in FIGS. 14A-14J. Although FIG. 21 illustrates components mounted on bottom surfaces of the PCBs 2015 and 2035, in some embodiments, components may be additionally or alternatively mounted on top surfaces of the PCBs 2015 and 2035.

FIG. 21 includes labels for example dimensions of a ground plane 2107 of the antenna 1315. For example, the host-side PCB 2015 may be approximately thirty-four millimeters long and a conductive layer 2040 of the host-side PCB 2015 may form a portion of the ground plane 2107 for the antenna 1315. Similarly, approximately forty-one millimeters of a conductive layer 2045 of the insertable device PCB 2035 may be used to form the remainder of the ground plane 2107 for the antenna 1315. In some embodiments, the insertable device PCB 2035 is longer than approximately forty-one millimeters and a portion of the insertable device PCB 2035 (e.g., a portion proximate the external end 2005 of the enclosure 1920) is not used as a portion of the ground plane 2107 for the antenna 1315.

In some embodiments, the insertable wireless communication device 1905 includes an end cap 2110 located near the external end 2005 of the enclosure 1920 when the insertable wireless communication device 1905 is inserted into the enclosure 1920. In some embodiments, when the insertable wireless communication device 1905 has been inserted into the enclosure 1920, an outer surface of the end cap 2110 is located approximately flush to an opening in the enclosure 1920 where the insertable wireless communication device 1905 is received (see FIG. 20D). In some embodiments, the end cap 2110 is located proximate to the chip antenna 2105 to protect the chip antenna 2105 in situations where the insertable wireless communication device 1905 is dropped, for example, by a user. As shown in FIGS. 20D and 21, a height of the end cap 2110 in a direction perpendicular to a surface of the insertable device PCB 2035 is taller than a height of the chip antenna 2105 in the direction perpendicular to the surface of the insertable device PCB 2035. Similarly, a height of the connector 2025 in the direction perpendicular to the surface of the insertable device PCB 2035 is taller than a height of the chip antenna 2105 in the direction perpendicular to the surface of the insertable device PCB 2035. Accordingly, if the insertable wireless communication device 1905 is dropped by a user, the chip antenna 2105 should not directly impact an approximately flat surface (e.g., a floor) on which the insertable device 1905 lands regardless of the orientation of the insertable device 1905 upon impact with the flat surface. Rather, one of the top side of the insertable device PCB 2035, the sides/edges of the insertable device PCB 2035, the connector 2025, or the end cap 2110 will impact the flat surface if the insertable wireless communication device 1905 is dropped.

As shown in FIG. 22, the end cap 2110 may include an upper portion 2115*a* and a lower portion 2115*b* that are configured to couple to each other through holes in the insertable device PCB 2035 to form the end cap 2110. In some embodiments, the height of the end cap 2110 is designed to provide an amount of spacing between the insertable device PCB 2035 and other components of the crimper 1705. In other words, the end cap 2110 may be sized such that the height of the end cap 2110 provides a minimum required amount of space (e.g., five millimeters) between the insertable device PCB 2035 and poles of a power tool battery pack connected to the crimper 1705, for example. The end cap 2110 may also allow a user to grab the insertable wireless communication device 1905 more easily (for example, when inserting or removing the insertable device 1905) than if the end cap 2110 were not present. The end cap 2110 may also prevent a user from pinching or inserting, for example, a finger or other object in the compartment 1910 when inserting or removing the insertable device 1905.

In some embodiments, the insertable device PCB 2035 includes a protruding tab 2120 configured to extend through the end cap 2110. In some embodiments, the protruding tab 2120 is configured to extend out of the enclosure 1920 (see FIGS. 20A, 20C, and 20D). The protruding tab 2120 may be configured to be used to remove the insertable wireless communication device 1905 from the enclosure 1920. While the protruding tab 2120 has a generally rectangular shape in FIG. 22, in some embodiments, the protruding tab 2120 has rounded corners or is rounded to be in the shape of a partial-circle or partial-oval. In some embodiments, the edges of the protruding tab 2120 are chamfered. In some embodiments, ribbon, tape, or rope (e.g., a nylon rope) is connected to the protruding tab 2120 to be grasped and pulled by a user to remove the insertable wireless communication device 1905 from the enclosure 1920.

As shown in FIGS. 19, 20B, and 22, some portions of the insertable device PCB 2035 may include low pressure molding 2205 (e.g., a plastic molding) over at least some components mounted on the insertable device PCB 2035. For example, the low pressure molding 2205 may be located over all components on the bottom surface of the insertable device PCB 2035. The low pressure molding may wrap around to a top surface of the insertable device PCB 2035 and cover less area or less components of the top surface of the insertable device PCB 2035 than on the bottom surface of the insertable device PCB 2035 (see FIG. 19). As shown in FIGS. 19, 20B, and 22, the low pressure molding 2205 may not fully enclose the insertable device PCB 2035. For example, side edges of the insertable device PCB 2035 may remain exposed and may protrude from the low pressure molding 2205. In some embodiments, these side edges of the insertable device PCB 2035 engage with mounting portions (e.g., channels) of the enclosure 1920 when the insertable wireless communication device 1905 is inserted into the enclosure 1920. In some embodiments, the insertable wireless communication device 1905 may be referred to as a housingless insertable device 1905 because the insertable wireless communication device 1905 does not include an external housing configured to fully enclose the insertable device PCB 2035 when the insertable wireless communication device 1905 is not inserted into the enclosure 1920 (e.g., the side edges of the insertable device PCB 2035 are exposed). A housingless insertable device 1905 allows the insertable wireless communication device 1905 to be more compact than other insertable devices that include an external housing (e.g., insertable device 610 with external housing 910 as shown in FIGS. 6-9). Accordingly, the housingless insertable wireless communication device 1905 may take up less space in the host device 1705 into which it is configured to be inserted. In some embodiments, the low pressure molding 2205 may cover more or less components of the insertable device PCB 2035. In some embodiments, the low pressure molding 2205 may not be present.

Figure 23:
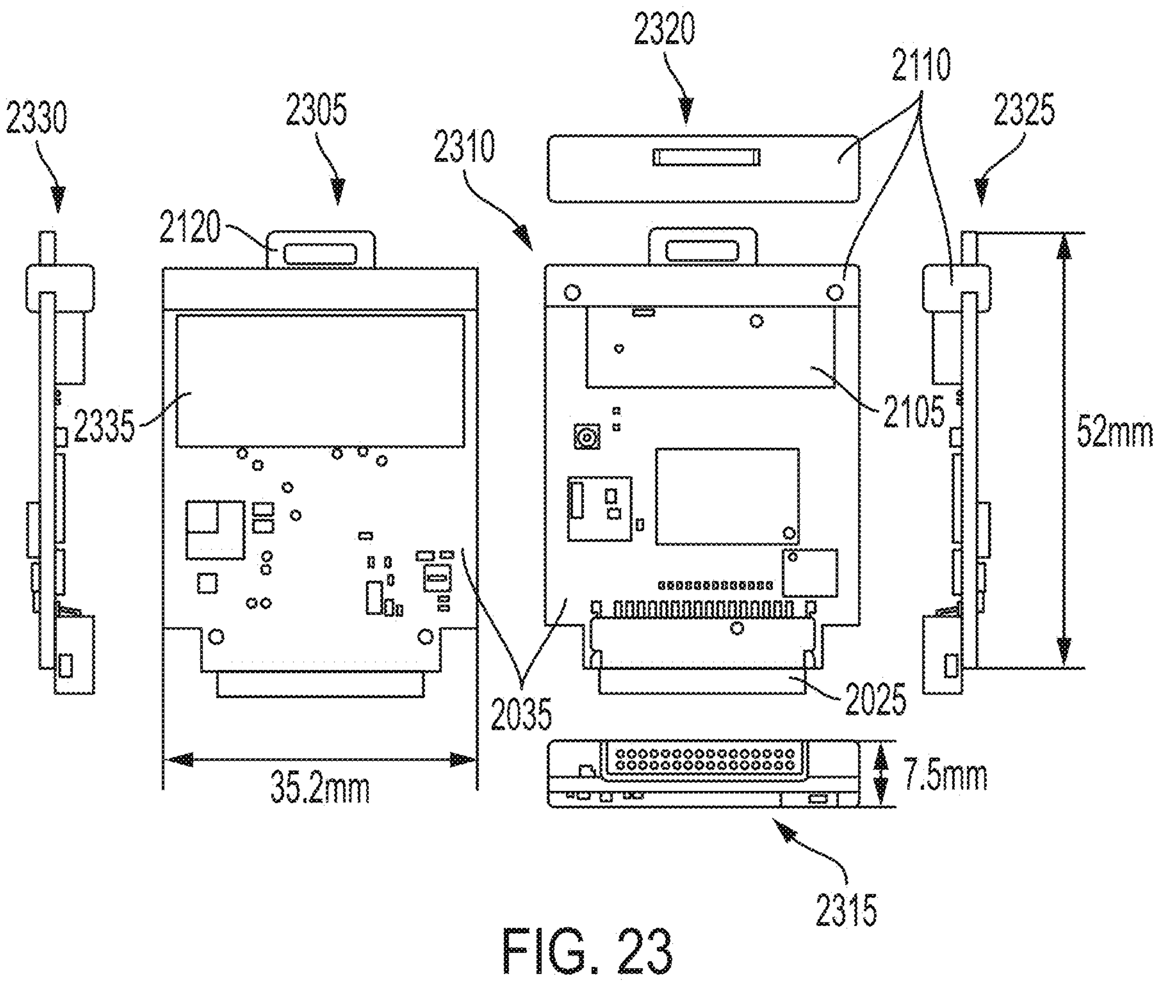
FIG. 23 illustrates multiple views of the insertable wireless communication device of FIG. 19 according to one example embodiment.

FIG. 23 illustrates multiple views of the insertable wireless communication device 1905 according to one example embodiment. In the embodiment shown in FIG. 23, the low pressure molding 2205 is not shown. FIG. 23 includes a top view 2305, a bottom view 2310, a front view 2315 (i.e., from the front of the crimper 1705 when the insertable wireless communication device 1905 is inserted into the compartment 1910), a rear view 2320 (i.e., from the rear of the crimper 1705 when the insertable wireless communication device 1905 is inserted into the compartment 1910), a right side view 2325 (i.e., the right side of the crimper 1705 when looking at the front of the crimper 1705 along a motor shaft), and a left side view 2330 (i.e., the left side of the crimper 1705 when looking at the front of the crimper 1705 along the motor shaft). As indicated by the dimensions in FIG. 23, in some embodiments, the insertable device PCB 2035 is approximately fifty two millimeters long including the protruding tab 2120 and an area where the connector 2025 is mounted. In some embodiments, the insertable device PCB 2035 is approximately 35.2 millimeters wide. In other embodiments, the insertable device PCB 2035 is approximately 49.4 millimeters long and 37.4 millimeters wide. As indicated in FIG. 23, in some embodiments, a height of the insertable wireless communication device 1905 is approximately 7.5 millimeters. In some embodiments, an area of a surface of the insertable device PCB 2035 opposite to the area where the chip antenna 2105 is mounted is a keep-out area 2335 where no electrical components are mounted to ensure proper functioning of the chip antenna 2105.

The locations and physical designs of the compartment 405, 1910 and the physical design of the insertable wireless communication device 610, 1905 as shown in FIGS. 4-7 and FIGS. 17-23 and as explained above are examples and may be different in other embodiments or on different host devices. For example, while the compartment 405, 1910 is shown located in the main body 202, 1710 underneath the motor 214 and above the handle 204, 1715, the compartment 405, 1910 may be located in other parts of the housing of the power tool 104, 1705. For example, the compartment 405, 1910 may be located in the handle 204, 1715, in or immediately above the battery pack receiving portion 206, 1720 (i.e., in the foot of the power tool 104, 1705), or in another part of the housing of the power tool 104, 1705. Additionally, the compartment 405, 1910 may be oriented in different manners than the orientation shown in FIGS. 4-7 and FIGS. 17 and 19 (e.g., see FIG. 18). For example, an opening of the compartment 405, 1910 may be located on a side wall of the main body 202, 1710 instead of on the rear wall of the main body 202, 1710. As indicated by the list of example power tool devices 104 provided previously herein, depending on the type of power tool device 104, the housing of the power tool device 104 may not include one or more of the main body 202, 1710, the handle 204, 1715, and the battery pack receiving portion 206, 1720. The compartment 405, 1910 may be located in any portion of the housing of the power tool device 104 and in any orientation such that the insertable wireless communication device 610, 1905 is able to properly function (e.g., communicate with the external device 108 and/or the server 112 via an antenna that meets a minimum antenna efficiency standard for the communication protocol being used to communicate) as explained in greater detail below.

In some embodiments, the insertable wireless communication device 610, 1905 is configured to be insertable into any one of a plurality of host devices (e.g., power tool devices 104 and transmitting devices 106) that each include the same compartment 405, 1910 and that may have the compartment 405, 1910 located in different portions of the housing and oriented differently in each host device. In other words, the physical designs of the insertable wireless communication device 610, 1905 and the compartment 405, 1910 may be universal across many different host devices while the location and orientation of the compartments 405, 1910 for at least some host devices may be different.

Figure 16C:
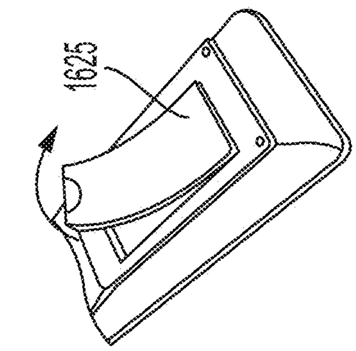
FIGS. 16A-16C illustrate three alternative embodiments of a cover configured to cover a compartment of the host device of FIG. 19 that receives the insertable wireless communication device of FIG. 19 according to one example embodiment.
Figure 16B:
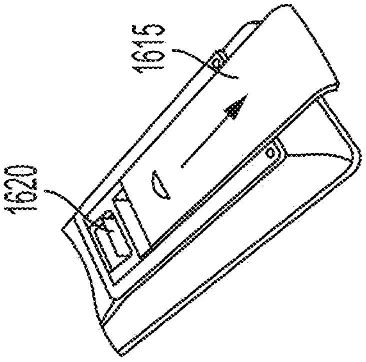
Figure 16A:
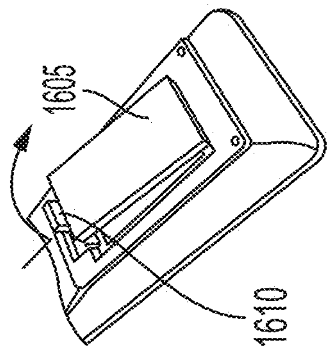

Although FIGS. 4-7 and FIGS. 17-19 show the cover 410, 1735, 1810 secured by the fasteners 705 to cover and seal the compartment 405, 1910, in some embodiments, the compartment 405, 1910 may not include the cover 410, 1735, 1810 and/or the fasteners 705. For example, the cover 410, 1735, 1810 may be fastened to the power tool 104, 1705, 1805 in other manners that do not include using the fasteners 705. For example, the cover 410, 1735, 1810 may be merely pressed into the compartment 405, 1910 and secured by friction between the cover 410, 1735, 1810 and the compartment 405, 1910. FIGS. 16A through 16C illustrate three alternative embodiments of the cover 410, 1735, 1810. FIG. 16A illustrates a squeeze, snap-fit cover 1605 including a securing tab 1610. FIG. 16B illustrates a slide, snap-fit cover 1615 including a securing tab 1620. FIG. 16C illustrates a hinged rubber press-fit cover 1625. As another example alternative embodiment, the power tool 104, 1705, 1805 may not include a cover for the compartment 405, 1910. Instead, the insertable wireless communication device 610, 1905 may be configured to be inserted into the compartment 405, 1910 so as to seal the compartment 405, 1910 and prevent debris from entering the compartment 405, 1910. In such embodiments, a rear side (i.e., an outer side) of the insertable wireless communication device 610, 1905 (i.e., the exterior wall 625 of the insertable device 610 or the end cap 2110 of the insertable device 1905) may be flush with the housing of the power tool 104, 1705. In some embodiments, the power tool 104, 1705, 1805 may be sold with a placeholder insertable device (that does not have any communication functionality) inserted in the compartment 405, 1910 to seal the compartment 405, 1910 from debris. At a later time, if the user desires to enhance the communication capabilities of the power tool 104, 1705, 1805, the user may remove the placeholder insertable device and insert the insertable wireless communication device 610, 1905 into the compartment 405, 1910.

Although FIGS. 4-7 show the first PCB 605 of the power tool 104 located inside the compartment 405 and FIGS. 20A-20D show the host-side PCB 2015 located inside the enclosure 1920, in some embodiments, the host-side PCBs 605, 2015 are located outside of the compartment 405 or the enclosure 1920 and adjacent to the compartment 405 or the enclosure 1920 and/or the insertable wireless communication device 610, 1905. For example, the compartment 405 or enclosure 1920 may be smaller than shown in FIGS. 4-7 and FIGS. 20A-20D such that the compartment 405 or enclosure 1920 is configured to include just the insertable wireless communication device 610, 1905 or just the insertable wireless communication device 610, 1905 and the host-side connector 615, 2020. In such alternative embodiments, the host-side PCB 605, 2015 may include the same general location and orientation with respect to the insertable wireless communication device 610, 1905 and the connector 615, 2020 as shown in FIGS. 4-7 and FIGS. 20A-20D (i.e., located in approximately the same plane as the insertable device PCB 805, 2035 with the top and bottom surfaces of the host-side PCB 605, 2015 and the insertable device PCB 805, 2035 extending parallel to each other). However, the host-side PCB 605, 2015 and/or the connector 615, 2020 of the host-side PCB 605, 2015 may be mounted and located outside of the compartment 405 or enclosure 1920.

Additionally, in some embodiments, the host-side PCB 605, 2015 and the insertable wireless communication device 610, 1905 may be positioned in a different orientation with respect to each other but may still serve as a combined/extended ground plane of an antenna of the insertable wireless communication device 610, 1905. For example, the host-side PCB 605, 2015 and the insertable device PCB 805, 2035 may be located parallel to each other but in different planes (as opposed to parallel and inline with each other as shown in FIGS. 7 and 20D. As another example, the host-side PCB 605, 2015 and the insertable device PCB 805, 2035 may be located parallel to each other in a side-by-side, inline orientation rather than the host-side PCB 605, 2015 being located in front of the insertable device PCB 805, 2035 as shown in FIGS. 4-7 and FIGS. 20A-21. As yet another example, instead of the host-side PCB 605, 2015 and the insertable device PCB 805, 2035 being located in approximately the same plane (i.e., inline with each other) with the top and bottom surfaces of the PCBs 605 and 805 extending parallel to each other, the host-side PCB 605, 2015 and the insertable device PCB 805, 2035 may be arranged perpendicularly to each other when the insertable wireless communication device 610, 1905 is inserted into the compartment 405, 1910. In other words, the compartment 405, 1910 and/or the host-side PCB 605, 2015 may be positioned differently such that the insertable wireless communication device 610, 1905 is arranged perpendicularly to the host-side PCB 605, 2015.

The compartment 405, 1910 and the enclosure 1920 described above are examples. In some embodiments, the insertable wireless communication device 610, 1905 is mounted differently within host devices. As shown in FIGS. 20A-20D, the insertable wireless communication device 1905 is housingless and is mounted within the enclosure 1920 that is located within the compartment 1910 shown in FIG. 19. The host-side PCB 2015 is also mounted in the enclosure 1920. In other embodiments, the insertable wireless communication device 1905 may include an external housing (e.g., housing 910 of the insertable wireless communication device 610 shown in FIG. 9). In some embodiments, the insertable wireless communication device 1905 and the host-side PCB 2015 are located in the compartment 1910 without the enclosure 1920 (e.g., similar to the insertable wireless communication device 610 shown in FIGS. 6 and 7). Although the enclosure 1920 is shown as having two open ends in FIGS. 20A-20D, in some embodiments, the enclosure 1920 only has one open end. In such embodiments, the host-side PCB 2015 may be installed during manufacturing through the same end (i.e., the external end 2005) into which the insertable wireless communication device 1905 is configured to be inserted. In some embodiments, host-side PCB 2015 is installed into the enclosure 1920 during manufacturing in other manners. For example, the enclosure 1920 may include multiple parts and may be a drop-in enclosure to allow the host-side PCB 2015 to be placed in a bottom part of the drop-in enclosure from a top side of the drop-in enclosure. The drop-in enclosure may include a top part that is connected to the bottom part to enclose the drop-in enclosure. However, in some situations, a single-part enclosure 1920 with one open end or two open ends as shown in FIGS. 20A-20D is preferred to reduce possible locations for ingress fluid to enter the enclosure 1920. Additional design features with respect to the enclosure 1920 are explained previously herein with respect to FIGS. 5B and 5C. In some embodiments, the connectors 615, 905, 2020, 2025 are different types of connectors than those shown in the figures. As explained previously herein, in some embodiments, the connectors 615, 905, 2020, 2025 are not included and a component of the host-side PCB 605, 2015 may be configured to wirelessly communicate with the insertable wireless communication device 610, 1905 when the insertable wireless communication device 610, 1905 is inserted in the compartment 405, 1910.

In some embodiments, the insertable wireless communication device 610, 1905 is inserted into, secured in, and removed from the compartment 405, 1910 or enclosure 1920 in other manners than those described previously herein. For example, the insertable wireless communication device 610, 1905 may include a push mechanism/tab such that the insertable device 610, 1905 is secured in the compartment 405, 1910 or enclosure 1920 by the push mechanism/tab until a user again pushes on a rear end of the insertable device 610, 1905 to cause the push mechanism/tab to be released. As another example, a tool or hook may be used to remove the insertable device 610, 1905 from the compartment 405, 1910 or enclosure 1920. As another example, the insertable device 610, 1905 may include one or more spring-like tabs/clips configured to be actuated by a user to remove the insertable device 610, 1905. In this example, the spring-like tabs/clips may be forced inward by the compartment 405, 1910 or enclosure 1920 upon a user inserting the insertable device 610, 1905 into the compartment 405, 1910 or enclosure 1920. Once the insertable device 610, 1905 is inserted into the compartment, the spring-like tabs/clips may release outward to secure the insertable device 610, 1905 into the compartment 405, 1910, or enclosure 1920.

Figure 11:
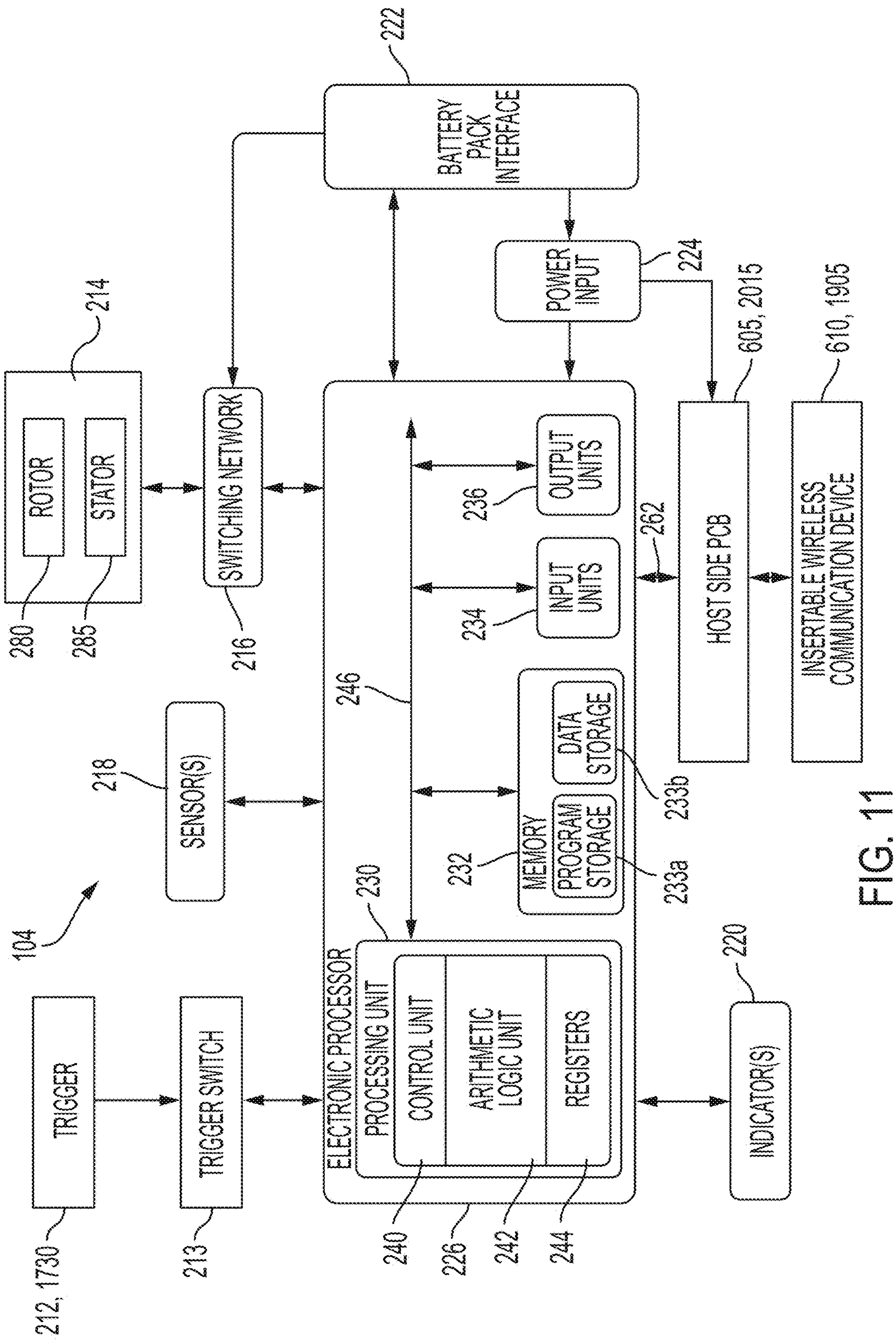
FIG. 11 illustrates a block diagram of the power tool devices of FIGS. 3, 17, and 18 according to one example embodiment.

FIG. 11 illustrates a block diagram of the power tool 104 of FIG. 3 according to one example embodiment. Although the below explanation of FIG. 11 and of the functional details of the devices in the communication system 100 includes reference numbers corresponding to the power tool 104 of FIG. 3, the below explanation applies to the power tool 104 shown in FIG. 3 and similarly to the crimper 1705 shown in FIG. 17, the power tool 1805 shown in FIG. 18, or another power tool device acting as a host device for the insertable wireless device 610, 1905 as explained previously herein. As shown in FIG. 11, the power tool 104 includes the motor 214 that includes the rotor 280 and the stator 285. The motor 214 actuates the drive device 210 and allows the drive device 210 to perform the particular task. For example, the motor 214 drives the drive device 210, 1725 via a direct drive shaft connector or via a transmission. A battery pack couples to the power tool 104 via a battery pack interface 222 and provides electrical power to energize the motor 214. The trigger 212 is coupled with a trigger switch 213. The trigger 212 moves in a first direction towards the handle 204 when the trigger 212 is depressed by the user. The trigger 212 is biased (e.g., with a spring) such that it moves in a second direction away from the handle 204 when the trigger 212 is released by the user. When the trigger 212 is depressed by the user, the trigger switch 213 becomes activated, which causes the motor 214 to be energized. When the trigger 212 is released by the user, the trigger switch 213 becomes deactivated, and the motor 214 is de-energized.

As shown in FIG. 11, the power tool 104 also includes a switching network 216, sensors 218, indicators 220, a power input unit 224, and an electronic processor 226. The battery pack interface 222 includes a combination of mechanical (e.g., the battery pack receiving portion 206 including battery support structure) and electrical components (e.g., terminals) configured to and operable for interfacing (e.g., mechanically, electrically, and communicatively connecting) the power tool 104 with a battery pack. The battery pack interface 222 transmits the power received from the battery pack to the power input unit 224. The power input unit 224 includes combinations of active and passive components (e.g., voltage step-down controllers, voltage converters, rectifiers, filters, etc.) to regulate or control the power received through the battery pack interface 222 and provided to the electronic processor 226 and the host-side PCB 605, 2015 (e.g., to provide power to one or more components on the host-side PCB 605, 2015, to charge an energy storage device such as a coin cell battery included on the host-side PCB 605, 2015, and/or to allow the host-side PCB 605, 2015 to transmit power to the insertable wireless communication device 610, 1905 from the battery pack when the battery pack is coupled to the power tool 104).

The switching network 216 enables the electronic processor 226 to control the operation of the motor 214. Generally, when the trigger 212 is depressed (i.e., the trigger switch 213 is closed), electrical current is supplied from the battery pack interface 222 to the motor 214, via the switching network 216. When the trigger 212 is not depressed, electrical current is not supplied from the battery pack interface 222 to the motor 214. In some embodiments, the trigger switch 213 may include sensors to detect the amount of trigger pull (e.g., released, 20% pull, 50% pull, 75% pull, or fully depressed). In some embodiments, the amount of trigger pull detected by the trigger switch 213 is related to or corresponds to a desired speed of rotation of the motor 214. In other embodiments, the amount of trigger pull detected by the trigger switch 213 is related to or corresponds to a desired torque, or other parameter. In response to the electronic processor 226 receiving the activation signal from the trigger switch 213, the electronic processor 226 activates the switching network 216 to provide power to the motor 214. The switching network 216 controls the amount of current available to the motor 214 and thereby controls the speed and torque output of the motor 214. The switching network 216 may include several field effect transistors (FETs), bipolar transistors, or other types of electrical switches, such as six FETs in a bridge arrangement. The electronic processor 226, in some embodiments, drives successive switching elements of the switching network 216 with respective pulse width modulation (PWM) signals to alternately drive stator coils of the stator 285, thus inducing rotation of the rotor 280.

The sensors 218 are coupled to the electronic processor 226 and communicate to the electronic processor 226 various signals indicative of different parameters of the power tool 104 or the motor 214. The sensors 218 include, for example, one or more current sensors, one or more voltage sensors, one or more temperature sensors, one or more speed sensors, one or more Hall Effect sensors, etc. For example, the speed of the motor 214 can be determined using a plurality of Hall Effect sensors to sense the rotational position of the motor 214. In some embodiments, the electronic processor 226 controls the switching network 216 in response to signals received from the sensors 218. For example, if the electronic processor 226 determines that the speed of the motor 214 is increasing too rapidly based on information received from the sensors 218, the electronic processor 226 may adapt or modify the active switches or switching sequence within the switching network 216 to reduce the speed of the motor 214. Data obtained via the sensors 218 may be saved in the electronic processor 226 as tool usage data.

The indicators 220 are also coupled to the electronic processor 226 and receive control signals from the electronic processor 226 to turn on and off or otherwise convey information based on different states of the power tool 104. The indicators 220 include, for example, one or more light-emitting diodes ("LED"), or a display screen. The indicators 220 can be configured to display conditions of, or information associated with, the power tool 104. For example, the indicators 220 are configured to indicate measured electrical characteristics of the power tool 104, the status of the power tool 104, etc. The indicators 220 may also include elements to convey information to a user through audible or tactile outputs.

As described above, the electronic processor 226 is electrically and/or communicatively connected to a variety of components of the power tool 104. In some embodiments, the electronic processor 226 includes a plurality of electrical and electronic components that provide power, operational control, and protection to the components within the electronic processor 226 and/or power tool 104. For example, the electronic processor 226 includes, among other things, a processing unit 230 (e.g., a microprocessor, a microcontroller, or another suitable programmable device), a memory 232, input units 234, and output units 236. The processing unit 230 includes, among other things, a control unit 240, an arithmetic logic unit ("ALU") 242, and a plurality of registers 244 (shown as a group of registers in FIG. 11). In some embodiments, the electronic processor 226 is implemented partially or entirely on a semiconductor (e.g., a field-programmable gate array ["FPGA"] semiconductor) chip, such as a chip developed through a register transfer level ("RTL") design process.

The memory 232 includes, for example, a program storage area 233*a* and a data storage area 233*b*. The program storage area 233*a* and the data storage area 233*b* can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processing unit 230 is connected to the memory 232 and executes software instructions that are capable of being stored in a RAM of the memory 232 (e.g., during execution), a ROM of the memory 232 (e.g., on a generally permanent basis), or another non-transitory computer readable medium such as another memory or a disc. Software included in the implementation of the power tool 104 can be stored in the memory 232 of the electronic processor 226. The software includes, for example, firmware, one or more applications, program data, filters, rules, and other executable instructions. The electronic processor 226 is configured to retrieve from memory and execute, among other things, instructions related to the control processes and methods described herein. The electronic processor 226 is also configured to store power tool device information on the memory 232. The power tool device information stored on the memory 232 may include power tool device identification information (e.g., including a unique identifier of the power tool 104) and also power tool device operational information including information regarding the usage of the power tool 104, information regarding the maintenance of the power tool 104, power tool trigger event information, parameter information to operate the power tool 104 in a particular mode, and other information relevant to operating or maintaining the power tool 104. In some embodiments, the information stored on the memory of a host device (e.g., the power tool 104) includes a platform identifier that generally identifies a type of host device as explained in greater detail below. In other constructions, the electronic processor 226 includes additional, fewer, or different components.

In some embodiments, electrical components of the power tool 104 shown in FIG. 11 are located on one or more PCBs within the housing of the power tool 104. For example, the power tool 104 may include a Hall sensor PCB where Hall Effect sensors are located (e.g., on a front or rear side of the motor 214). The power tool 104 may also include a power/FET PCB where the switching network 216 is located (e.g., in the handle 204, between the handle 204 and the main body 202, in the potting boat 1925 in the main body 1710 shown in FIG. 19, or elsewhere within the housing of the power tool 104). The power tool 104 may also include a control PCB where the electronic processor 226 is located (e.g., in the battery pack receiving portion 206 or elsewhere within the housing of the power tool 104). The power tool 104 may include wires, ribbon cables, and/or the like to couple components on each of these PCBs to components on other PCBs as indicated by the block diagram of FIG. 11. In some embodiments, one or more of the Hall sensor PCB, the power/FET PCB, and the control PCB are combined such that the components on each of these PCBs are included on less than three separate PCBs.

Figure 12A:
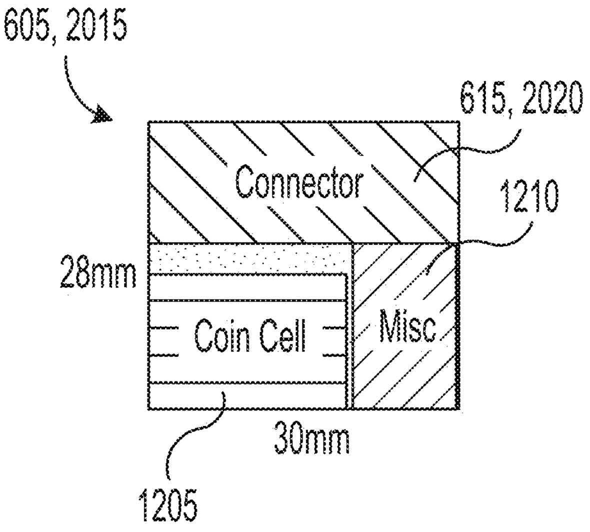
FIGS. 12A and 12B illustrate alternate example embodiments of the first printed circuit board (i.e., host-side PCB) of FIGS. 6 and 20A-20B.

Additionally, as previously described herein, the power tool 104 includes the host-side PCB 605, 2015 that is configured to be communicatively coupleable to the insertable wireless communication device 610, 1905 (e.g., via a wired or wireless connection). In some embodiments, the host-side PCB 605, 2015 includes an energy storage device 1205 (see FIG. 12A) separate from the battery pack of the power tool 104. Because the energy storage device 1205 is separate from the battery pack of the power tool 104, the energy storage device 1205 may be referred to as a backup battery. The energy storage device 1205 may be a coin cell battery as indicated in FIG. 12A. The energy storage device 1205 may alternatively be another type of battery cell, a capacitor, or another energy storage device. In some embodiments, the energy storage device 1205 is configured to provide power to the insertable wireless communication device 610, 1905 (e.g., via the first connector 615, 2020 and the second connector 905, 2025 or a via wireless power transfer) when the insertable wireless communication device 610, 1905 is inserted into the compartment 405, 1910. In some embodiments, the energy storage device 1205 does not provide power to energize the motor 214, drive the drive device 210, or power the power tool electronic processor 226, and generally only powers the insertable wireless communication device 610, 1905 when a battery pack is not attached to the power tool 104. In other embodiments, the energy storage device 1205 also provides power to low-power elements such as, for example, LEDs, and the like. In some embodiments, the energy storage device 1205 also provides power to the host device electronic processor 226 to allow the host device electronic processor 226 to communicate with the external device 108 (and/or the server 112) when the battery pack is not coupled to the power tool 104.

In some embodiments, the energy storage device 1205 is a primary (i.e., non-rechargeable) backup battery. In other embodiments, the energy storage device 1205 includes a secondary (rechargeable) backup battery cell or a capacitor. In such embodiments, a battery pack coupled to the power tool 104 provides charging power to recharge the backup battery cell or the capacitor. For example, the power input unit 224 may include charging circuitry to charge the energy storage device 1205. The rechargeable cell and capacitor may be sized to provide power for several days or weeks before needing to recharge. While FIG. 11 shows the power input unit 224 as a component of the power tool 104 that provides power received from the battery pack to the host-side PCB 605, 2015 on which the energy storage device 1205 is located, in some embodiments, the host-side PCB 605, 2015 includes its own separate power input unit that is similar to the power input unit 224. For example, the power input unit of the host-side PCB 605, 2015 includes combinations of active and passive components (e.g., voltage step-down controllers, voltage converters, rectifiers, filters, etc.) to regulate or control the power received from the battery pack.

As indicated by FIG. 12A, the host-side PCB 605, 2015 may also include additional circuitry/components 1210 to allow the energy storage device 1205 and the insertable wireless communication device 610 to implement certain functions. For example, the additional circuitry/components 1210 may include the separate power input unit mentioned above, conditioning circuitry, or other similar circuitry. As another example, the additional circuitry/components 1210 may include a voltage sensor to monitor a state of charge of the energy storage device 1205 and an electronic processor to monitor the voltage sensor and provide information regarding the state of charge of the energy storage device 1205 to the electronic processor 226. The electronic processor 226 may control the indicators 220 to indicate the state of charge of the energy storage device 1205 or may transmit information regarding the state of charge of the energy storage device 1205 to the external device and/or the server 112 via the insertable wireless communication device 610, 1905. As another example, the electronic processor of the additional circuitry/components 1210 may detect when the insertable wireless communication device 610, 1905 is inserted into the compartment 405, 1910 and notify the electronic processor 226 of such insertion. The additional circuitry/components 1210 may also provide a communication path from the electronic processor 226 of the power tool 104 to the insertable wireless communication device 610, 1905 to allow for external communication to/from the power tool 104 and the external device 108 and/or the server 112. In some embodiments, the additional circuitry/components 1210 include an integrated wireless communication device (e.g., Bluetooth® transceiver/antenna, near-field communication transceiver/antenna, or the like) to allow the host-side PCB 605, 2015 to wirelessly communicate with the insertable device 610, 1905 when the insertable device 610, 1905 is inserted into the compartment 405, 1910.

In some embodiments, the host-side PCB 605, 2015 includes fewer or additional components than those shown in FIG. 12A. For example, in the alternate embodiment shown in FIG. 12B, the host-side PCB 605, 2015 may include the first connector 615, 2020, but the energy storage device 1205 and the additional circuitry/components 1210 may be located elsewhere in the power tool 104. For example, the energy storage device 1205 may be located in the battery pack receiving portion 206 (in a separate compartment of the housing of the power tool 104 or on the control PCB), and the additional circuitry/components 1210 may be located on the control PCB. As an example of the host-side PCB 605, 2015 including additional components, the host-side PCB 605, 2015 may include the electronic processor 226, the switching network 216, and/or the like. In other words, in some embodiments, the host-side PCB 605, 2015 may serve as the control PCB and/or the power/FET PCB for the power tool 104. Alternatively, the host-side PCB 605, 2015 may include some of the components that would typically be included on the control PCB and/or the power/FET PCB but such PCBs may still separately exist within the power tool 104. As another example of the host-side PCB 605, 2015 including additional components, the host-side PCB 605, 2015 may include an electronic processor (i.e., a third electronic processor in addition to the electronic processor 226 of the power tool and electronic processor 1305 of the insertable wireless communication device 610, 1905) and an antenna (i.e., a second antenna in addition to the antenna 1315 of the insertable wireless communication device 610, 1905). The electronic processor of the host-side PCB 605, 2015 may be coupled to the second antenna and to the electronic processor 226 to allow information to be transferred between the electronic processor 226 and the external device 108 via the second antenna via a first communication protocol (e.g., short-range radio communication such as Bluetooth®). Accordingly, the electronic processor of the host-side PCB 605, 2015 may be configured to be a radio communication transceiver in some embodiments. In such embodiments, when inserted into the compartment 405, 1910, the insertable wireless communication device 610, 1905 may additionally or alternatively allow the power tool 104 to communicate wirelessly with other devices using a second communication protocol different than the first communication protocol (e.g., long-range radio communication such as cellular communication over a cellular network). Accordingly, the insertable wireless communication device 610, 1905 may be configured to expand the communication capabilities of the power tool 104 in situations where the power tool 104 already includes some wireless communication capabilities.

Figure 12B:
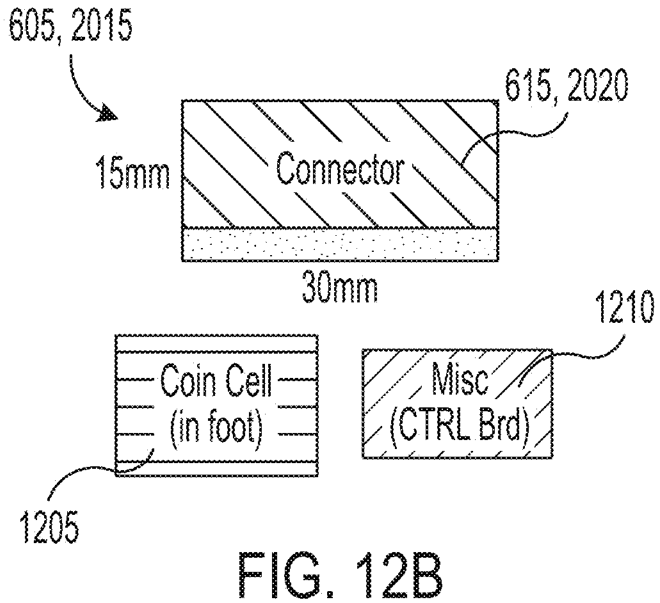

While FIGS. 12A and 12B indicate a length of approximately twenty eight millimeters and a width of approximately thirty millimeters of the host-side PCB 605, 2015 according to some embodiments, the length and/or width of the host-side PCB 605, 2015 may be different in other embodiments. For example, the length and/or width of the host-side PCB 605, 2015 may be different based on the size of the insertable device PCB 805, 2035 and based on the minimum antenna efficiency standard being used for a particular application as explained in greater detail below.

Via a data connection (e.g., a communication channel) 262 between the electronic processor 226 and the host-side PCB 605, 2015, the electronic processor 226 is configured to communicatively couple to the insertable wireless communication device 610, 1905. In some embodiments, the data connection 262 includes one or more wires (and/or a ribbon cable) that are connected from the electronic processor 226 to the host-side PCB 605, 2015. When the insertable wireless communication device 610, 1905 is inserted into the compartment 405, 1910, the second connector 905, 2025 of the insertable wireless communication device 610, 1905 couples with the first connector 615, 2020 that is coupled to the host-side PCB 605, 2015 and communication between the electronic processor 226 and the insertable wireless communication device 610, 1905 is thereby enabled. As explained previously herein, in some embodiments, the connectors 615, 905, 2020, 2025 are not included and a component of the host-side PCB 605, 2015 may be configured to wirelessly communicate with the insertable wireless communication device 610, 1905 when the insertable wireless communication device 610, 1905 is inserted in the compartment 405, 1910.

Figure 13:
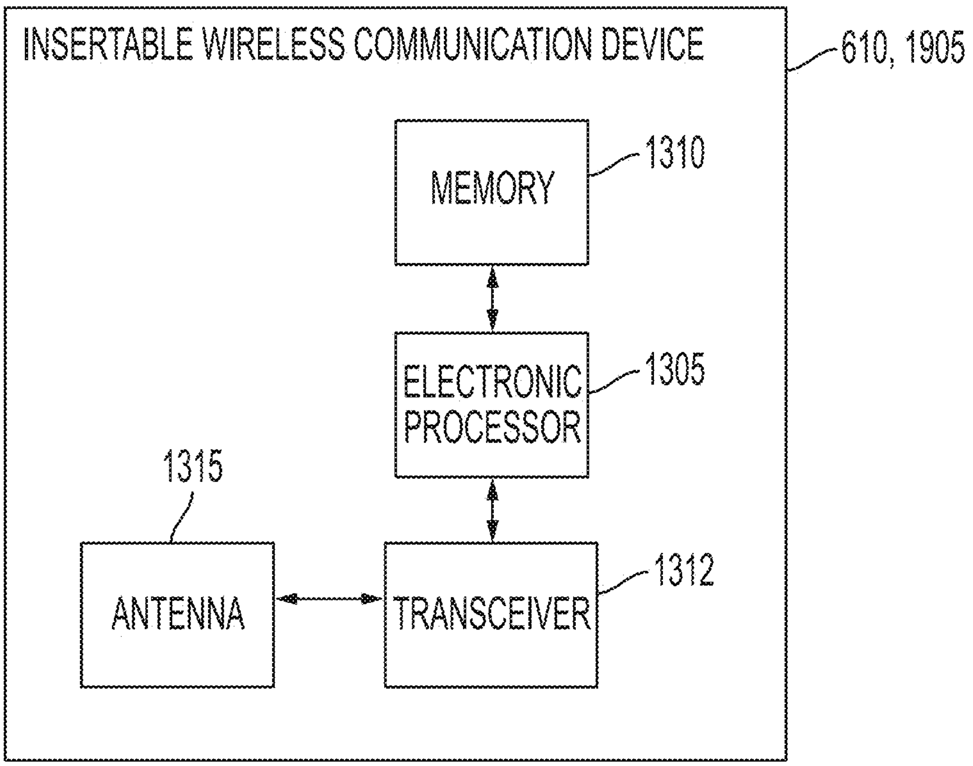
FIG. 13 illustrates a block diagram of the insertable wireless communication device of FIGS. 6 and 19 according to one example embodiment.

FIG. 13 illustrates a block diagram of the insertable wireless communication device 610, 1905 according to one example embodiment. The insertable wireless communication device 610, 1905 enables the electronic processor 226 of the power tool 104 to communicate with the external device 108 and/or the server 112 to transmit power tool data (e.g., power tool usage data, configuration data, maintenance data, and the like) and to receive power tool configuration data (e.g., settings for operating the power tool 104 in a particular mode and the like) and commands to control power tool components (e.g., turn on a work light, lock the power tool 104, and the like). The insertable device 610, 1905 may also enable a location of the host device 104, 106, 1705, 1805 to be determined and tracked/recorded by the external device 108 and/or the server 112.

As shown in FIG. 13, the insertable wireless communication device 610, 1905 includes an electronic processor 1305, a memory 1310, a transceiver 1312 (e.g., a radio transceiver), and an antenna 1315. In some embodiments, the antenna 1315 is a monopole antenna (i.e., a ground plane antenna) that includes a conductor (e.g., a chip antenna 2105, a rod-shaped conductor, etc.) mounted to the insertable device PCB 805, 2035 and serving as a first portion of the antenna 1315. The antenna 1315 also includes a conductive layer 2045 of the insertable device PCB 805, 2035 and/or a conductive layer 1005, 2040 of the host-side PCB 605, 2015 serving as a second portion (i.e., ground plane) of the antenna 1315 (as described in greater detail below). In some embodiments, the antenna 1315 is a laser direct structuring (LDS) antenna that includes a metalized structure printed onto a surface of the plastic housing 910 of the insertable device 610 or printed onto the end cap 2110 of the insertable device 1905 (i.e., the LDS antenna is molded into the housing 910 or the end cap 2110 of the insertable wireless communication device 610, 1905). For example, the LDS antenna 1315 may be printed on an external or internal surface of an exterior wall 625 (i.e., outermost wall when the insertable device 610 is inserted into the compartment 405 as shown in FIG. 6) of the housing 910 of the insertable device 610. The exterior wall 625 of the insertable device 610 may be mounted flush to an exterior wall of the housing of the power tool device 104 when the insertable device 610 is inserted into the compartment 405. In such embodiments, the cover 410 may or may not be included. In some embodiments, the LDS antenna may consume less physical space than other types of antennas. In some embodiments, the LDS antenna may be printed on an external or internal surface of a different wall of the housing 910 of the insertable device 610.

The antenna 1315, the transceiver 1312, and the electronic processor 1305 operate together to send and receive wireless messages between the external device 108 (and/or the server 112) and the electronic processor 226 of the power tool 104. The memory 1310 stores instructions to be implemented by the electronic processor 1305 and/or may store data related to communications between the power tool 104 and the external device 108 (and/or the server 112) or the like. The electronic processor 1305 may control wireless communications between the power tool 104 and the external device 108 (and/or the server 112). For example, the electronic processor 1305 buffers incoming and/or outgoing data, communicates with the electronic processor 226 of the power tool 104, and determines the communication protocol and/or settings to use in wireless communications. In other words, the electronic processor 1305 is configured to receive data from the power tool electronic processor 226 and relay the information to the external device 108 (and/or the server 112) via the transceiver 1312 and the antenna 1315. In a similar manner, the electronic processor 1305 is configured to receive information (e.g., configuration and programming information) from the external device 108 (and/or the server 112) via the transceiver 1312 and the antenna 1315 and relay the information to the power tool electronic processor 226. Accordingly, in some embodiments, the electronic processor 1305 functions as one or more radio transceivers (i.e., the functionality of the transceiver 1312 may be included in the electronic processor 1305 in some embodiments). In other embodiments, the insertable wireless communication device 610, 1905 may include multiple separate transceivers 1312 (e.g., radio transceivers) that each include their own electronic processor (e.g., see FIG. 14A) or that communicate with the electronic processor 1305 to allow the insertable wireless communication device 610, 1905 to use different communication protocols to communicate via the antenna 1315. As explained previously herein, in some embodiments, the connectors 615, 905, 2020, 2025 are not included and a component of the host-side PCB 605, 2015 may be configured to wirelessly communicate with the insertable wireless communication device 610, 1905 when the insertable wireless communication device 610, 1905 is inserted in the compartment 405, 1910. In such embodiments, such wireless communication with the host-side PCB 605, 2015 may occur via the same communication protocol and/or the same circuitry of the insertable device 610, 1905 that is used to communicate with the external device 108 and/or the server 112. Alternatively, wireless communication with the host-side PCB 605, 2015 may occur via a different communication protocol and/or different circuitry of the insertable device 610, 1905 than that which is used to communicate with the external device 108 and/or the server 112.

Figure 14A:
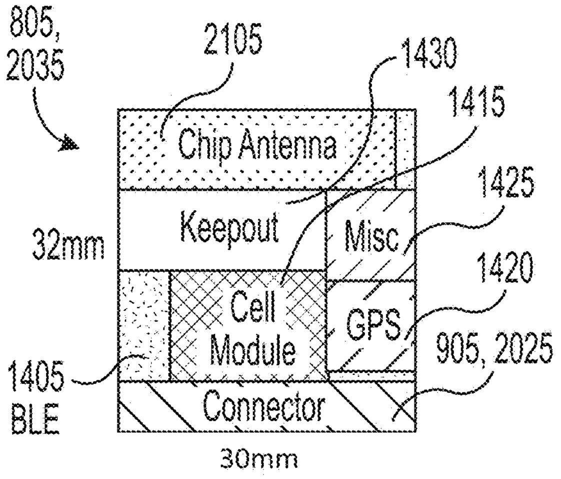
FIGS. 14A-14J illustrate alternate example embodiments of a second printed circuit board of the insertable wireless communication device (e.g., insertable device PCB) of FIGS. 6, 13, and 19.

In some embodiments, the insertable wireless communication device 610, 1905 includes a Bluetooth® transceiver 1405, 1435 (e.g., a Bluetooth® low energy (BLE) transceiver 1405, 1435 as shown in FIGS. 14A-14C and 14F-14H). The Bluetooth® transceiver 1405, 1435 communicates with the external device 108 employing the Bluetooth® protocol. Therefore, in such an embodiment, the external device 108 and the power tool 104 are within a communication range (i.e., in proximity) of each other while they exchange data. In other embodiments, the insertable wireless communication device 610, 1905 communicates using other protocols (e.g., Wi-Fi, cellular protocols, etc.) over a different type of wireless network. For example, the insertable wireless communication device 610, 1905 may include a Wi-Fi transceiver 1410 (see FIGS. 14C and 14H) configured to communicate via Wi-Fi through a wide area network such as the Internet or a local area network, or to communicate through a piconet (e.g., using infrared or NFC communications). As another example, the insertable wireless communication device 610, 1905 may include a cellular communication transceiver 1415 configured to communicate over a cellular network. The communication via the insertable wireless communication device 610, 1905 may be encrypted to protect the data exchanged between the power tool 104 and the external device 108 (or network) from third parties. In some embodiments, the antenna 1315 is a multi-band/multi-protocol antenna. In other words, a single antenna may be used for multiple transceivers that use different communication protocols (e.g., Bluetooth®, Wi-Fi, GPS, cellular, etc. as shown in FIG. 14A). In such embodiments, each transceiver may selectively connect to the antenna via a respective switch, power divider, or frequency dependent impedance network.

Specific examples of communication capabilities between the power tool 104 and the external device 108 and other capabilities of the insertable wireless communication device 610, 1905 are included in U.S. Provisional Patent Application No. 62/801,975, which was filed Feb. 6, 2019 and U.S. patent application Ser. No. 16/056,710, which was filed Aug. 7, 2018, the contents of both of which are hereby incorporated by reference. In some embodiments, the insertable wireless communication device 610, 1905 functions similarly as the wireless communication device 300 described in U.S. patent application Ser. No. 16/056,710. For example, the insertable wireless communication device 610, 1905 is configured to periodically broadcast an identification signal for the power tool 104 that includes unique identification information stored by the power tool memory 232 and provided to the insertable wireless communication device 610, 1905 by the power tool electronic processor 226. The identification signal for the power tool 104 can then be used to track the location of the power tool 104 (see FIG. 16 and corresponding explanation of U.S. patent application Ser. No. 16/056,710). In some embodiments, the insertable wireless communication device 610, 1905 broadcasts an identification signal to the external device 108, and the external device 108 determines its own location (e.g., using a GNSS receiver) and transmits the location of the external device 108 and the identification information of the power tool 104 to the server 112 over a network. Such communication using the external device 108 as the intermediary allows the approximate location of the power tool 104 to be determined because the insertable wireless communication device 610, 1905 is known to be within communication range (e.g., Bluetooth® communication range) of the external device 108 when the external device 108 receives the broadcasted identification signal from the insertable wireless communication device 610, 1905. In other embodiments, for example where the insertable wireless communication device 610, 1905 has cellular communication capabilities (see FIGS. 14A and 14F or the embodiment explained with respect to FIG. 16 of U.S. Provisional Patent Application No. 62/801,975), the insertable wireless communication device 610, 1905 may be configured to communicate identification information and location information directly to the server 112 over the network without using the external device 108 as an intermediary. In such embodiments, the insertable wireless communication device 610, 1905 may include a global positioning system (GPS) transceiver 1420 to determine its location (see FIGS. 14A and 14F). Such embodiments may allow for more precise location determination of the power tool 104 and do not require the external device 108 to serve as an intermediary between the insertable wireless communication device 610, 1905 and the server 112. However, such embodiments may require additional components and/or larger components in the insertable wireless communication device 610, 1905 that may take up limited space in the insertable wireless communication device 610, 1905 and in the portion of the power tool 104 where the compartment 405, 1910 is located. While the above embodiments involve communication between the insertable wireless communication device 610, 1905 and the server 112 directly for tracking purposes or through the external device 108 as an intermediary for tracking purposes, such communication between any of these devices is possible for other purposes as well (e.g., storing tool usage data, retrieving stored modes and/or operational parameters to program the power tool 104, retrieving firmware updates, and the like).

As another example of tracking the location of the host devices 104, 106, 1705, 1805 without using the external device 108 as an intermediary, the insertable wireless communication device 610, 1905 of a host device 104, 106, 1705, 1805 may use a Wi-Fi transceiver 1410 and a cellular communication transceiver 1415 to determine its location. In some embodiments, the Wi-Fi transceiver 1410 is configured to sniff for nearby Wi-Fi routers and transmit nearby Wi-Fi router information, via the cellular communication transceiver, to the server 112. The server 112 may then transmit the Wi-Fi router data to a location service provider. The location service provider then determines a location of the insertable wireless communication device 610, 1905 based on the received Wi-Fi router information. The location service provider may transmit the determined location of the insertable device 610, 1905 back to the server 112 such that an external device 108 of a user may communicate with the server 112 to access the determined location of the insertable device 610, 1905 (and the host device 104, 106, 1705, 1805 to which the insertable device 610, 1905) is attached.

As another example of a function that the insertable wireless communication device 610, 1905 may perform, the insertable wireless communication device 610, 1905 allows the host device 104, 106, 1705, 1805 to be locked out in response to user selection on the external device 108. In other words, the external device 108 and/or the server 112 may send a command to the power tool 104 via the insertable wireless communication device 610, 1905 to prevent the motor 214 from operating even in response to actuation of the trigger 212 (see FIG. 17 and corresponding explanation of U.S. patent application Ser. No. 16/056,710). Such a command may control the power tool 104 to immediately lock out or to lock out at a future time. In some embodiments, the insertable wireless communication device 610, 1905 may lock out (i.e., disable) the power tool 104 by preventing communications between the battery pack coupled to the power tool 104 and the power tool 104 or by sending a lock command to the electronic processor 226 instructing the electronic processor 226 to not drive the motor 214 in response to actuation of the trigger 212. As another example of a function that the insertable wireless communication device 610, 1905 may perform, the insertable wireless communication device 610, 1905 may be configured to be electronically irremovable from the power tool 104 such that the power tool 104 is unable to operate if the insertable wireless communication device 610, 1905 is removed from the power tool 104 (see FIGS. 29-31 and corresponding explanation of U.S. patent application Ser. No. 16/056,710).

In some embodiments, the insertable wireless communication device 610, 1905 includes more or fewer components than those shown in FIG. 13. For example, the insertable wireless communication device 610, 1905 may include an accelerometer, a gyroscope, and/or subscriber identity module (SIM) card. In some embodiments, the electronic processor 1305 of the insertable device 610, 1905 requests more or less current from the energy storage device 1205 or battery pack of the host device 104, 106, 1705, 1805 based on, for example, the components included on the insertable device 610, 1905 and depending on which of the components is controlled to function at a given time. For example, the electronic processor 1305 of the insertable device 610, 1905 may communicate with the electronic processor 226 of the host device 104, 106, 1705, 1805 to request more or less current. As another example of the insertable wireless communication device 610, 1905 including more or fewer components than those shown in FIG. 13, in addition to or as an alternative to the host-side PCB 605, 2015 of the power tool 104 including the energy storage device 1205, the insertable wireless communication device 610, 1905 may include the energy storage device 1205. In such embodiments, the insertable wireless communication device 610, 1905 may also include the separate power input circuitry described above with respect to the host-side PCB 605, 2015.

In embodiments where the insertable device 610, 1905 includes an accelerometer or other motion detector, the insertable device 610, 1905 may determine its location (e.g., using the GPS transceiver 1420) and transmit its determined location (e.g., to the server 112 using the cellular communication transceiver 1415 and the antenna 1315) more often when the electronic processor 1305 determines that the insertable device 610, 1905 is being moved than when the insertable device 610, 1905 has remained stationary for a period of time. For example, the insertable device 610, 1905 may determine and provide its location once per day to the server 112 when the electronic processor 1305 has not detected movement of the insertable device 610, 1905/host device 104, 106, 1705, 1805 based on a signal from the accelerometer. On the other hand, when the electronic processor 1305 detects movement of the insertable device 610, 1905/host device 104, 106, 1705, 1805 based on a signal from the accelerometer, the insertable device 610, 1905 may determine and provide its location more often (e.g., once every one minute, five minutes, ten minutes, or the like). In some embodiments, the electronic processor 1305 logs a time and/or location in response to detecting movement of the insertable device 610, 1905/host device 104, 106, 1705, 1805 based on a signal from the accelerometer. This logged movement information may be transmitted to the external device 108 to be displayed to a user to allow the user to determine when and where motion of the insertable device 610, 1905/host device 104, 106, 1705, 1805 has been detected.

FIGS. 14A through 14J illustrate different example embodiments of the insertable device PCB 805, 2035 of the insertable wireless communication device 610, 1905 that include different specific components represented by the general block diagram of FIG. 13.

As shown in FIGS. 14A, the insertable device PCB 805, 2035 includes the chip antenna 2105, the connector 905, 2025, the BLE transceiver 1405, the cellular communication transceiver 1415, and the GPS transceiver 1420. In some embodiments, the BLE transceiver 1405 and the cellular communication transceiver 1415 may be referred to as radio communication transceivers. The insertable device PCB 805, 2035 of FIG. 14A also includes additional circuitry/components 1425 that allow the other components to function (e.g., conditioning circuitry, etc. in accordance with specifications of the other components). The insertable device PCB 805, 2035 of FIG. 14A also includes a keepout zone 1430 that does not include any components based on the specification of one or more of the surrounding components. FIG. 14F shows an alternative PCB layout for the insertable device PCB 805, 2035 including many similar components as those shown in FIG. 14A. The insertable device PCB 805, 2035 of FIG. 14F also includes a power input unit 1445 that may perform a similar function as the power input unit 224 of the power tool 104. The insertable device PCB 805, 2035 of FIG. 14F also includes a subscriber identity module (SIM) card 1450.

In FIGS. 14A and 14F, the chip antenna 2105 may be a multi-band/multi-protocol antenna used by the BLE transceiver 1405, the cellular communication transceiver 1415, and the GPS transceiver 1420. In such embodiments, each transceiver may selectively connect to the chip antenna 2105 via a respective switch, power divider, or frequency dependent impedance network, and such circuitry may be included within each transceiver and/or within the additional circuitry/components 1425. In other embodiments, one or more of the transceivers 1405, 1415, and 1420 may have their own antennas. For example, the chip antenna 2105 may be used only by the cellular communication transceiver 1415 and not by other transceivers included on the insertable device PCB 805, 2035 in some embodiments. As another example, the BLE transceiver 1405 may be mounted on an opposite side (e.g., a top side) of the insertable device PCB 805, 2035 than the cellular communication transceiver 1415. As shown in FIG. 14A, in some embodiments, the cellular communication transceiver 1415 may be mounted on the bottom surface of the insertable device PCB 805, 2035 and may partially overlap/obscure a portion of the BLE transceiver 1405 mounted on the top surface of the insertable device PCB 805, 2035. In such embodiments, a portion of the BLE transceiver 1405 that does not overlap with (i.e., is not obscured by) the cellular communication transceiver 1415 includes an integrated antenna of the BLE transceiver 1405. In other words, the portion of the BLE transceiver 1405 that is shown in FIG. 14A represents an antenna of the BLE transceiver 1405, and the BLE transceiver 1405 is mounted on the opposite surface (e.g., the top surface) of the insertable device PCB 805, 2035 from the cellular communication transceiver 1415. As indicated by the preceding example, the components of the insertable device PCB 805, 2035 shown in FIGS. 14A through 14J may be mounted on either the top surface or the bottom surface of the insertable device PCB 805, 2035. In other words, FIGS. 14A through 14J do not necessarily indicate that the components shown on the insertable device PCB 805, 2035 are located on a single surface of the insertable device PCB 805, 2035.

Figure 14B:
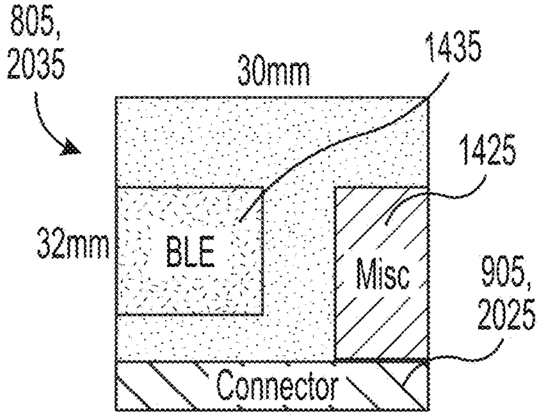

FIG. 14B illustrates another embodiment of the insertable device PCB 805, 2035 of the insertable wireless communication device 610, 1905 where the insertable device PCB 805, 2035 includes the second connector 905, 2025, the additional circuitry/components 1425, and a BLE transceiver 1435. As shown in FIG. 14B, the BLE transceiver 1435 is shown as larger than the BLE transceiver 1405 of FIG. 14A because the BLE transceiver 1435 is not overlapped with/obscured by any other components of the insertable device PCB 805, 2035. Although the reference number 1425 is used to denote the additional circuitry/components in each of FIGS. 14A-14J, the specific circuitry/components within the additional circuitry/components 1425 in each embodiment may be different (e.g., based on the other components included on the insertable device PCB 805, 2035 in each embodiment). FIG. 14G shows an alternative PCB layout for the insertable device PCB 805, 2035 including many similar components as those shown in FIG. 14B.

Figure 14C:
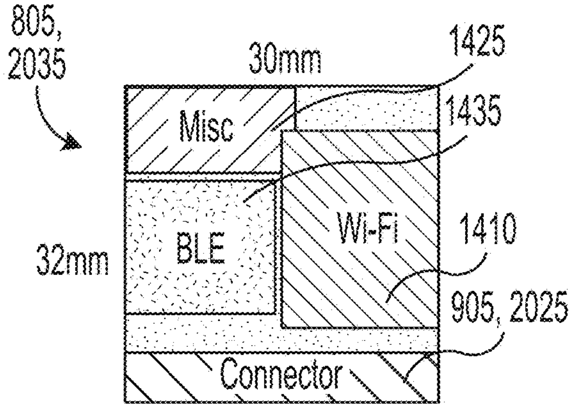

FIG. 14C illustrates yet another embodiment of the insertable device PCB 805, 2035 of the insertable wireless communication device 610, 1905 where the insertable device PCB 805, 2035 includes the second connector 905, 2025, the additional circuitry/components 1425, the BLE transceiver 1435, and the Wi-Fi transceiver 1410. In some embodiments, the Wi-Fi transceiver 1410 includes its own integrated antenna. FIG. 14H shows an alternative PCB layout for the insertable device PCB 805, 2035 including many similar components as those shown in FIG. 14C.

Figure 14D:
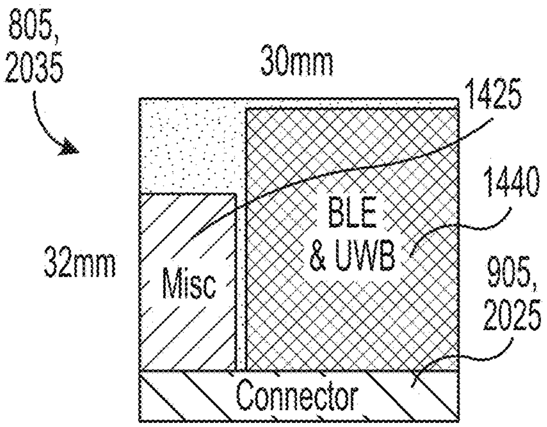

FIG. 14D illustrates another embodiment of the insertable device PCB 805, 2035 of the insertable wireless communication device 610, 1905 where the insertable device PCB 805, 2035 includes the second connector 905, 2025, the additional circuitry/components 1425, and a combined BLE and Ultra-Wideband (UWB) transceiver 1440. In some embodiments, the combined BLE and UWB transceiver 1440 includes its own integrated antenna. FIG. 14I shows an alternative PCB layout for the insertable device PCB 805, 2035 including many similar components as those shown in FIG. 14D.

Figure 14E:
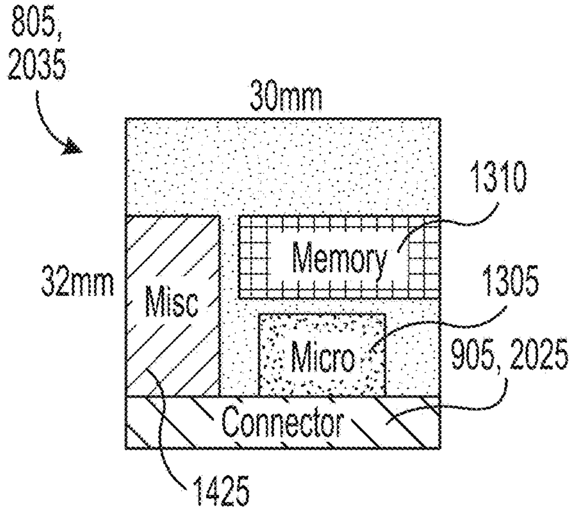
Figure 14F:
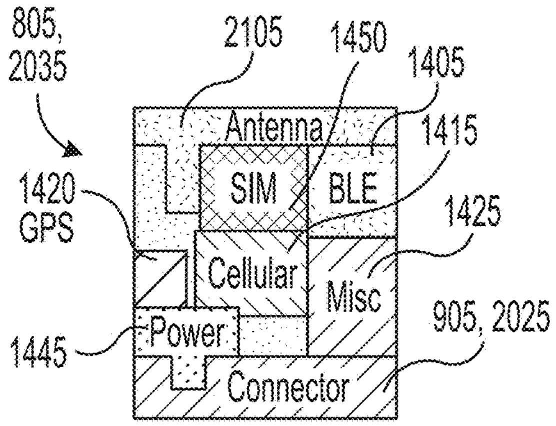
Figure 14G:
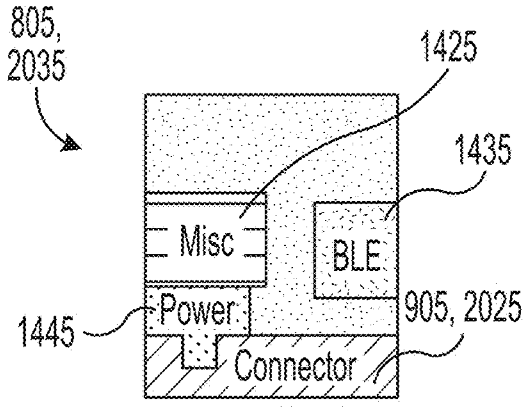
Figure 14H:
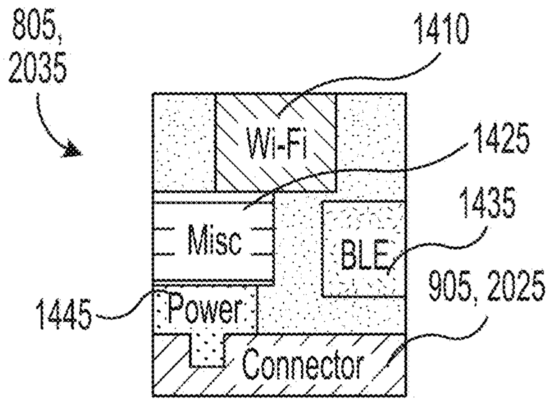
Figure 14I:
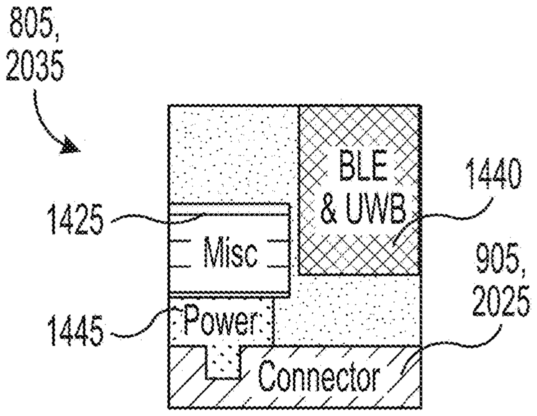
Figure 14J:
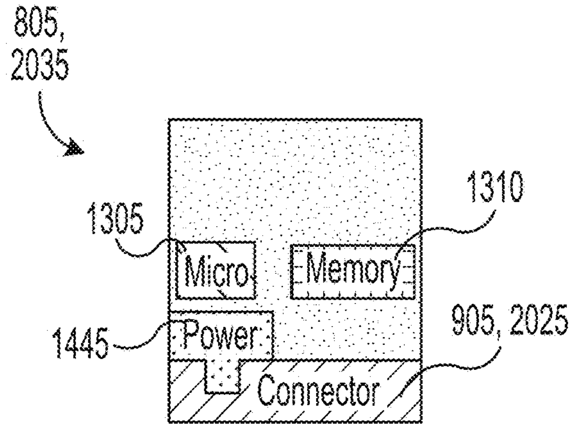

FIG. 14E illustrates another embodiment of the insertable device PCB 805, 2035 of the insertable wireless communication device 610, 1905 where the insertable device PCB 805, 2035 includes the second connector 905, 2025 the additional circuitry/components 1425, a microcontroller (i.e., the electronic processor 1305), and the memory 1310. Although the insertable device PCB 805, 2035 shown in FIG. 14E does not include a component that allows for wireless communication capability like the previously-described embodiments, the insertable wireless communication device 610, 1905 including such an insertable device PCB 805, 2035 may be used to collect and log host device operational data such as during a user trial, an engineering test, troubleshooting, and/or the like. The insertable wireless communication device 610, 1905 of FIG. 14E may then be removed from the power tool device 104, and the collected data could be analyzed by a separate, external device (e.g., a personal computer with a wired communication interface between the insertable wireless communication device 610, 1905 and the personal computer). Additionally or alternatively, the insertable device PCB 805, 2035 shown in FIG. 14E may be used to add additional non-wireless communication functions to the host device 104, 106, 1705, 1805 into which the insertable wireless communication device 610, 1905 is inserted. For example, the insertable device PCB 805, 2035 may include a vibration sensor, an air quality sensor, an accelerometer or a gyroscope to detect movements of the power tool device 104 such as when the power tool device 104 is dropped by a user, voice control circuitry, and/or the like. As additional examples, the insertable device PCB 805, 2035 of FIG. 14E may provide additional processing power/capabilities, a method for detecting the presence of live electrical wires, a temperature and/or humidity sensor, and/or the like. As another example, the insertable device PCB 805, 2035 of FIG. 14E may include a lighting device configured to illuminate a work area by receiving power from the energy storage device 1205 or the battery pack of the host device 104, 106, 1705, 1805 to which the insertable device 610, 1905 is coupled. FIG. 14I shows an alternative PCB layout for the insertable device PCB 805, 2035 including many similar components as those shown in FIG. 14E. The non-wireless communication functions explained above may also be included in the insertable device PCB 805, 2035 of one or more of the other embodiments of FIGS. 14A-14D and 14F-14I.

Although the electronic processor 1305 is not shown in all FIGS. 14A-14J, in some embodiments, the electronic processor 1305 of FIG. 13 represents one or more of the components shown in FIGS. 14A-14J. Alternatively, the electronic processor 1305 may be present on the insertable device PCB 805, 2035, for example, in the additional circuitry/components 1425.

As indicated in FIGS. 14A through 14E, the length of the insertable device PCB 805, 2035 of the insertable wireless communication device 610 may be approximately thirty-two millimeters and the width of the second PCB 805 may be approximately thirty millimeters. These dimensions are merely examples and could be different in different situations (for example, see the dimensions included in FIG. 23). With the relatively small length and width of the insertable device PCB 805, 2035, using a conductive layer (e.g., a copper layer) of the insertable device PCB 805, 2035 as the ground plane for the antenna 1315 (e.g., a quarter-wave monopole/ground plane antenna as described previously herein) may not allow the antenna 1315 to meet the minimum antenna efficiency standard to function properly (e.g., for cellular communication). Accordingly, in order to maintain the insertable device PCB 805, 2035 at a relatively small size but still allow the antenna 1315 to meet the minimum antenna efficiency standard, the antenna 1315 is configured to additionally or alternatively use the conductive layer 1005, 2040 of the host-side PCB 605, 2015 of the power tool 104 to create an extended ground plane when the insertable wireless communication device 610, 1905 is inserted into the compartment 405, 1910. For example, the conductive layer 1005, 2040 of the host-side PCB 605, 2015 is configured to be electrically coupled to one or more ground pins of the antenna 1315 via the first connector 615, 2020 and the second connector 905, 2025 such that the conductive layer 1005, 2040 of the host-side PCB 605, 2015 serves as at least a portion of a ground plane of the antenna 1315. In some embodiments, a conductive layer 2045 of the insertable device PCB 805, 2035 is also configured to be electrically coupled to one or more ground pins of the antenna 1315 such that both the host-side PCB 605, 2015 and the insertable device PCB 805, 2035 provide a portion of the ground plane for the antenna 1315. Additionally, as shown in FIGS. 7 and 20D, when the insertable wireless communication device 610, 1905 is inserted into the compartment 405, 1910, the host-side PCB 605, 2015 and the insertable device PCB 805, 2035 are configured to extend in approximately the same plane inline with each other (and extend approximately parallel to each other) and are configured to serve in combination as the ground plane of the antenna 1315. In such embodiments, dimensions of the ground plane provided by the host-side PCB 605, 2015 and the insertable device PCB 805, 2035 may be approximately thirty three millimeters by seventy five millimeters.

In some embodiments, the host-side PCB 605, 2015 is configured to be large enough such that only the conductive layer 1005, 2040 of the host-side PCB 605, 2015 serves as the ground plane of the antenna 1315 and a conductive layer 2045 of the insertable device PCB 805, 2035 does not serve as part of the ground plane for the antenna 1315 even though the insertable wireless communication device 610, 1905 includes another part of the antenna 1315 (i.e., a chip antenna/conductor 2105 mounted on the insertable device PCB 805, 2035). In other embodiments, the insertable device PCB 805, 2035 may be configured to be large enough such that only a conductive layer 2045 of the insertable device PCB 805, 2035 serves as the ground plane for the antenna 1315 and the conductive layer 1005, 2040 of the host-side PCB 605, 2015 does not serve as part of the ground plane for the antenna 1315. For example, the antenna 1315 may have a larger conductor portion or may not be a chip antenna 2105, which may allow a smaller ground plane to be used for effective wireless communication than when an antenna with a smaller conductor portion is used or when a chip antenna 2105 is used.

Although the above embodiments include at least a portion of the antenna 1315 (e.g., a conductor portion 2105) being located on the insertable wireless communication device 610, 1905, in some embodiments, the power tool 104 may be manufactured with at least a portion of the antenna 1315 (e.g., a conductor portion 2105) included within the housing of the host device 104, 106, 1705, 1805. In such embodiments, the insertable wireless communication device 610, 1905 may include transceiver circuitry that is configured to communicate via the antenna 1315 of the host device 104, 106, 1705, 1805 when the insertable wireless communication device 610, 1905 is inserted into the compartment 405, 1910. In other words, even though the host device 104, 106, 1705, 1805 is manufactured to include the antenna 1315 in such embodiments, the host device 104, 106, 1705, 1805 may not include transceiver circuitry to allow for communication with an external device 108 unless the insertable wireless communication device 610, 1905 is inserted into the compartment 405, 1910. In some of such embodiments, a ground plane of the antenna 1315 of the power tool 104 may be formed by either one or both of the host-side PCB 605, 2015 of the host device 104, 106, 1705, 1805 and the insertable device PCB 805, 2035 of the insertable wireless communication device 610, 1905.

In some embodiments, the length and/or width of the host-side PCB 605, 2015 and/or the insertable device PCB 805, 2035 may be different than the dimensions labeled in FIGS. 12A, 12B, 14A-14E, and 23. For example, depending on the desired size of one of the host-side PCB 605, 2015 and the insertable device PCB 805, 2035 and the minimum antenna efficiency standard for a given application/communication protocol, the length and/or width of the other one of the host-side PCB 605, 2015 and the insertable device PCB 805, 2035 may be correspondingly re-sized such that the combined length and/or surface area of the conductive layers of both PCBs 605, 2015 and 805, 2035 provides a large enough ground plane for the antenna 1315 to meet the minimum antenna efficiency standards for the desired application/communication protocol.

Figure 24:
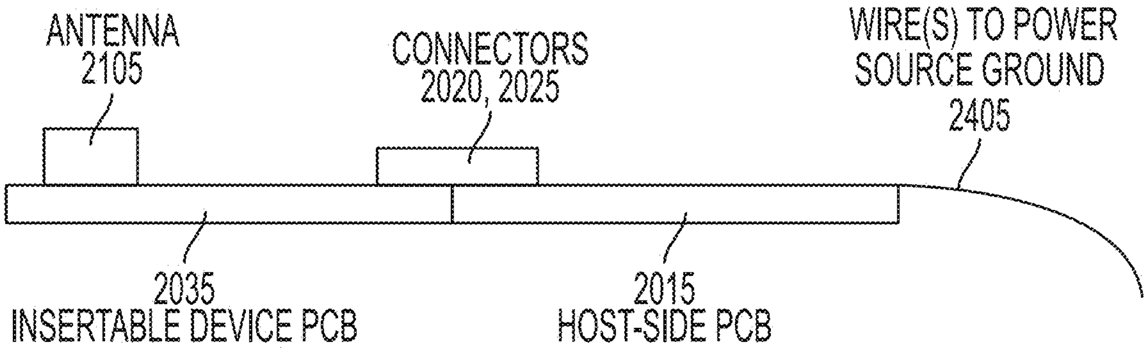
FIG. 24 illustrates a conceptual diagram of a further extended ground plane of the antenna of the insertable wireless communication device of FIGS. 6, 13, and 19 using one or more wires connected from the host-side PCB of FIG. 21 to ground of a power source of the power tool device of FIG. 3, 17, or 18 according to one example embodiment.

In some embodiments, as the length of the ground plane extending from a conductor portion 2105 of the antenna 1315 increases, a signal strength of the antenna 1315 increases. A ground plane for the antenna 1315 may be any conductive surface in which radio frequency current may flow. Accordingly, in some embodiments, one or more ground wires connected from the host-side PCB 605, 2015 to ground of a power source of the power tool 104 (e.g., a battery pack) may further extend the ground plane of the antenna 1315 to improve the signal strength of the antenna 1315. FIG. 24 illustrates a diagram of a further extended ground plane of the antenna 1315 using one or more wires 2405 connected from the host-side PCB 605, 2015 to ground of a power source of the power tool 104. The ground wire(s)

2405 provide another path for radio frequency current to flow and thus provide increased antenna efficiency and performance. In embodiments where the ground wire 2405 is used to further extend the ground plane of the antenna 1315 to improve antenna efficiency and performance, the ground wire 2405 is arranged away from metal surfaces and other wires. For example, the ground wire 2405 may not be wrapped around a metal surface (e.g., a motor enclosure) or bundled with other non-ground wires (e.g., including a power wire) because wrapping the ground wire 2405 around a metal surface or bundling the ground wire 2405 with other wires may reduce the effectiveness of the ground wire 2405 to serve as a further extension of the ground place of the antenna 1315.

Figure 15:
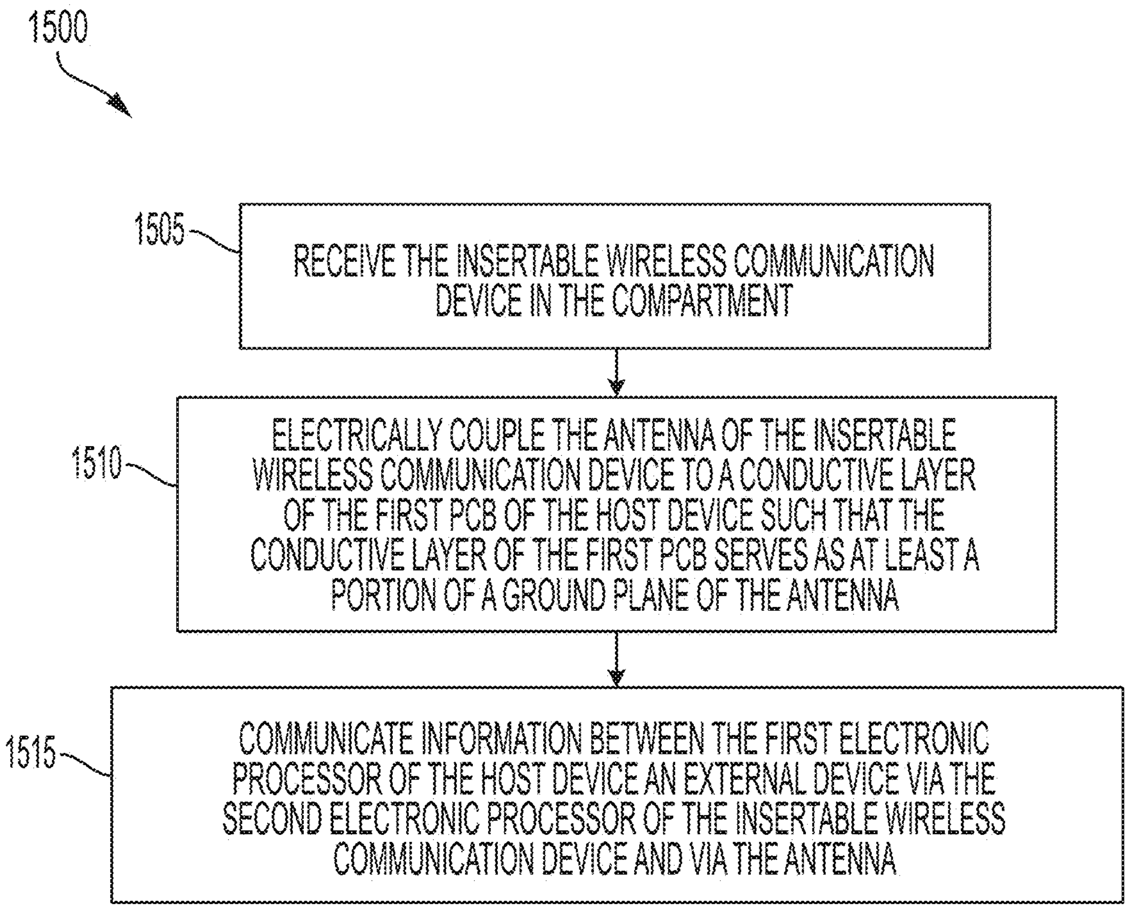
FIG. 15 is a flowchart of a method to allow a power tool device of FIG. 3 to communicate with an external device of FIG. 1 via the insertable wireless communication device of FIGS. 6, 13, and 19 according to one example embodiment.

FIG. 15 is a flowchart of a method 1500 to allow the host device 104, 106, 1705, 1805 to communicate with an external device such as the external device 108 and/or the server 112. At block 1505, the host device 104, 106, 1705, 1805 receives the insertable wireless communication device 610, 1905 in the compartment 405, 1910. At block 1510, when the insertable wireless communication device 610, 1905 is inserted into the compartment 405, the antenna 1315 of the insertable wireless communication device 610, 1905 is electrically coupled to the conductive layer 1005, 2040 of the host-side PCB 605, 2015 of the host device 104, 106, 1705, 1805 such that the conductive layer 1005, 2040 of the host-side PCB 605, 2015 serves as at least a portion of the ground plane of the antenna 1315 as previously herein. For example, the conductive layer 1005, 2040 of the host-side PCB 605, 2015 is electrically coupled to one or more ground pins of the chip antenna 2105 of the insertable wireless communication device 610, 1905 via the first connector 615, 2020 and the second connector 905, 2025. At block 1515, the electronic processor 226 of the host device 104, 106, 1705, 1805 communicates information to and/or from the external device 108 and/or the server 112 via the electronic processor 1305 of the insertable wireless communication device 610, 1905 and via the antenna 1315.

Figure 25B:
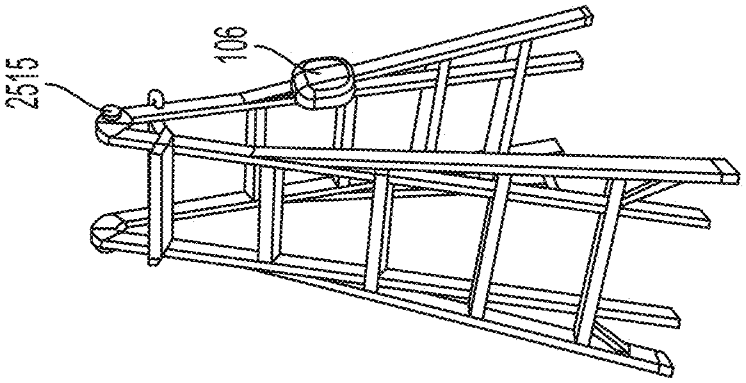
FIGS. 25A and 25B illustrate another host device (e.g., a transmitting device) including one or more securing elements configured to secure the transmitting device to an object to be tracked according to one example embodiment.
Figure 25A:
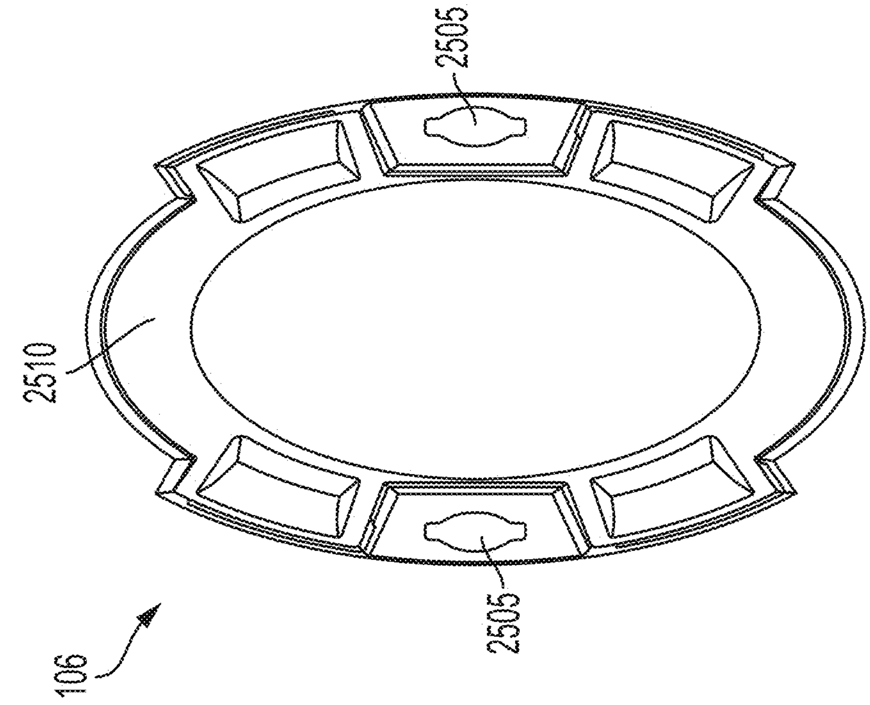

Turning to other devices of the communication system 100 of FIG. 1 that may include similar components and functionality as the power tool device 104, 1705, 1805, FIG. 25A illustrates the transmitting device 106 according to one example embodiment. In some embodiments, the transmitting device 106 includes one or more securing elements configured to secure the transmitting device to an object to be tracked. For example, the transmitting device 106 includes mounting holes 2505 that are configured to receive fasteners (e.g., screws) to secure a housing 2510 of the transmitting device 106 to an object to be tracked. Other securing elements are used in some embodiments, such as an adhesive pad on the back of the housing 2510. In some embodiments, the transmitting device 106 includes a housing having one or more of a different shape (e.g., a rectangular shape), differently positioned mounting holes 2505, and different securing elements for mounting to objects to be tracked than those shown in FIG. 25A. FIG. 25B illustrates the transmitting device 106 attached to an object 2515 to be tracked (e.g., a ladder).

Figure 26:
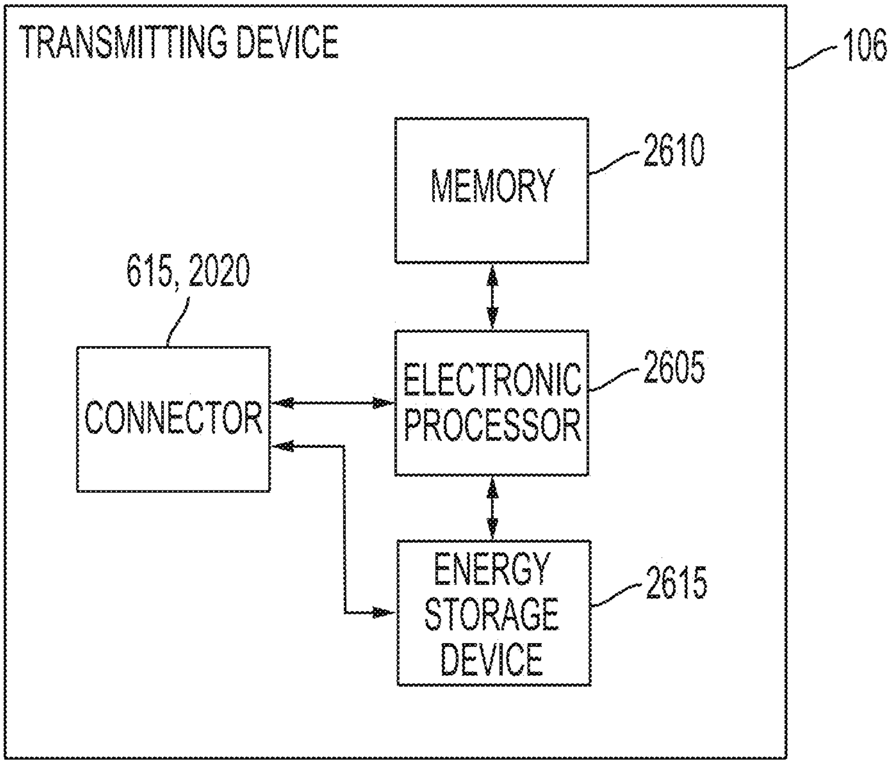
FIG. 26 illustrates a block diagram of the transmitting device of FIG. 25A according to one example embodiment.

FIG. 26 illustrates a block diagram of the transmitting device 106 according to one example embodiment. In some embodiments, the transmitting device 106 includes an electronic processor 2605, a memory 2610, and an energy storage device 2615 (e.g., a backup battery such as a coin cell battery). The transmitting device 106 also includes the connector 615, 2020 described previously herein with respect to the host-side PCB 605, 2015 of the power tool 104, 1705. The housing 2510 of the transmitting device 106 may include a compartment similar to the compartment 405, 1910 of the power tool 104, 1705 (e.g., including the enclosure 1920). Accordingly, the transmitting device 106 is configured to be a host device to receive and couple to the insertable wireless communication device 610, 1905 in a similar manner as the power tool device 104, 1705, 1805. In other words, the insertable wireless communication device 610, 1905 is configured to be interchangeably inserted into the power tool 104, 1705, 1805 or the transmitting device 106. In some embodiments, the transmitting device 106 and the power tool device 104, 1705, 1805 are configured to receive any one of multiple different types of insertable communication devices 610, 1905 that have the same physical design and connector 905, 2025. For example, FIGS. 14A-14I illustrate insertable wireless communication devices 610, 1905 with the same physical design and connector 905, 2025 but with different functional/communication capabilities. For example, a first insertable wireless communication device 610, 1905 is configured to wirelessly communicate with the external device 108 using short-range radio communication using a first communication protocol (e.g., Bluetooth®) while a second insertable wireless communication device 610, 1905 is configured to wirelessly communicate with the external device 108 and/or the server 112 using long-range radio communication (e.g., over a cellular network, the Internet, or the like) using a second communication protocol different from the first communication protocol. In some embodiments, the second insertable wireless communication device 610, 1905 may additionally be configured to communicate with the external device 108 using short-range radio communication using the first communication protocol.

In some embodiments, the components of the transmitting device 106 are similar to those of the host-side PCB 605, 2015 of the power tool 104, 1705, and the explanation previously herein of the components of the host-side PCB 605, 2015 applies to the transmitting device 106. For example, when an insertable wireless communication device 610, 1905 is coupled to the transmitting device 106, the energy storage device 2615 provides power to the components of the insertable wireless communication device 610, 1905 to, for example, allow the insertable wireless communication device 610, 1905 to communicate with the external device 108 and/or the server 112. In some embodiments, the insertable wireless communication device 610, 1905 may retrieve a transmitting device identifier from the memory 2610 of the transmitting device 106 and periodically broadcast the transmitting device identifier for tracking purposes in accordance with tracking methods described previously herein. The general description previously herein of electrical components of the insertable wireless communication device 610, 1905 and the host device 104, 1705, 1805 applies to like-named components of the transmitting device 106 (e.g., the general description of the functionality of an electronic processor, memory, energy storage device, and connectors or wireless communication components used in place of the connectors).

In some embodiments, the transmitting device 106 includes more or fewer electrical components in different arrangements than those shown in FIG. 26. For example, the transmitting device 106 may not include the electronic processor 2605. As another example, the transmitting device 106 may include a user input device (e.g., a button) and/or a user output device (e.g., a light-emitting diode, a speaker, etc.). As yet another example, the transmitting device 106 may include an antenna configured to be used by a transceiver of the insertable wireless communication device 610, 1905. The transmitting device 106 may also include one or more sensors such as a vibration sensor, an air quality sensor, an accelerometer or a gyroscope, or the like. In some embodiments, the transmitting device 106 includes a PCB similar to the host-side PCB 605, 2015 and on which the electrical components of FIG. 26 are mounted. In other embodiments, the transmitting device 106 includes a different PCB (e.g., a smaller PCB) or does not include a PCB at all. In some embodiments, one or more electrical components of the transmitting device 106 may be mounted within the housing of the transmitting device 106 and coupled to each other via wires. In some embodiments, the housing of the transmitting device 106 is made of a durable and light-weight plastic material. As explained previously herein with respect to other host devices, in some embodiments, the transmitting device 106 may not include a physical electrical connector. Rather, a component of the host-side PCB 2015 may be configured to wirelessly communicate with the insertable wireless communication device 1905 when the insertable wireless communication device 1905 is inserted in the transmitting device 106.

Because any given insertable wireless communication device 610, 1905 may be inserted into a number of different host devices (e.g., different power tool devices 104 and different transmitting devices 106), the insertable wireless communication device 610, 1905 may be paired with the host device 104, 106 after the insertable device 610, 1905 is inserted into a compartment 405, 1910 of a host device 104, 106. In some embodiments, pairing of the insertable device 610, 1905 and the host device 104, 106 occurs upon insertion into a compartment 405, 1910 of a host device 104, 106. For example, even if the electronic processor 226, 2605 of the host device 104, 106 is in a low power sleep mode, a component of the host-side PCB 605, 2015 recognizes that the insertable device 610, 1905 has been connected to the connector 615, 2020 and transmits a signal to wake up the electronic processor 226, 2605 of the host device 104, 106. In other embodiments, pairing of the insertable device 610, 1905 and the host device 104, 106 may not occur until the next time the electronic processor 226, 2605 of the host devices wakes up (e.g., in response to a user attempting to use the host device 104, 106 by, for example, actuating the trigger 212, 1730 or pressing a button on the transmitting device 106). In some embodiments, the insertable wireless communication device 610, 1905 does not include its own energy storage unit and, thus, does not function to track its location unless and until the insertable wireless communication device 610, 1905 is inserted into a host device 104, 106 that includes an energy storage device as described previously herein. In other words, the insertable wireless communication device 610, 1905 may not periodically broadcast beacon signals for location tracking unless and until the insertable device 610, 1905 is inserted into a host device 104, 106.

In some embodiments, the same external device 108 associated with each of the insertable wireless communication device 610, 1905 and the host device 104, 106 is used to pair the insertable device 610, 1905 and the host device 104, 106 with each other. For example, a smartphone of an owner of the insertable device 610, 1905 and the host device 104, 106 may be used by the owner to pair the insertable device 610, 1905 and the host device 104, 106 with each other.

Figure 27:
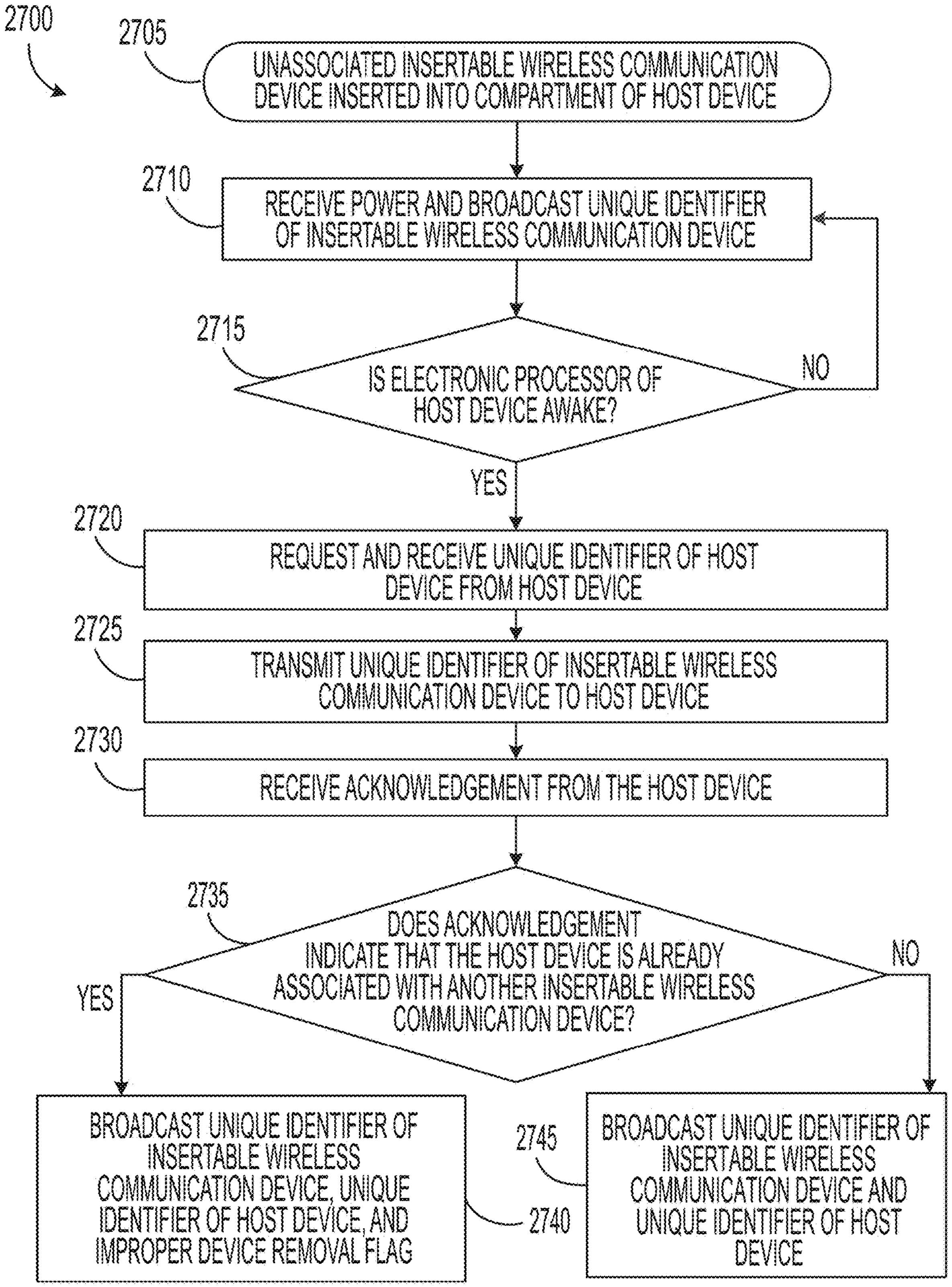
FIG. 27 illustrates a flowchart of a method performed by an unassociated insertable wireless communication device of FIG. 6, 13, or 19 inserted into the host device of FIG. 3, 17, 18, or 25A according to one example embodiment.

FIG. 27 illustrates a flowchart of a method 2700 performed by an unassociated insertable wireless communication device 610, 1905 inserted into a host device 104, 106 (at block 2705). In other words, the insertable device 610, 1905 has not been paired/associated with the host device 104, 106 or with another host device 104, 106. When the insertable device 610, 1905 is described as performing a task/function, it should be understood that the electronic processor 1305 of the insertable device 610, 1905 performs the task/function in conjunction with other appropriate components (e.g., the memory, 1310, the transceiver, 1312, and the antenna 1315). Similarly, when the host device 104, 106, the external device 108, or the server 112 is described as performing a task/function, it should be understood that one or more electronic processors of these devices performs the task/function in conjunction with other appropriate components (e.g., memory, transceiver, antenna, and the like).

At block 2710, the insertable device 610, 1905 receives power from an energy storage device 1205, 2615 of the host device 104, 106 and broadcasts a unique identifier of the insertable device 610, 1905 (e.g., periodic broadcasting at predetermined time intervals). In alternate embodiments, at block 2710, the unassociated insertable device 610, 1905 receives power but does not broadcast its unique identifier when the electronic processor 226 of the host device 104, 106 is not awake (i.e., is in a low power sleep mode). At block 2715, the insertable device 610, 1905 determines whether the electronic processor 226, 2605 of the host device 104, 106 is awake. As noted above, in some embodiments, the insertion of the insertable device 610, 1905 into the host device 104, 106 may not wake up the electronic processor 226, 2605 of the host device 104, 106. The insertable device 610, 1905 may determine that the electronic processor 226, 2605 is awake by receiving a signal from the electronic processor 226, 2605 via the host-side PCB 605, 2015 and connector 615, 2020. When the electronic processor 226, 2605 is not awake and is, instead, in a low power sleep mode, the insertable device 610, 1905 proceeds to repeat blocks 2710 and 2715 until the electronic processor 226, 2605 wakes up or until the insertable device 610, 1905 is removed from the host device 104, 106. At block 2715, when the insertable device 610, 1905 determines that the electronic processor 226, 2605 is awake (e.g., awoken in response to the trigger 212, 1730 of the host device 104, 106 being actuated by a user), the method 2700 proceeds to block 2720.

At block 2720, in response to the electronic processor 226, 2605 of the host device 104, 106 being woken up/exiting the low power sleep mode, the insertable device 610, 1905 requests and receives a unique identifier of the host device 104, 106 from the host device 104, 106. In some embodiments, the insertable device 610, 1905 stores the unique identifier of the host device 104, 106 in the memory 1310. For example, the insertable device 610, 1905 stores the unique identifier of the host device 104, 106 in a volatile memory portion of the memory 1310. Continuing this example, if the insertable device 610, 1905 is removed from the host device 104, 106 prior to being associated with the host device 104, 106, the insertable device 610, 1905 may no longer store the unique identifier of the of the host device 104, 106 because power is no longer supplied to the insertable device 610, 1905.

At block 2725, the insertable device 610, 1905 transmits the unique identifier of the insertable device 610, 1905 to the host device 104, 106. At block 2730, in response to the transmission of the unique identifier of the insertable device 610, 1905, the insertable device 610 receives an acknowledgement from the host device 104, 106 that the host device 104, 106 received the unique identifier of the insertable device 610, 1905. In some embodiments, the host device 104, 106 may not store the unique identifier of the insertable device 610, 1905 during execution of the method 2700. However, the acknowledgement provided by the host device 104, 106 to the insertable device 610, 1905 may indicate whether the host device 104, 106 is already associated with another insertable device 610, 1905.

At block 2735, the insertable device 610, 1905 determines whether the acknowledgement from the host device 104, 106 indicates that the host device is already associated with another insertable device 610, 1905. When the acknowledgement indicates that the host device 104, 106 is already associated with another insertable device 610, 1905, at block 2740, the insertable device 610, 1905 broadcasts the unique identifier of the insertable device 610, 1905, the unique identifier of the host device, and an improper device removal flag. In some embodiments, the improper device removal flag indicates that the insertable device 610, 1905 is coupled to a host device 104, 106 that is already associated/paired with another insertable device 610, 1905. In some embodiments, upon the external device 108 receiving such a broadcasted message from the insertable device 610, 1905, the external device 108 determines that the insertable device 610, 1905 previously associated with the host device 104, 106 was improperly removed from the host device 104, 106 (e.g., without performing a dissociation method as explained below with respect to FIG. 30). In response thereto, the external device 108 may transmit a message to the server 112 to instruct the server 112 to flag the previously-associated host device 104, 106 and/or the host device 104, 106 to which the insertable device 610, 1905 is currently attached as missing in a tracking database. In some embodiments, the external device 108 may also transmit a locking instruction to the insertable device 610, 1905 to relay to the electronic processor 226 of the host device 104 when the host device 104 is a power tool device 104, 1705, 1805. The locking instruction may include a unique password of the power tool device 104, 1705, 1805 and an instruction to prevent some or all operations of the power tool device 104, 1705, 1805. For example, when the power tool device 104, 1705, 1805 is locked, the motor 214 and the drive device 210, 1725 may not operate in response to the trigger 212, 1730 being actuated.

On the other hand, at block 2735, when the acknowledgement indicates that the host device 104, 106 is not already associated with another insertable device 610, 1905, the method 2700 proceeds to block 2745. At block 2745, the insertable device 610, 1905 broadcasts the unique identifier of the insertable device 610, 1905, the unique identifier of the host device, and, in some embodiments, an association request flag. The improper device removal flag is not included in the broadcast message of block 2745 because the host device 104, 106 is not already associated with another insertable device 610, 1905. In some embodiments, in response to the external device 108 receiving a broadcasted message from the insertable device 610, 1905 without the improper device removal flag, the external device 108 initiates a pairing method as shown in FIG. 28 to associate/pair the unassociated insertable device 610, 1905 with the unassociated host device 104, 106.

In some embodiments, the broadcast messages of blocks 2740 and 2745 are periodically broadcasted by the insertable device 610, 1905 until one of (i) the insertable device 610, 1905 is removed from the host device 104, 106; (ii) the host device 104, 106 re-enters the low power sleep mode; (iii) the external device 108 associates/pairs the insertable device 610, 1905 and the host device 104, 106 with each other (see FIG. 28). For example, when the insertable device 610, 1905 is removed from the host device 104, 106, the insertable device 610, 1905 may cease broadcasting messages because the insertable device 610, 1905 may no longer be coupled to an energy storage device 1205, 2615. As another example, when the host device 104, 106 re-enters the low power sleep mode without the insertable device 610, 1905 and the host device 104, 106 being associated/paired (e.g., because an external device 108 did not receive the broadcast messages when the host device 104, 106 was awake or because a user did not initiate the association/pairing process of FIG. 28 using the external device 108), the method 2700 proceeds back to block 2710 to repeat the method 2700. In other words, an unassociated insertable device 610, 1905 may execute blocks 2720 through 2745 each time the electronic processor 226 of the host device wakes up from the low power sleep mode. As another example, when an external device 108 receives a broadcasted message from an unassociated insertable device 610, 1905 indicating that the insertable device 610, 1905 is coupled to an unassociated host device 104, 106, the external device 108 initiates a pairing method as shown in FIG. 28 to associate/pair the unassociated insertable device 610, 1905 with the unassociated host device 104, 106.

Figure 28:
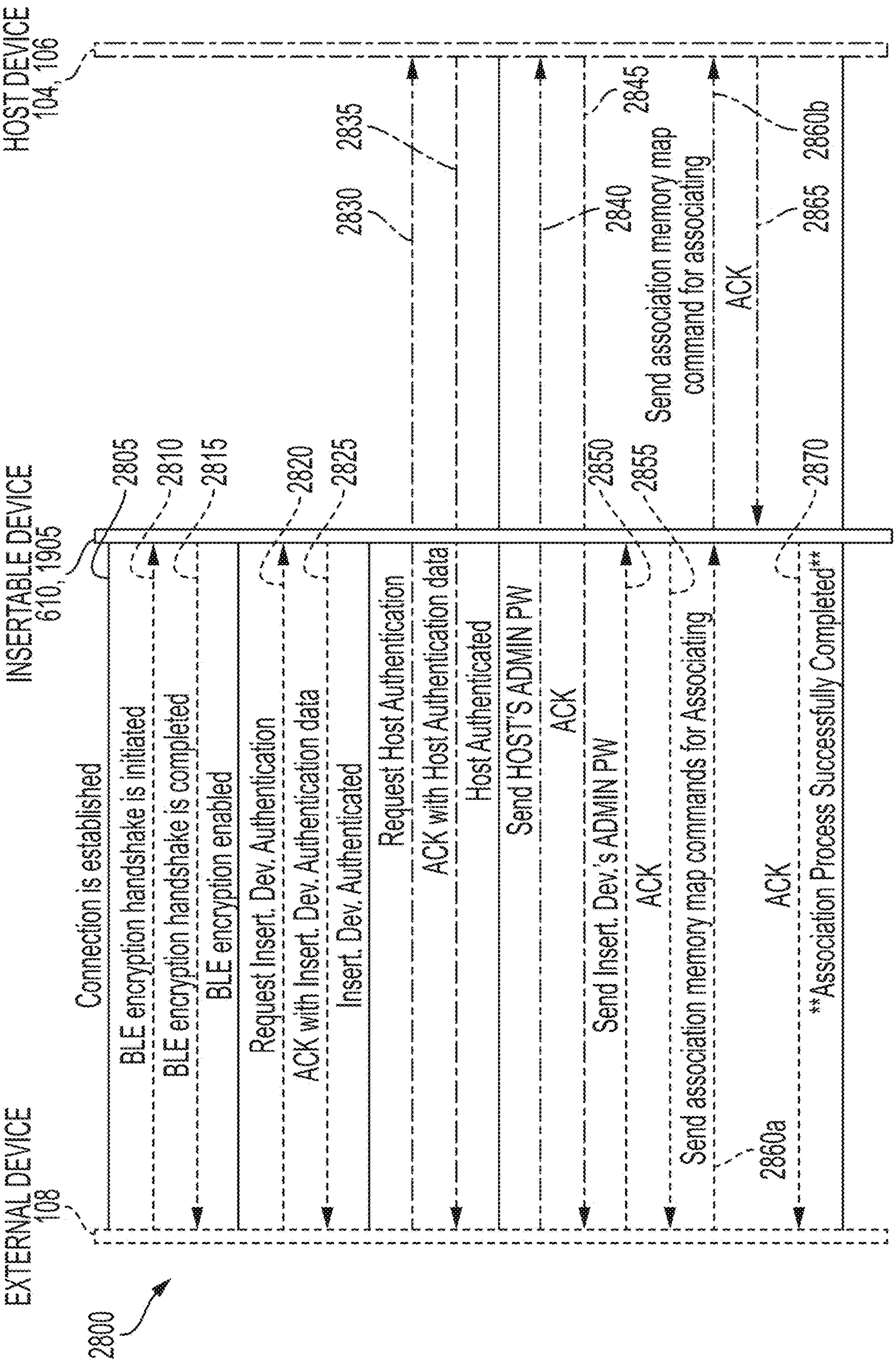
FIG. 28 illustrates a flow diagram that shows communications between an external device of the communication system of FIG. 1, the insertable device of FIG. 6, 13, or 19 and the host device of FIG. 3, 17, 18, or 25A during an association/pairing process according to one example embodiment.

FIG. 28 illustrates a flow diagram 2800 that shows communications between the external device 108, the insertable device 610, 1905, and the host device 104, 106 during an association/pairing process. In the example flow diagram 2800, the insertable device 610, 1905 and the host device 104, 106 are not associated/paired with each other or with other devices, and the user desires to associate/pair these devices with each other. For example, the user may initiate the association/pairing process via a user input on the external device 108.

At step 2805, the external device 108 receives a broadcast message from the insertable device 610, 1905 and establishes a communicative connection between the external device 108 and the insertable device 610, 1905. At step 2810, the external device initiates an encryption handshake (e.g., a Bluetooth® low energy encryption handshake) with the insertable device 610, 1905. At step 2815, the insertable device 610, 1905 responds to the external device 108 to complete the encryption handshake and enable encrypted communication between the external device 108 and the insertable device 610, 1905. In some embodiments, the BLE encryption handshake at steps 2810 and 2815 may not occur or may only occur for an initial communication between the insertable device 610, 1905 and the external device 108 after which future communication between the insertable device 610, 1905 and the external device 108 will be encrypted based on the BLE encryption handshake from the initial communication.

At step 2820, the external device 108 requests insertable device authentication data from the insertable device 610, 1905. At step 2825, the external device 108 receives the insertable device authentication data from the insertable device 610, 1905. In some embodiments, the external device 108 verifies that the insertable device authentication data is consistent with product data stored locally at the external device 108. In some embodiments, the external device 108 communicates with the server 112 to verify that the insertable device authentication data is consistent with product data stored at the server 112. Once the external device 108 verifies that the insertable device authentication data is consistent with stored product data, the insertable device 610, 1905 is authenticated (e.g., verified to be a product supported by the communication system 100).

Similar authentication steps are then performed between the external device 108 and the host device 104, 106 using the insertable device 610, 1905 to relay messages between the external device 108 and the host device 104, 106. At step 2830, the external device 108 requests host device authentication data from the host device 104, 106. At step 2835, the external device 108 receives the host device authentication data from the host device 104, 106. The external device 108 may verify that the host device authentication data is consistent with stored product data in a similar manner as described above with respect to authenticating the insertable device 610, 1905. Once the external device 108 verifies that the host device authentication data is consistent with stored product data, the host device 104, 106 is authenticated (e.g., verified to be a product supported by the communication system 100).

At step 2840, the external device 108 transmits an administrative password of the host device 104, 106 to the host device 104, 106 via the insertable device 610, 1905. In some embodiments, the transmitted administrative password of the host device 104, 106 matches an administrative password stored in the memory 232, 2610 of the host device 104, 106 at the time of manufacturing of the host device 104, 106. In some embodiments, the external device 108 retrieves the administrative password of the host device 104, 106 to be transmitted using the unique identifier of the host device 104, 106 included in the previously-received broadcast message. For example, the external device 108 requests the administrative password of the host device 104, 106 from the server 112 using the unique identifier of the host device 104, 106. In some embodiments, the server 112 only provides the administrative password to the external device 108 if the external device 108 has proper permissions. For example, the host device 104, 106 must be owned by an entity who has signed into an application running on the external device 108 such that the ownership information of the external device 108 matches the ownership information of the host device 104, 106 stored at the server 112. This ownership information may be previously stored at the server 112 (e.g., upon purchasing the host device 104, 106 and upon downloading and creating an account on the application that is being executed on the external device 108). At step 2845, the external device 108 receives acknowledgement from the host device 104, 106 that the host device 104, 106 has received the administrative password of the host device 104, 106. In response to receiving its administrative password, the host device 104, 106 is configured to receive association information to be associated/paired with the insertable device 610, 1905. For security purposes, the host device 104, 106 may not accept or act on association/pairing information unless and until the host device 104, 106 has received its administrative password.

Steps 2850 and 2855 are similar to steps 2840 and 2845 but are performed by the external device 108 with respect to the insertable device 610, 1905 instead of the host device 104, 106. At block 2850, the external device 108 transmits an administrative password of the insertable device 610, 1905 to the insertable device 610, 1905. At step 2855, the external device 108 receives acknowledgement from the insertable device 610, 1905 that the insertable device 610, 1905 has received the administrative password of the insertable device 610, 1905. In response to receiving its administrative password, the insertable device 610, 1905 is configured to receive association information to be associated/paired with the host device 104, 106. For security purposes, the insertable device 610, 1905 may not accept or act on association/pairing information unless and until the insertable device 610, 1905 has received its administrative password.

At step 2860*a*, the external device 108 transmits a first memory map command and a second memory map command to the insertable device 610, 1905. The first memory map command may be intended for the host device 104, 106. Accordingly, at step 2860*b*, the insertable device 610, 1905 forwards the first memory map command to the host device 104, 106. In response to receiving the first memory command, the host device 104, 106 changes its association status to be "associated" (e.g., by setting a flag in the memory 232, 2610) and stores the unique identifier of the insertable device 610, 1905 in the memory 232, 2610. In some embodiments, the unique identifier of the insertable device 610, 1905 is received along with the first memory map command. In other embodiments, the unique identifier of the insertable device 610, 1905 is known from previous communication with the insertable device 610, 1905 (see blocks 2725 and 2730 of FIG. 27). By changing its association status and storing the unique identifier of the insertable device 610, 1905, the host device 104, 106 is associated/paired with the insertable device 610, 1905.

After performing these association tasks, at step 2865, the host device 104, 106 transmits an acknowledgement message to the insertable device 610, 1905 to acknowledge receipt of the first memory map command and to confirm that the association tasks were performed. In response to receiving the acknowledgement message from the host device 104, 106, the insertable device 610, 1905 performs similar association tasks that are prompted by the previously-received second memory map command. For example, the insertable device 610, 1905 changes its association status to be "associated" (e.g., by setting a flag in the memory 1310) and stores the unique identifier of the host device 104, 106 in the memory 1310. In some embodiments, the unique identifier of the host device 104, 106 is known from previous communication with the host device 104, 106 (see block 2720 of FIG. 27). By changing its association status and storing the unique identifier of the host device 104, 106, the insertable device 610, 1905 is associated with the host device 104, 106.

After performing these association tasks, at step 2870, the insertable device 610, 1905 transmits an acknowledgement message to the external device 108 to acknowledge receipt of the first memory map command and the second memory map command and to confirm that the association tasks were performed by both the host device 104, 106 and the insertable device 610, 1905. In response to receiving this association acknowledgement message from the insertable device 610, 1905, the external device 108 communicates with the server 112 to update a database at the server 112 (e.g., a tracking database) to store information to indicate that the host device 104, 106 and the insertable device 610, 1905 are associated/paired with each other. In some embodiments, the external device 108 also updates its own memory 130 to store information to indicate that the host device 104, 106 and the insertable device 610, 1905 are associated/paired with each other.

Once the insertable device 610, 1905 and the host device 104, 106 have been associated/paired with each other, the associated/paired insertable device 610, 1905 periodically broadcasts beacon signals including the stored unique identifier of the host device 104, 106 rather than the unique identifier of the insertable device 610, 1905. These beacon signals may be received by nearby external devices 108 and may be used for location tracking as described previously herein. When the location of the host device 104, 106 is updated in the tracking database at the server 112, the server 112 may also update a location of the insertable device 610, 1905 that is associated/paired with the host device 104, 106. In some embodiments, an associated/paired insertable device 610, 1905 periodically broadcasts beacon signals whenever it is coupled to any host device 104, 106 regardless of whether the electronic processor 226, 2605 of the host device 104, 106 is awake or in a low power sleep mode.

Figure 29:
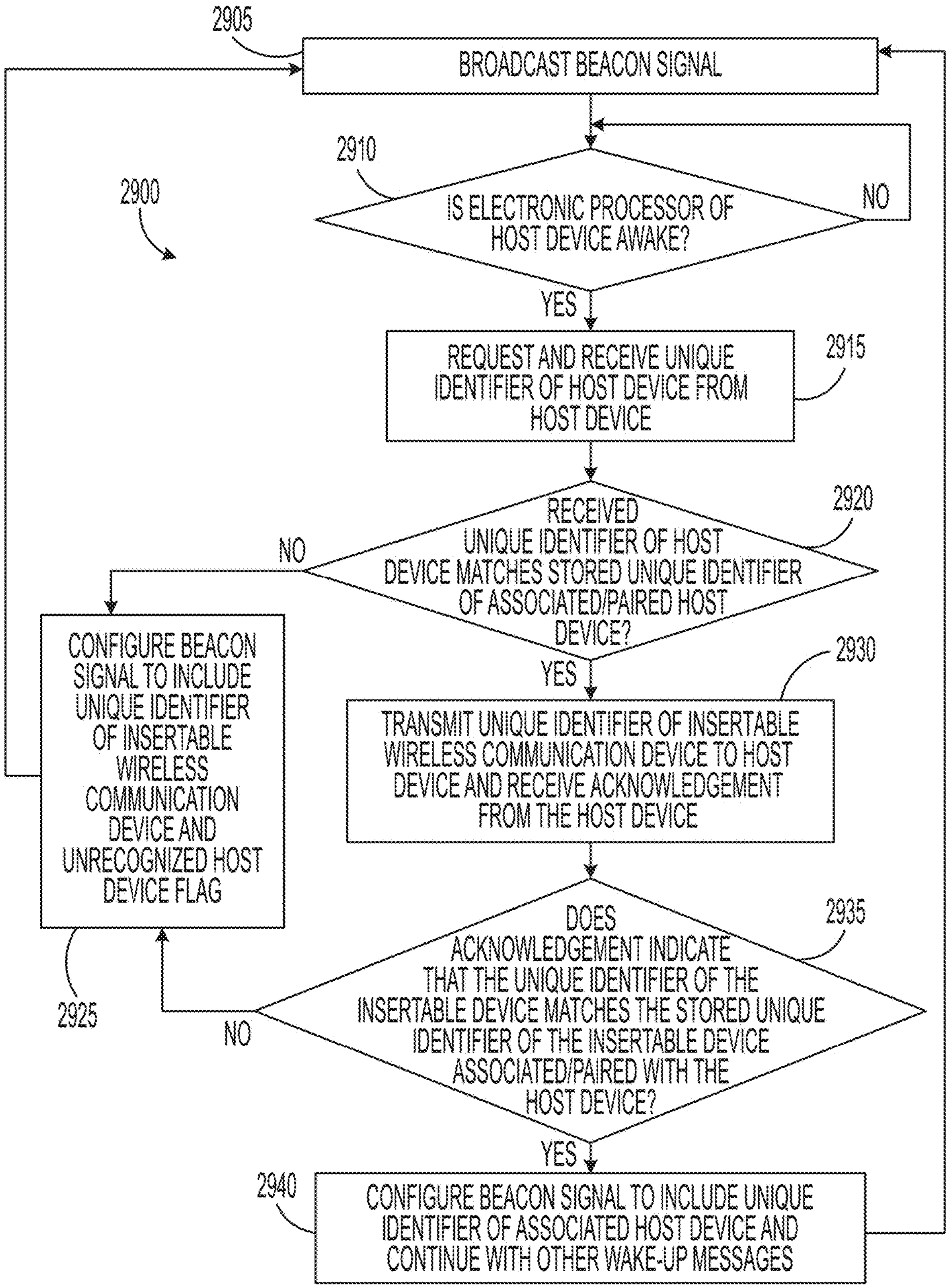
FIG. 29 illustrates a flowchart of a method performed by an associated/paired insertable wireless communication device of FIG. 6, 13, or 19 inserted into the host device of FIG. 3, 17, 18, or 25A according to one example embodiment.

FIG. 29 illustrates a flowchart of a method 2900 performed by an associated/paired insertable wireless communication device 610, 1905 inserted into a host device 104, 106. In other words, the insertable device 610, 1905 has been previously paired/associated with the host device 104, 106 to which the insertable device 610, 1905 is currently coupled or has been previously paired/associated with another host device 104, 106 (see pairing method 2800 of FIG. 28).

At block 2905, the insertable device 610, 1905 broadcasts a beacon signal. For example, the beacon signal includes the unique identifier of the host device 104, 106 to which the insertable device 610, 1905 has been associated/paired. In some embodiments, the insertable device 610, 1905 periodically broadcasts this beacon signal even when the electronic processor 226, 2605 of the host device 104, 106 to which the insertable device 610, 1905 is coupled is in a low power sleep mode.

At block 2910, the insertable device 610, 1905 determines whether the electronic processor 226, 2605 of the host device 104, 106 is awake (similar to block 2715 of FIG. 27). When the electronic processor 226, 2605 remains in the low power sleep mode, the method 2900 proceeds back to block 2905 to continue to periodically broadcast the beacon signal until the electronic processor 226, 2605 of the host device 104, 106 wakes up. At block 2910, when the insertable device 610, 1905 determines that the electronic processor 226, 2605 of the host device 104, 106 has woken up, at block 2915, the insertable device 610, 1905 requests and receives a unique identifier of the host device 104, 106 to which the insertable device 610, 1905 is coupled.

At block 2920, the insertable device 610, 1905 determines whether the received unique identifier of the host device 104, 106 to which the insertable device 610, 1905 is coupled matches a stored unique identifier of a host device 104, 106 to which the insertable device 610, 1905 is currently associated/paired. In other words, the insertable device 610, 1905 determines whether the received unique identifier matches the stored unique identifier that the insertable device 610, 1905 is currently broadcasting in its beacon signals. The determination at block 2920 allows the insertable device 610, 1905 to determine whether the insertable device 610, 1905 is still inserted into the host device 104, 106 with which it is associated/paired (if the unique identifiers match) or whether the insertable device 610, 1905 has been inserted into another host device 104, 106 with which it is not associated/paired (if the unique identifiers do not match).

At block 2920, when the received unique identifier does not match the stored unique identifier, the method 2900 proceeds to block 2925. At block 2925, the insertable device 610, 1905 adjusts the broadcasted beacon signal to configure the beacon signal to include the unique identifier of the insertable device 610, 1905 rather than the unique identifier of the host device 104, 106 with which the insertable device 610, 1905 is associated/paired. The adjusted beacon signal at block 2925 also includes an unrecognized host device flag configured to indicate that the associated/paired insertable device 610, 1905 is coupled to a host device 104, 106 with which it is not associated/paired. In other words, the insertable device 610, 1905 is coupled to an improper host device 104, 106 and has not been disassociated from a previously-associated/paired host device 104, 106 (see FIG. 30). In some embodiments, the beacon signal at block 2925 may also include the unique identifier of the previously-associated/paired host device 104, 106 and/or a unique identifier of the unrecognized host device 104, 106 to which the insertable device 610, 1905 is currently coupled.

In response to receiving such a broadcast message from the insertable device 610, 1905, the external device 108 may communicate with the server 112 to flag the previously-associated/paired host device 104, 106 as missing. In turn, the server 112 may provide a "missing host device" notification to an external device 108 of an owner of the previously-associated/paired host device 104, 106. In some embodiments, the external device 108 that received the beacon signal with the unrecognized host device flag transmits a lock instruction to the improper host device 104, 106 via the insertable device 610, 1905 to lock/prevent functionality of the improper host device 104, 106. In some embodiments, the lock instruction includes an administrative password retrieved from the server 112 and is sent based on settings stored in the server 112. For example, in response to receiving communication from the external device 108 indicating that the associated/paired insertable device 610, 1905 is coupled to an improper host device 104, 106, the server 112 may instruct the external device 108 to transmit the lock instruction, via the insertable device 610, 1905, to the improper host device 104, 106 if the owner of the improper host device 104, 106 has stored security settings at the server 112 indicating that such a lock instruction should be sent in such a situation.

Returning to block 2920, when the received unique identifier of the attached host device 104, 106 matches the stored unique identifier of the associated/paired host device 104, 106, the method 2900 proceeds to block 2930. At block 2930, the insertable device 610, 1905 transmits the unique identifier of the insertable device 610, 1905 to the host device 104, 106. Also at block 2930, the insertable device 610, 1905 receives acknowledgement from the host device 104, 106 that the host device 104, 106 received the unique identifier of the insertable device 610, 1905. In some embodiments, the host device 104, 106 compares the received unique identifier of the insertable device 610, 1905 to a stored unique identifier of an insertable device 610, 1905 with which the host device 104, 106 is currently associated/paired. This determination allows the host device 104, 106 to determine whether the insertable device 610, 1905 currently inserted into the host device 104, 106 is the same as the insertable device 610, 1905 with which the host device 104, 106 is associated/paired (if the unique identifiers match) or whether the associated/paired insertable device 610, 1905 has been removed and an unassociated/unpaired insertable device 610, 1905 has been inserted into the host device 104, 106 (if the unique identifiers do not match). The acknowledgement signal from host device 104, 106 to the insertable device 610, 1905 at block 2930 may include an indication of whether the received unique identifier of the insertable device 610, 1905 matched the stored unique identifier of an insertable device 610, 1905 with which the host device 104, 106 is currently associated/paired. In some embodiments, when the received unique identifier of the insertable device 610, 1905 does not match the stored unique identifier of an insertable device 610, 1905 with which the host device 104, 106 is currently associated/paired, the host device 104, 106 locks/prevents operation of itself as a security feature. Similarly, when an electronic processor 226, 2605 of an associated/paired host device 104, 106 wakes up and is unable to communicate with its associated insertable device 610, 1905 (e.g., because the insertable device 610, 1905 has been removed without initiating the disassociation/de-pairing process (see FIG. 30), the host device 104, 106 may lock/prevent operation of itself as a security feature.

At block 2935, the insertable device 610, 1905 determines whether the acknowledgement message from the host device 104, 106 indicates that the received unique identifier of the insertable device 610, 1905 matches the stored unique identifier of an insertable device 610, 1905 with which the host device 104, 106 is currently associated/paired. When the acknowledgement message from the host device 104, 106 indicates that the received unique identifier and the stored unique identifier do not match, the method 2900 proceeds to block 2925 to adjust the broadcasted beacon signal of the insertable device 610, 1905 as described previously herein. On the other hand, when the acknowledgement message from the host device 104, 106 indicates that the received unique identifier and the stored unique identifier match, the method 2900 proceeds to block 2940. At block 2940, the insertable device 610, 1905 configures its beacon signal to include the unique identifier of the its associated/paired host device 104, 106. In situations where such a beacon signal was already being broadcast, the insertable device 610, 1905 merely continues broadcasting the beacon signal. Also at block 2940, the insertable device 610, 1905 continues to receive and transmit other messages associated with the wake-up of the electronic processor 226, 2605 from the low power sleep state.

As indicated in FIG. 29, after execution of the blocks 2925 or 2940, the method 2900 proceeds back to block 2905 to continue periodically broadcasting beacon signals. For example, after the electronic processor 226, 2605 of the host device 104, 106 has re-entered the low power sleep state (e.g., after performance of an operation of the power tool device 104 in response to user actuation of the trigger 212, 1730), the insertable device 610, 1905 continues to periodically broadcast beacon signals. Through repetition of the method 2900, the insertable device 610, 1905 is configured continue broadcasting beacon signals based on a most recent comparison of the unique identifier of the insertable device 610, 1905 and the unique identifier of the host device 104, 106 to which the insertable device 610, 1905 is coupled. For example, each time the electronic processor 226, 2605 of the host device 104, 106 wakes up, the insertable device 610, 1905 performs blocks 2915 through 2940 (as applicable) to determine whether the associated/paired insertable device 610, 1905 is coupled to its proper associated/paired host device 104, 106. Based on this determination, the insertable device 610, 1905 configures the beacon signal as explained with respect to blocks 2925 and 2940 and then continues to periodically broadcast the beacon signal for receipt by external devices 108 within communication range.

Figure 30:
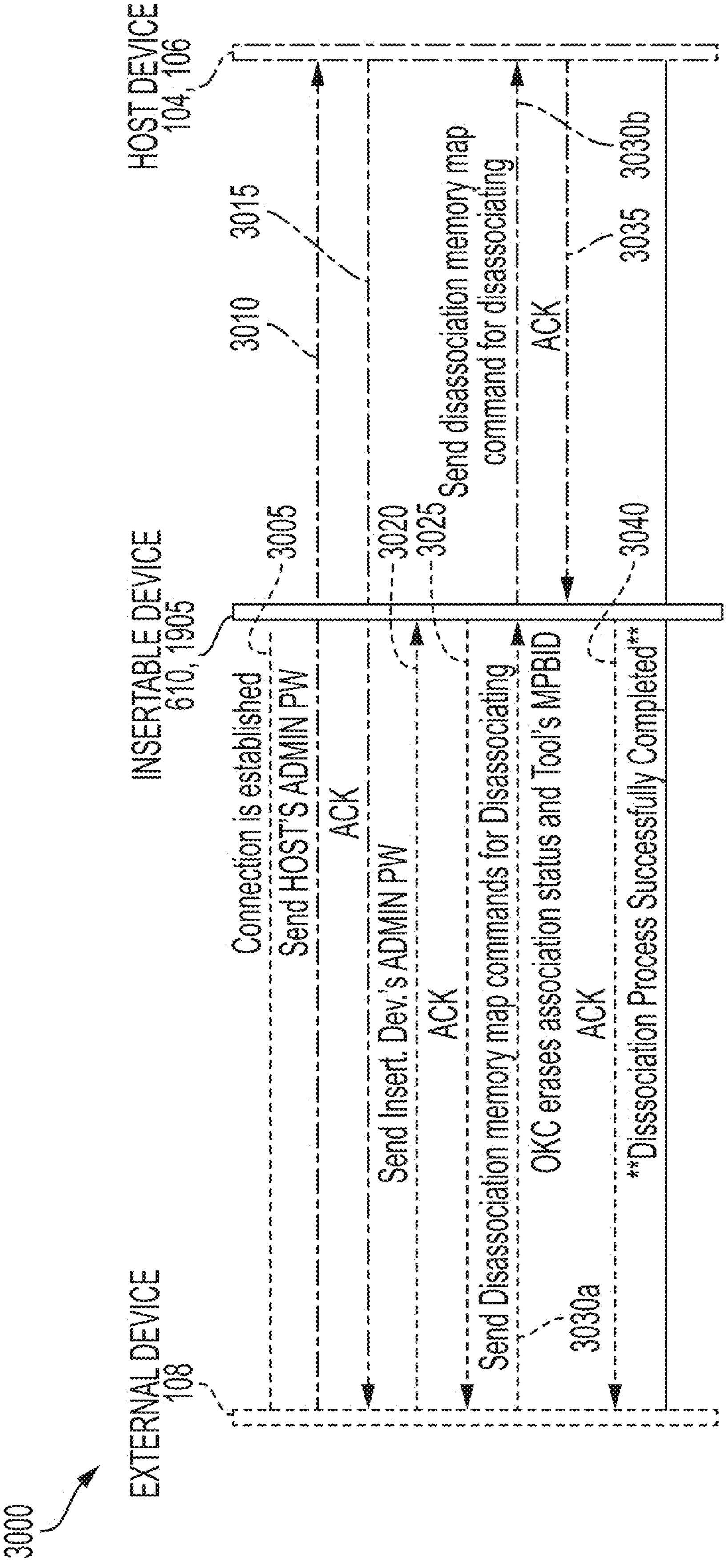
FIG. 30 illustrates a flow diagram that shows communications between an external device of the communication system of FIG. 1, the insertable wireless communication device of FIG. 6, 13, or 19 and the host device of FIG. 3, 17, 18, or 25A during a disassociation/de-pairing process according to one example embodiment.

FIG. 30 illustrates a flow diagram 3000 that shows communications between the external device 108, the insertable device 610, 1905, and the host device 104, 106 during a disassociation/de-pairing process. In the example flow diagram 3000, the insertable device 610, 1905 and the host device 104, 106 have been previously associated/paired with each other, and the user desires to disassociate/de-pair these devices. For example, the user may initiate the disassociation/de-pairing process via a user input on the external device 108. A user may desire to remove and disassociate a previously-associated insertable device 610, 1905 from a host device 104, 106 for a number of different reasons. For example, the user may desire to replace the insertable device 610, 1905 with a newer or upgraded insertable device 610, 1905. As another example, the user may desire to use the host device 104, 106 on a secure job site that restricts the use of any radio frequency communication device.

Many of the steps in the flow diagram 3000 of FIG. 30 are similar to steps of the flow diagram 2800 of FIG. 28 that illustrates the association/pairing process of the insertable device 610, 1905 and the host device 104, 106. The above explanation of these steps with respect to FIG. 28 applies below to the similar steps of FIG. 30.

At step 3005, the external device 108 receives a broadcasted beacon message from the insertable device 610, 1905 and establishes a communicative connection between the external device 108 and the insertable device 610, 1905 (similar to step 2805 of FIG. 28). At step 3010, the external device 108 transmits an administrative password of the host device 104, 106 to the host device 104, 106 via the insertable device 610, 1905 (similar to step 2840 of FIG. 28). At step 3015, the external device 108 receives acknowledgement from the host device 104, 106 that the host device 104, 106 has received its administrative password (similar to step 2840 of FIG. 28). In response to receiving its administrative password, the host device 104, 106 is configured to receive disassociation information to be disassociated/de-paired with the insertable device 610, 1905. For security purposes, the host device 104, 106 may not accept or act on disassociation/de-pairing information unless and until the host device 104, 106 has received its administrative password.

Steps 3020 and 3025 are similar to steps 3010 and 3015 but are performed by the external device 108 with respect to the insertable device 610, 1905 instead of the host device 104, 106. At block 3020, the external device 108 transmits an administrative password of the insertable device 610, 1905 to the insertable device 610, 1905 (similar to step 2850 of FIG. 28). At step 3025, the external device 108 receives acknowledgement from the insertable device 610, 1905 that the insertable device 610, 1905 has received its administrative password (similar to step 2855 of FIG. 28). In response to receiving its administrative password, the insertable device 610, 1905 is configured to receive disassociation information to be disassociated/de-paired with the host device 104, 106. For security purposes, the insertable device 610, 1905 may not accept or act on association/pairing information unless and until the insertable device 610, 1905 has received its administrative password.

At step 3030*a*, the external device 108 transmits a first memory map command and a second memory map command to the insertable device 610, 1905 (similar to step 2860*a* of FIG. 28). The first memory map command may be intended for the host device 104, 106. Accordingly, at step 3030*b*, the insertable device 610, 1905 forwards the first memory map command to the host device 104, 106 (similar to step 2860*b* of FIG. 28). In response to receiving the first memory command, the host device 104, 106 changes its association status to be "disassociated" (e.g., by setting a flag in the memory 232, 2610) and erases the unique identifier of the insertable device 610, 1905 from the memory 232, 2610. By changing its association status and erasing the unique identifier of the insertable device 610, 1905, the host device 104, 106 is disassociated/de-paired from the insertable device 610, 1905.

After performing these disassociation tasks, at step 3035, the host device 104, 106 transmits an acknowledgement message to the insertable device 610, 1905 to acknowledge receipt of the first memory map command and to confirm that the disassociation tasks were performed (similar to step 2865 of FIG. 28). In response to receiving the acknowledgement message from the host device 104, 106, the insertable device 610, 1905 performs similar disassociation tasks that are prompted by the previously-received second memory map command. For example, the insertable device 610, 1905 changes its association status to be "disassociated" (e.g., by setting a flag in the memory 1310) and erases the unique identifier of the host device 104, 106 from the memory 1310. By changing its association status and erasing the unique identifier of the host device 104, 106, the insertable device 610, 1905 is disassociated/de-paired from the host device 104, 106.

After performing these disassociation tasks, at step 3040, the insertable device 610, 1905 transmits an acknowledgement message to the external device 108 to acknowledge receipt of the first memory map command and the second memory map command and to confirm that the disassociation tasks were performed by both the host device 104, 106 and the insertable device 610, 1905 (similar to step 2870 of FIG. 28). In response to receiving this disassociation acknowledgement message from the insertable device 610, 1905, the external device 108 communicates with the server 112 to update a database at the server 112 to store information to indicate that the host device 104, 106 and the insertable device 610, 1905 have been disassociated/de-paired from each other. In some embodiments, the external device 108 also updates its own memory 130 to store information to indicate that the host device 104, 106 and the insertable device 610, 1905 have been disassociated/de-paired with each other.

Once the insertable device 610, 1905 and the host device 104, 106 have been disassociated/de-paired with each other, the insertable device 610, 1905 periodically broadcasts beacon signals as an unassociated insertable device 610, 1905 as explained above with respect to FIG. 27.

Figure 31:
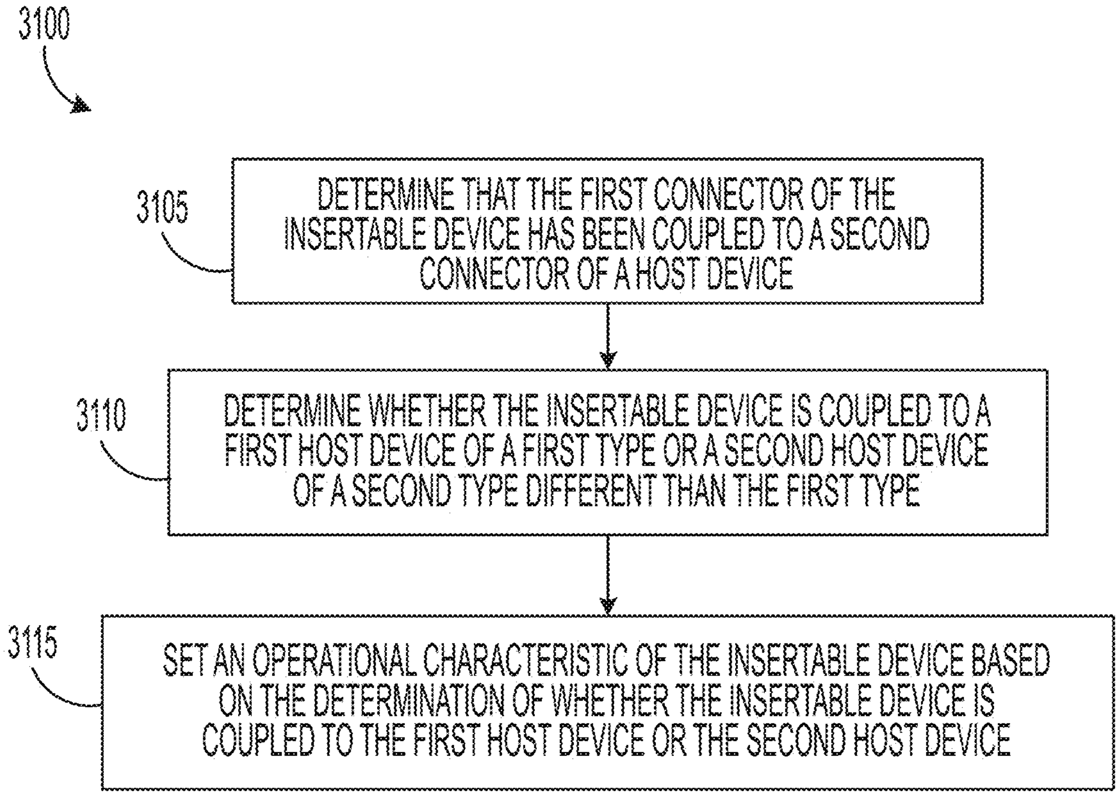
FIG. 31 illustrates a flowchart of a method performed by the insertable wireless communication device of FIG. 6, 13, or 19 inserted into the host device of FIG. 3, 17, 18, or 25A in one example embodiment.

In some embodiments, the insertable device 610, 1905 may set different operational parameters depending on a type of host device 104, 106, 1705, 1805 to which the insertable device 610, 1905 is coupled and associated/paired. FIG. 31 illustrates a flowchart of a method 3100 performed by an insertable wireless communication device 610, 1905 inserted into a host device 104, 106, 1705, 1805 in one example embodiment. In some embodiments, the insertable device 610, 1905 performs the method 3100 after the insertable device 610, 1905 has been associated/paired with the host device 104, 106, 1705, 1805. In some embodiments, the insertable device 610, 1905 uses identification information that was received in the association/pairing process (e.g., the unique identifier of the host device 104, 106, 1705, 1805) when performing the method 3100.

At block 3105, the electronic processor 1305 of the insertable device 610, 1905 determines that the first connector 2025 of the insertable device 610, 1905 has been coupled to a second connector 2020 of a host device 104, 106, 1705, 1805. The electronic processor 1305 may make this determination in response to receiving signals via the connector 2025 that indicates that an electronic processor 226, 2605 of the host device 104, 106, 1705, 1805 has woken up from a low power sleep mode (e.g., in response to user actuation of the trigger 212, 1730). As explained previously herein, in some embodiments, the connectors 2020 and 2025 may not be included and a component of the insertable device 610, 1905 may be configured to wirelessly communicate with the a host device 104, 106, 1705, 1805 when the insertable device 610, 1905 is inserted in the host device 104, 106, 1705, 1805. In such embodiments, at block 3105, the first electronic processor 1305 of the insertable device 610, 1905 may determine that the insertable device 610, 1905 has been coupled to a host device 104, 106, 1705, 1805 by detecting the presence of a wireless communication device of the host device 104, 106, 1705, 1805 (e.g., by interrogating the wireless communication device or being interrogated by the wireless communication device).

At block 3110, in response to determining that the first connector 2025 has been coupled to the second connector 2020, the electronic processor 1305 determines whether the insertable device 610, 1905 is coupled to a first host device 104, 106, 1705, 1805 of a first type or a second host device 104, 106, 1705, 1805 of a second type different than the first type. In some embodiments, the electronic processor 1305 receives identification data from the host device electronic processor 226, 2605 and determines whether the insertable device 610, 1905 is coupled to the first host device 104, 106, 1705, 1805 or the second host device 104, 106, 1705, 1805 based on the identification data. For example, the identification data includes a unique identifier of the host device 104, 106, 1705, 1805 as described previously herein. As another example, the identification data includes a platform identifier that more generally identifies a type of host device 104, 106, 1705, 1805. In some embodiments, the platform identifier allows the insertable device 610, 1905 to determine whether the host device 104, 106, 1705, 1805 is, for example, a twelve Volt power tool 104, an eighteen Volt power tool 104, a twenty-eight Volt power tool 104, a transmitting device 106 configured to be secured to an object to be tracked, or the like. As indicated by the above examples, the received identification data may identify an approximate size of a power supply or of a backup battery of the host device 104, 106, 1705, 1805. In some embodiments, the memory 1310 of the insertable device 610, 1905 may include a look-up table that is accessed by the electronic processor 1305 to determine a type of host device 104, 106, 1705, 1805 based on the received identification data. In other embodiments, the insertable device 610, 1905 wirelessly transmits the received identification data to an external device 108. The insertable device 610, 1905 then wirelessly receives an indication of the type of host device 104, 106, 1705, 1805 to which the insertable device 610, 1905 is coupled from the external device 108. For example, the external device 108 is configured to determine the type of host device 104, 106, 1705, 1805 to which the insertable device 610, 1905 is coupled based on the identification data. For example, the electronic processor 114 of the external device 108 accesses a look-up table stored in the memory 130 of the external device 108 or communicates with the server 112 to determine the type of host device 104, 106, 1705, 1805 based on the identification data of the host device 104, 106, 1705, 1805. In some embodiments, the indication of the type of host device 104, 106, 1705, 1805 from the external device 108 includes an instruction to set an operational characteristic of the insertable device 610, 1905 at a predetermined value (see block 3115).

At block 3115, the electronic processor 1305 sets an operational characteristic of the insertable device 610, 1905 based on the determination of whether the insertable device 610, 1905 is coupled to the first host device 104, 106, 1705, 1805 of the first type or the second host device 104, 106, 1705, 1805 of the second type. In some embodiments, the operational characteristic of the insertable device is set differently when the insertable device 610, 1905 is coupled to the first host device 104, 106, 1705, 1805 than when the insertable device 610, 1905 is coupled to the second host device 104, 106, 1705, 1805.

For example, the operational characteristic includes a low power capacity threshold of a power source configured to provide power to the insertable device 610, 1905 when the insertable device 610, 1905 is coupled to the host device 104, 106, 1705, 1805. The insertable device 610, 1905 may be configured to enter a low power mode in response to determining that a state of charge of the power source of the host device 104, 106, 1705, 1805 is below the low power capacity threshold. In the low power mode, the insertable device 610, 1905 may be configured to attempt to reduce power consumption in any number of ways. For example, the insertable device 610, 1905 may decrease a rate at which the insertable device 610, 1905 wirelessly broadcasts an identification beacon signal. As another example, the insertable device 610, 1905 may disable use of relatively high-power components (e.g., cellular communication transceiver 1415 and GPS transceiver 1420) that may consume more power than other relatively low-power components (e.g., BLE transceiver 1405).

Based on the size of the power source of the host device 104, 106, 1705, 1805 as determined based on the type of host device 104, 106, 1705, 1805, the insertable device 610, 1905 may adjust its low power capacity threshold that affects when the insertable device 610, 1905 enters the low power mode. In a similar manner, for types of host devices 104, 106, 1705, 1805 that include larger power sources (e.g., a high voltage battery pack), the insertable device 610, 1905 may perform more actions that consume more energy (e.g., use of cellular and GPS capabilities for location tracking, more frequent periodic use of cellular and GPS capabilities for location tracking, use of Wi-Fi capabilities for location tracking, and the like) than for types of host devices 104, 106, 1705, 1805 that include smaller power sources (e.g., a coin cell battery included in the transmitting device 106). In some embodiments, rather than using GPS capabilities of the insertable device 610, 1905 for location tracking, the insertable device 610, 1905 may be configured to use less energy for location tracking when the insertable device 610, 1905 is connected to host devices 104, 106, 1705, 1805 that include smaller power sources. For example, the insertable device 610, 1905 may use Bluetooth® capabilities to periodically broadcast an identification that may be recognized by nearby external devices 108 (e.g., smart phones) that, in turn, provide their own location as an approximation for the location of the insertable device 610, 1905 in response to recognizing the identification from the insertable device 610, 1905. In other words, the operational characteristic of the insertable device 610, 1905 set by the electronic processor 1305 based on the determination of whether the insertable device 610, 1905 is coupled to the first host device 104, 106, 1705, 1805 of the first type or the second host device 104, 106, 1705, 1805 of the second type may be a type of communication protocol used by the insertable device 610, 1905 to communicate with one or more external devices 108 and/or servers 112 (e.g., for location tracking of the insertable device 610, 1305).

The above-noted operational characteristics of the insertable device 610, 1905 and the characteristics of the host device 104, 106, 1705, 1805 are merely examples. Other operational characteristics of the insertable device 610, 1905 may be adjusted based on the type of host device 104, 106, 1705, 1805. Similarly, other characteristics of the host device 104, 106, 1705, 1805 may cause the insertable device 610, 1905 to alter its operational characteristics.

In some embodiments, the connector 615, 2020 of the host device is additionally configured to electrically and physically couple to an external device 108 (e.g., a laptop) via a wired connection. In other words, the connector 615, 2020 may be configured to operate as a wired service port. In such embodiments, the external device 108 may be able to bidirectionally communicate with the electronic processor 226, 2605 of the host device, 104, 106 to obtain stored information from the host device 104, 106 (e.g., operational statistics), update firmware of the host device 104, 106, and/or the like. The external device 108 may also be used to perform tests on the host device 104, 106. For example, the external device 108 coupled to the host device 104, 106 via a wired connection may be used to log more and/or different operational statistics than are typically stored by the internal memory of the host device 104, 106. Such data logging may be useful during design and development of the host device 104, 106 but may not be included once the design of the host device 104, 106 is complete and the host device 104, 106 is manufactured and sold. Examples of operation statistics included in this data logging process include timestamp and duration of trigger pulls, current draw versus time of trigger pulls, temperature versus time of the tool operation, vibration measurements versus time, and the like.

In some embodiments, the host device 104, 106 may additionally include a universal serial bus (USB) port. In some embodiments, a power tool battery pack connected to the power tool device 104 is configured to charge an external device 108 (e.g., a smartphone) via the USB port when the external device 108 is coupled to the USB port via a USB cable. Additionally, the external device 108 may be able to bidirectionally communicate with the host device 104, 106 to obtain operational statistics of the host device 104, 106, provide firmware updates to the host device 104, 106, and the like via the USB cable and the USB port.

Thus, among other things, a host device is disclosed including a compartment that receives an insertable wireless communication device with an antenna that uses a conductive layer of a PCB within the host device as part or all of a ground plane of the antenna to allow the antenna to meet a minimum antenna efficiency standard while maintaining a small size of the insertable wireless communication device.

We claim:

1. A method of operating a wireless communication device, the method comprising:
 - removably inserting the wireless communication device in a first compartment of a first power tool device of a first type or in a second compartment of a second power tool device of a second type different than the first type of the first power tool device, each of the first power tool device and the second power tool device including a motor configured to drive an output drive device, wherein a first connector of the wireless communication device is electrically and physically coupled to a second connector of the first power tool device or of the second power tool device when the wireless communication device is respectively inserted in the first compartment or the second compartment;
 - wirelessly communicating, with an electronic processor of the wireless communication device, with an external device via an antenna of the wireless communication device;
 - determining, with the electronic processor, that the first connector has been coupled to one of the second connectors;
 - determining, with the electronic processor and in response to determining that the first connector has been coupled to one of the second connectors, whether the wireless communication device is coupled to the first power tool device of the first type or the second power tool device of the second type; and setting, with the electronic processor, an operational characteristic of the wireless communication device based on the determination of whether the wireless communication device is coupled to the first power tool device or the second power tool device, wherein the operational characteristic of the wireless communication device is set differently when the wireless communication device is coupled to the first power tool device than when the wireless communication device is coupled to the second power tool device.

2. The method of claim 1, wherein, when the wireless communication device is coupled to one of the first power tool device and the second power tool device, the electronic processor is communicatively coupled to a power tool device electronic processor of the one of the first power tool device and the second power tool device to allow information to be transferred between (i) the external device and (ii) the one of the first power tool device and the second power tool device.

3. The method of claim 2, wherein determining whether the wireless communication device is coupled to the first power tool device or the second power tool device includes:

receiving, with the electronic processor, identification data from the power tool device electronic processor; and determining, with the electronic processor, whether the wireless communication device is coupled to the first power tool device or the second power tool device based on the identification data.

4. The method of claim 2, wherein determining whether the wireless communication device is coupled to the first power tool device or the second power tool device includes:

receiving, with the electronic processor, identification data from the power tool device electronic processor;

wirelessly transmitting, with the electronic processor, the identification data to the external device; and wirelessly receiving, with the electronic processor, an indication of whether the wireless communication device is coupled to the first power tool device or the second power tool device from the external device, wherein the external device is configured to determine whether the wireless communication device is coupled to the first power tool device or the second power tool device based on the identification data.

5. The method of claim 4, further comprising:

determining, with the external device, whether the wireless communication device is coupled to the first power tool device or the second power tool device based on the identification data by communicating with a server.

6. The method of claim 4, wherein the indication of whether the wireless communication device is coupled to the first power tool device or the second power tool device based on the identification data includes an instruction to set the operational characteristic at a predetermined value.

7. The method of claim 2, further comprising:

controlling, with the power tool device electronic processor, operation of the motor of the one of the first power tool device and the second power tool device.

8. The method of claim 1, wherein the operational characteristic includes a low power capacity threshold of a power source configured to provide power to the wireless communication device, wherein the wireless communication device is configured to enter a low power mode in response to determining that a state of charge of the power source is below the low power capacity threshold.

9. The method of claim 8, wherein, in the low power mode, the wireless communication device decreases a rate at which the wireless communication device wirelessly broadcasts an identification beacon signal.

10. The method of claim 8, wherein the power source is at least one of (i) a battery pack coupled to a battery pack receiving portion of the one of the first power tool device and the second power tool device and (ii) a backup battery located inside a housing of the one of the first power tool device and the second power tool device.

11. The method of claim 1, wherein the operational characteristic includes a type of communication protocol used by the wireless communication device for location tracking purposes.

12. The method of claim 1, wherein the electronic processor, the antenna, and the first connector are located on a printed circuit board (PCB) of the wireless communication device.

13. A method of operating a wireless communication device, the method comprising:

removably inserting the wireless communication device in a compartment of a host device;

communicating, with a first electronic processor of the wireless communication device, with a second electronic processor of the host device;

wirelessly communicating, with the first electronic processor, with an external device via an antenna of the wireless communication device;

receiving, with the first electronic processor, power from an energy storage device included in the host device upon the wireless communication device being inserted into the compartment;

broadcasting, with the first electronic processor and via the antenna, a unique identifier of the wireless communication device;

receiving, with the first electronic processor, a unique identifier of the host device from the second electronic processor of the host device;

receiving, with the first electronic processor, an acknowledgement from the second electronic processor, wherein the acknowledgement indicates whether the host device is associated with a different wireless communication device;

broadcasting, with the first electronic processor and via the antenna and in response to the acknowledgement indicating that the host device is associated with the different wireless communication device, the unique identifier of the wireless communication device, the unique identifier of the host device, and an improper device removal flag; and initiating, with the first electronic processor and in response to the acknowledgement indicating that the host device is not associated with the different wireless communication device, association of the wireless communication device with the host device by communicating with the external device via the antenna.

14. The method of claim 13, further comprising:

communicating, with the first electronic processor, the unique identifier of the wireless communication device to the second electronic processor of the host device;

wherein the acknowledgement from the second electronic processor of the host device is received in response to the first electronic processor communicating the unique identifier of the wireless communication device to the second electronic processor.

15. The method of claim 13, further comprising:

broadcasting, with the first electronic processor, the unique identifier of the wireless communication device until the second electronic processor wakes up from a low power sleep mode; and receiving, with the first electronic processor and in response to the second electronic processor waking up from the low power sleep mode, the unique identifier of the host device and the acknowledgement from the second electronic processor.

16. The method of claim 15, further comprising:

waking up by the second electronic processor in response to an actuator of the host device being actuated by a user.

17. The method of claim 13, wherein receipt of the improper device removal flag by the external device causes the external device to transmit a message to a server to instruct the server to flag the host device as missing.

18. The method of claim 13, wherein receipt of the improper device removal flag by the external device causes the external device to transmit a locking instruction to the wireless communication device, and the method further comprising:

communicating, with the first electronic processor of the wireless communication device, the locking instruction to the host device to prevent the host device from performing one or more operational functions.

19. A method of operating a wireless communication device, the method comprising:

removably inserting the wireless communication device in a compartment of a connected host device;

communicating, with a first electronic processor of the wireless communication device, with a second electronic processor of the connected host device;

wirelessly communicating, with the first electronic processor, with an external device via an antenna of the wireless communication device;

receiving, with the first electronic processor, power from an energy storage device included in the connected host device while inserted into the compartment;

periodically broadcasting, with the first electronic processor and via the antenna, a beacon signal including a unique identifier of a first host device that has been previously associated with the wireless communication device;

receiving, with the first electronic processor, a unique identifier of the connected host device to which the wireless communication device is currently coupled;

determining, with the first electronic processor, whether the unique identifier of the connected host device matches the unique identifier of the first host device;

continuing, with the first electronic processor and in response to the unique identifier of the connected host device matching the unique identifier of the first host device, periodically broadcasting the beacon signal; and reconfiguring, with the first electronic processor and in response to the unique identifier of the connected host device not matching the unique identifier of the first host device, the beacon signal to include a unique identifier of the wireless communication device and an unrecognized host flag.

20. The method of claim 19, wherein receipt of the unrecognized host flag by the external device causes the external device to transmit a message to a server to instruct the server to flag the connected host device as missing.

* * * * *